(12) United States Patent
Song et al.

(10) Patent No.: US 10,593,654 B2
(45) Date of Patent: Mar. 17, 2020

(54) LIGHT EMITTING DEVICE PACKAGE AND LIGHT SOURCE APPARATUS

(71) Applicant: LG INNOTEK CO., LTD., Seoul (KR)

(72) Inventors: June O Song, Seoul (KR); Ki Seok Kim, Seoul (KR); Chang Man Lim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 16/068,305

(22) PCT Filed: Nov. 2, 2017

(86) PCT No.: PCT/KR2017/012355
§ 371 (c)(1),
(2) Date: Jul. 5, 2018

(87) PCT Pub. No.: WO2019/074149
PCT Pub. Date: Apr. 18, 2019

(65) Prior Publication Data
US 2019/0333896 A1    Oct. 31, 2019

(30) Foreign Application Priority Data

Oct. 13, 2017    (KR) ........................ 10-2017-0133598

(51) Int. Cl.
*H01L 25/075* (2006.01)
*H01L 23/00* (2006.01)

(52) U.S. Cl.
CPC .......... *H01L 25/0753* (2013.01); *H01L 24/08* (2013.01); *H01L 24/32* (2013.01);
(Continued)

(58) Field of Classification Search
CPC ..... H01L 25/0753; H01L 24/32; H01L 24/08; H01L 2224/32237; H01L 2224/08235;
(Continued)

(56) References Cited

U.S. PATENT DOCUMENTS 7,989,835 B2 *   8/2011  Kim ........................ H01L 33/60
                                                                   257/98
9,299,895 B1 *   3/2016  Hsing Chen ............ H01L 33/54
                             (Continued)

FOREIGN PATENT DOCUMENTS

EP          3067927 A1      9/2016
JP       2011-258916 A     12/2011
                  (Continued)

*Primary Examiner* — Thanh T Nguyen
(74) *Attorney, Agent, or Firm* — Birch, Stewart, Kolasch & Birch, LLP

(57) ABSTRACT

A light emitting device package is discussed. The light emitting device package includes a first frame having a first through hole; a second frame having a second through hole; a third frame having a third through hole; a fourth frame having a fourth through hole; a body including the first through fourth frames; a connecting frame diagonally extending in the light emitting device package from the second frame to the third frame; a first light emitting device including a first electrode pad and a second electrode pad, the first electrode pad being disposed on the first through hole of the first frame and the second electrode pad being disposed on the second through hole of the second frame; a second light emitting device including a third electrode pad and a fourth electrode pad, the third electrode pad being disposed on the third through hole of the third frame and the fourth electrode pad being disposed on the fourth through hole of the fourth frame; and a plurality of recesses on the body, and interposed between the first frame and the second frame, the plurality of recesses being spaced apart from each other.

20 Claims, 41 Drawing Sheets

(52) U.S. Cl.
CPC ............. *H01L 2224/08235* (2013.01); *H01L 2224/32237* (2013.01)

(58) Field of Classification Search
CPC ....... H01L 25/075; H01L 33/48; H01L 33/62; H01L 33/486; H01L 33/56; H01L 2933/0066; H01L 2933/005; H01L 33/46; H01L 33/42; H01L 33/382; H01L 33/22; H01L 33/52

See application file for complete search history.

(56) References Cited

U.S. PATENT DOCUMENTS

| | | | |
|---|---|---|---|
| 2012/0074451 A1* | 3/2012 | Lin | H01L 33/62 257/99 |
| 2014/0220717 A1* | 8/2014 | Lin | H01L 33/62 438/27 |
| 2015/0267906 A1 | 9/2015 | Wilcox | |
| 2016/0190412 A1 | 6/2016 | Okura | |
| 2016/0268237 A1 | 9/2016 | Lee et al. | |
| 2017/0033271 A1* | 2/2017 | Gruendl | H01L 33/486 |
| 2019/0019929 A1 | 1/2019 | Lim et al. | |

FOREIGN PATENT DOCUMENTS

| | | |
|---|---|---|
| JP | 2016-127096 A | 7/2016 |
| KR | 10-2008-0051877 A | 6/2008 |
| KR | 10-1377603 B1 | 3/2014 |
| KR | 10-2014-0061797 A | 5/2014 |

\* cited by examiner

LIGHT EMITTING DEVICE PACKAGE AND LIGHT SOURCE APPARATUS

CROSS-REFERENCED TO RELATED APPLICATIONS

This application is the National Phase of PCT International Application No. PCT/KR2017/012355 filed on Nov. 2, 2017, which claims priority under 35 U.S.C. 119(a) to Korean Patent Application No. 10-2017-133598 filed on Oct. 13, 2017 in Republic of Korea. All of these applications are hereby expressly incorporated by reference into the present application.

BACKGROUND OF THE INVENTION

Technical Field

Embodiments relate to a light emitting device package, a method of manufacturing the light emitting device package, and a light source apparatus including the light emitting device package.

Background Art

Embodiments relate to a semiconductor device package, a method of manufacturing the semiconductor device package, and a light source apparatus including the semiconductor device package.

A semiconductor device including a compound such as GaN, AlGaN and the like may have many merits such as wide and easily adjustable band gap energy, so that the semiconductor device may be used variously as a light emitting device, a light receiving device, various diodes, and the like.

Specifically, as thin film growth technology and device materials have been developed, a light emitting device, such as a light emitting diode or a laser diode, using a Group III-V or II-VI compound semiconducting material has an advantage capable of realizing light of various wavelength bands such as red, green, blue, and ultraviolet light. In addition, a light emitting device, such as a light emitting diode or a laser diode, using a Group III-V or II-VI compound semiconducting material may realize a white light source with high efficiency by using a fluorescent material or by combining colors. Such a light emitting device has advantages of low power consumption, semi-permanent lifetime, a fast response speed, safety, and environmental friendliness as compared with a conventional light source such as a fluorescent lamp, an incandescent lamps, or the like.

In addition, when a light-receiving device such as a photodetector or a solar cell is fabricated by using a Group III-V or Group-VI-VI compound semiconductor material, since the material of the device material has been developed, light in various wavelength ranges is absorbed to generate optical current, so that light of various wavelength ranges from gamma rays to radio wavelength regions may be used. Further, such a light receiving device may have advantages of a fast response speed, safety, environmental friendliness and easy control of device materials, so that the light receiving device may be easily used for a power control, a microwave circuit or a communication module.

Therefore, the application of the semiconductor device is expanded to a transmitting module of an optical communication transmitting module, a light emitting diode backlight serving as a substitute for a cold cathode fluorescence lamp (CCFL) constituting a backlight of a liquid crystal display (LCD), a white light emitting diode lighting device serving as a substitute for a fluorescent lamp or an incandescent lamp, a vehicle headlight, a signal lamp and a sensor for detecting gas or fire. In addition, the application of the semiconductor device may be expanded to a high-frequency application circuit, other power control devices, and a communication module.

A light emitting device may serve as a p-n junction diode having a characteristic of converting electric energy into light energy by using group III-V or II-VI elements of the periodic table, and may provide various wavelengths by controlling the composition ratio of compound semiconductors.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

The UV-A (315 nm~400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm~280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, in the semiconductor device package, studies on a method for reducing the manufacturing cost and improving the manufacturing yield by improving the process efficiency and changing the structure have been performed.

SUMMARY OF THE INVENTION

An embodiment may provide a semiconductor device package or a light emitting device package having a plurality of semiconductor devices or a plurality of light emitting devices.

An embodiment may provide a semiconductor device package or a light emitting device package, in which a plurality of semiconductor devices or a plurality of light emitting devices are disposed on at least three frames spaced apart from each other.

An embodiment may provide a semiconductor device package or a light emitting device package, in which a plurality of semiconductor devices or a plurality of light emitting devices spaced apart from each other on at least three frames spaced apart from each other are connected to a conductive layer.

An embodiment may provide a semiconductor device package or a light emitting device package, in which each of at least three frames spaced apart from each other has at least one through-hole and overlaps with the semiconductor device or the light emitting device.

An embodiment may provide a semiconductor device package or a light emitting device package, in which each of at least three frames spaced apart from each other includes at least one through-hole and a conductive layer disposed in the through-hole to improve adhesive strength of a bonding part of each device and adhesive strength between the conductive layer and the frame.

An embodiment may provide a semiconductor device package or a light emitting device package, in which a bonding part of the semiconductor device or the light emitting device facing a through-hole of a frame is electrically connected to a conductive layer.

An embodiment may provide a semiconductor device package or a light emitting device package, in which one or a plurality of recesses are formed in a body between at least three frames spaced apart from each other and overlap with the semiconductor device or the light emitting device.

An embodiment may provide a semiconductor device package or a light emitting device package adhered to the semiconductor device or the light emitting device by forming one or a plurality of recesses in a body between at least three frames spaced apart from each other, and disposing a first resin in the recess.

An embodiment may provide a semiconductor device package or a light emitting device package, in which a first resin is disposed between a body within at least three frames spaced apart from each other and the semiconductor device or light emitting device to bond the semiconductor device or the light emitting device to the body.

An embodiment may provide a semiconductor device package or a light emitting device package, in which a plurality of light emitting devices are connected to each other in series or in parallel.

An embodiment may provide a semiconductor device package or a light emitting device package capable of improving light extraction efficiency and electrical characteristics.

An embodiment may provide a semiconductor device package or a light emitting device package capable of reducing a manufacturing cost and improving a manufacturing yield by improving process efficiency and introducing a new package structure.

An embodiment may provide a semiconductor device package or a light emitting device package capable of preventing a re-melting phenomenon from occurring in a bonding region of a semiconductor device package in a process of re-bonding the semiconductor device package to a substrate or the like.

According to embodiments, a light emitting device package may include: first to third frames, each of the first to third frames having at least one through-hole; a body for supporting the first to third frames; a first light emitting device disposed on the first and second frames; and a second light emitting device disposed on the second and third frames, wherein the body may include a first recess disposed between the first and second frames and vertically overlapping with the first light emitting device, and a second recess disposed between the second and third frames and vertically overlapping with the second light emitting device, the first light emitting device may include a first bonding part disposed on the through-hole of the first frame, and a second bonding part disposed on the through-hole of the second frame, and the second light emitting device may include a third bonding part disposed on the through-hole of the second frame, and a fourth bonding part disposed on the through-hole of the third frame.

According to embodiments, the light emitting device package may include a first resin disposed between the body and the first light emitting device, and between the body and the second light emitting device.

According to embodiments, the first resin may be disposed in the first recess and the second recess.

According to embodiments, the first recess and the second recess may have a length in a first direction, and the length of the first recess and the second recess may be smaller than a length of the first light emitting device in the first direction.

According to embodiments, the first recess and the second recess may have a length in a first direction, the length of the first recess may be smaller than a length of the first light emitting device in the first direction, the length of the second recess may be longer than a length of the second light emitting device, and a portion of the second recess may extend while vertically overlapping with a portion of the first light emitting device.

According to embodiments, the first recess may be disposed between the through-hole of the first frame and the through-hole of the second frame, and the second recess may be disposed between the through-hole of the second frame and the through-hole of the third frame.

According to embodiments, the first recess may have an inner portion overlapping with the first light emitting device, and an outer portion protruding outward from a side surface of the first light emitting device, and the second recess may have an inner portion overlapping with the second light emitting device, and an outer portion protruding outward from a side surface of the second light emitting device.

According to embodiments, a plurality of first recesses may be disposed under the first light emitting device, a plurality of second recesses may be disposed under the second light emitting device, outer portions of the first recesses may protrude outward beyond side surfaces of the first light emitting device opposite to each other, and outer portions of the second recesses may protrude outward beyond side surfaces of the second light emitting device opposite to each other.

According to embodiments, a length ratio of the inner portion to the outer portion of the first recess and the second recess may be 4:6 to 6:4.

According to embodiments, the first resin may be disposed in the outer portions of the first and second recesses.

According to embodiments, an interval between the first and second light emitting devices may be larger than a minimum interval between the first and second recesses disposed under the first and second light emitting devices.

According to embodiments, the first and second light emitting devices may be connected to each other in series by the first to third frames.

According to embodiments, each of the first and second light emitting devices may include at least two light emitting cells connected to each other in series, and the light emitting cell may include a light emitting structure having a first conductive semiconductor layer, an active layer, and a second conductive semiconductor layer.

According to embodiments, the first to third frames may be conductive frames, a conductive layer may be disposed in the through-hole, and the conductive layer may make contact with the first and second bonding parts of the first light emitting device, and the third and fourth bonding parts of the second light emitting device.

According to embodiments, the first and second bonding parts of the first light emitting device may be electrically connected to the first and second frames, and the conductive layer disposed in the through-holes of the first and second frames, the third and fourth bonding parts of the second light emitting device may be electrically connected to the second and third frames, and the conductive layer disposed in the through-holes of the second and third frames, and the conductive layer may include an SAC-based material.

According to embodiments, a light emitting device package may include: first to fourth frames spaced apart from each other; a body for supporting the first to fourth frames; and a plurality of light emitting devices disposed on the body, wherein the first and second frames may include first and second through-holes, respectively, the first through-hole and the second through-hole may be spaced apart from each other in a first direction and a second direction perpendicular to the first direction, the third frame may include a third through-hole overlapping with the first through-hole of the first frame in the second direction, and a fourth through-hole overlapping with the first through-hole of the first frame in the first direction, the fourth frame may include a fifth through-hole overlapping with the fourth through-hole of the third frame in the first direction, and a sixth through-hole overlapping with the second through-hole of the second frame in the second direction, a connection region between the third through-hole and the fourth through-hole of the third frame may have a minimum width narrower than a maximum width of upper surfaces of the third and fourth through-holes, a connection region between the fifth through-hole and the sixth through-hole of the fourth frame may have a minimum width narrower than a maximum width of upper surface of the fifth and sixth through-holes, and the light emitting devices may be disposed between the first through-hole and the third through-hole, between the fourth through-hole and the fifth through-hole, and between the sixth through-hole and the second through-hole.

According to embodiments, a light source apparatus may include: a circuit board; and one or a plurality of light emitting device packages disposed on the circuit board.

According to the semiconductor device package and the method of manufacturing a semiconductor device package of an embodiment, the conductive layer may be provided in the through-hole of the frame facing the bonding parts of the semiconductor device or the light emitting device, thereby improving the adhesive strength and the electric conductivity of the bonding part.

According to the semiconductor device package and the method of manufacturing a semiconductor device package of an embodiment, the first resin for bonding the semiconductor device or the light emitting device to the body may be disposed between the semiconductor device or the light emitting device and the body, thereby improving the adhesive strength and the supporting strength of the light emitting device.

According to the semiconductor device package and the method of manufacturing a semiconductor device package of an embodiment, the first resin may be disposed in the recess of the body facing the semiconductor device or the light emitting device, thereby improving the adhesive strength and the supporting strength of the light emitting device.

According to the semiconductor device package and the method of manufacturing a semiconductor device package of an embodiment, a high-voltage package may be provided by disposing one or a plurality of light emitting cells in a plurality of semiconductor devices or light emitting devices.

According to the semiconductor device package and the method of manufacturing a semiconductor device package of an embodiment, a high-voltage package may be provided by connecting a plurality of semiconductor devices or light emitting devices to each other in series.

According to the semiconductor device package and the method of manufacturing a semiconductor device package of an embodiment, it is possible to switch the driving voltage of the package by selectively connecting a plurality of semiconductor devices or a plurality of light emitting devices to the frame or the conductive layer.

According to the semiconductor device package and the method of manufacturing a semiconductor device package of an embodiment, the light extraction efficiency, electrical characteristics and reliability may be improved.

According to the semiconductor device package and the method of manufacturing a semiconductor device package of an embodiment, the manufacturing cost may be reduced and the manufacturing yield may be improved by improving the process efficiency and introducing a new package structure.

According to the semiconductor device package of an embodiment, the reflector may be prevented from being discolored by providing the body having high reflectance, thereby improving the reliability of the semiconductor device package.

According to the semiconductor device package and the method of manufacturing a semiconductor device of an embodiment, it is possible to prevent a re-melting phenomenon from occurring in the bonding region of the semiconductor device package in the process of re-bonding the semiconductor device package to the substrate or the like.

According to an embodiment, the reliability of the semiconductor device package or the light emitting device package may be improved.

BRIEF DESCRIPTION OF THE DRAWINGS

FIG. 28b shows another example of the light emitting device package shown in FIG. 28a.

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package according to an embodiment will be described in detail with reference to accompanying drawings. The semiconductor device of the device package may include a light emitting device emitting light such as ultraviolet, infrared, or visible light. Hereinafter, as an example of a semiconductor device, a case where a light emitting device is applied will be described, and a package or a light source unit to which the light emitting device is applied may include a non-light emitting device such as a zener diode or a sensing device for monitoring a wavelength or heat. Hereinafter, as an example of a semiconductor device, a case where a light emitting device is applied will be described, and a light emitting device package will be described in detail.

<First Embodiment>

Figure 1:
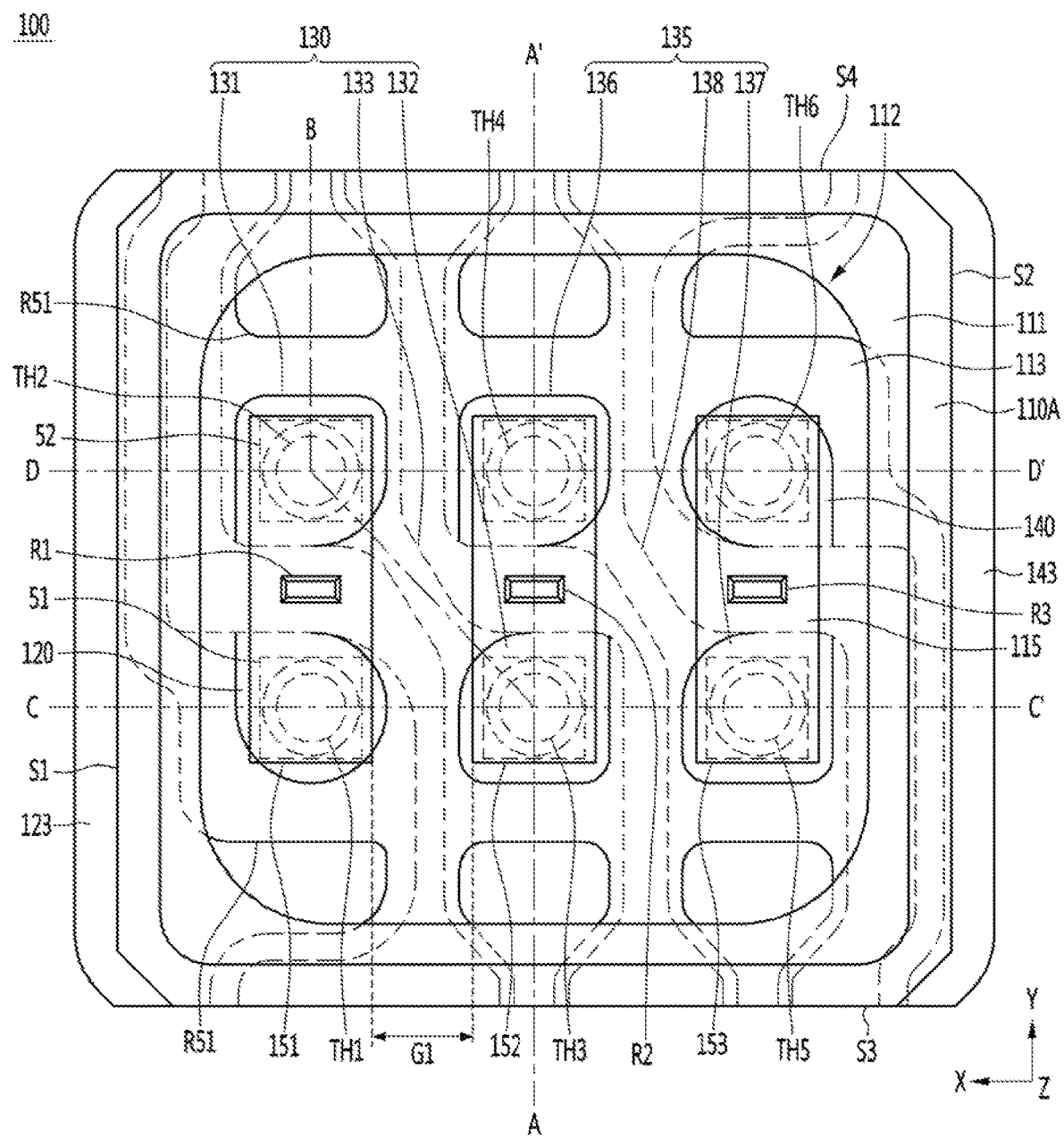
FIG. 1 is a plan view showing a light emitting device package according to a first embodiment of the present invention.
Figure 2:
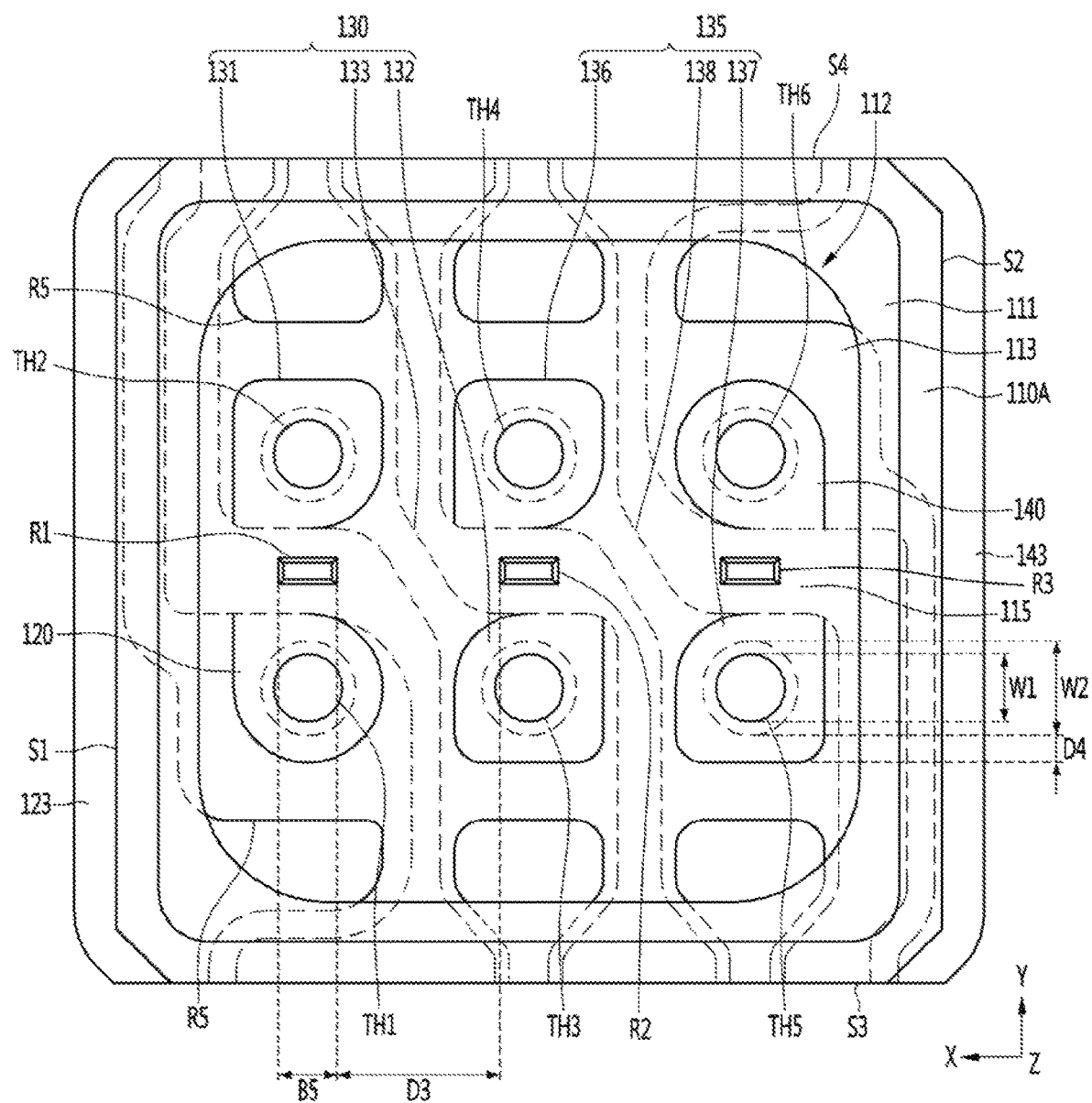
FIG. 2 is a plan view showing a package body of the light emitting device package shown in FIG. 1.
Figure 3:
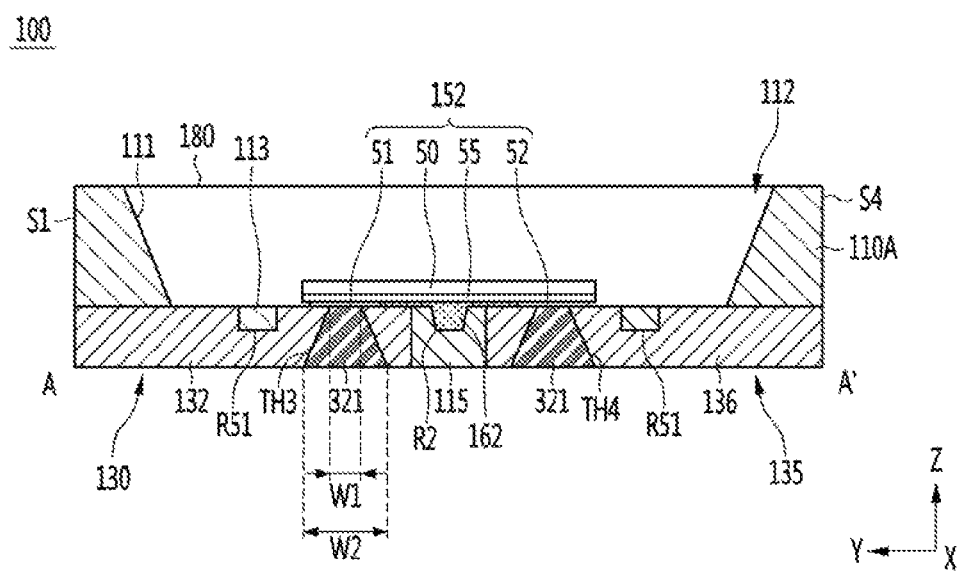
FIG. 3 is a sectional view showing the light emitting device package taken along line A-A' of FIG. 1.
Figure 4:
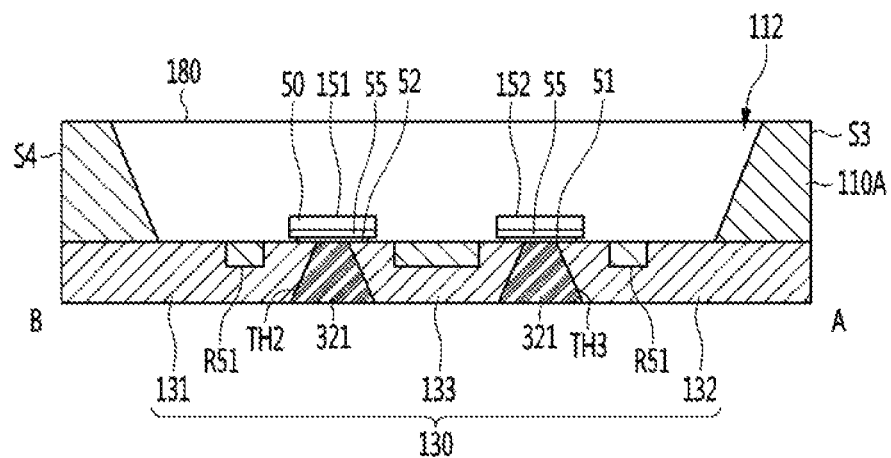
FIG. 4 is a sectional view showing the light emitting device package taken along line A-B of FIG. 1.
Figure 5:
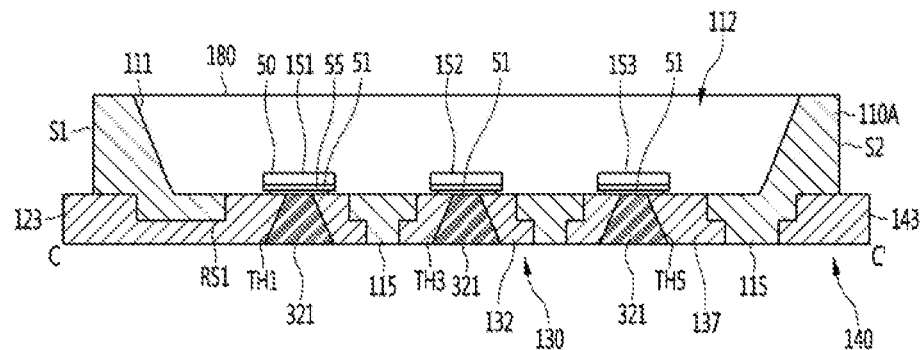
FIG. 5 is a sectional view showing the light emitting device package taken along line C-C of FIG. 1.
Figure 6:
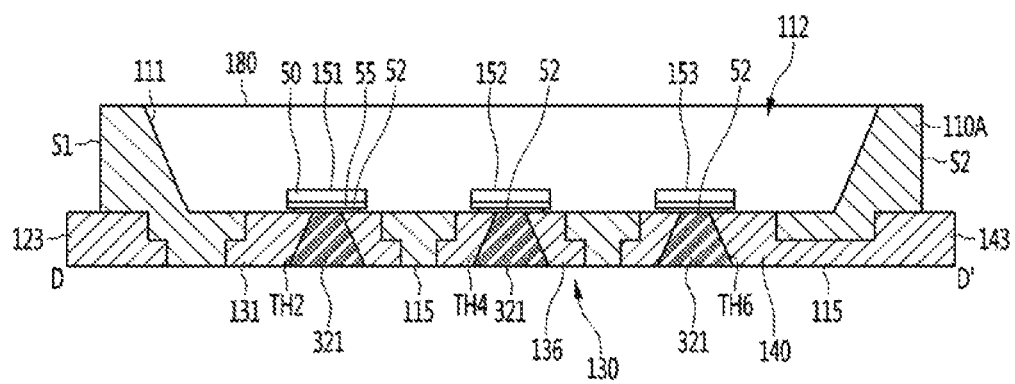
FIG. 6 is a sectional view showing the light emitting device package taken along line D-D of FIG. 1.
Figure 7:
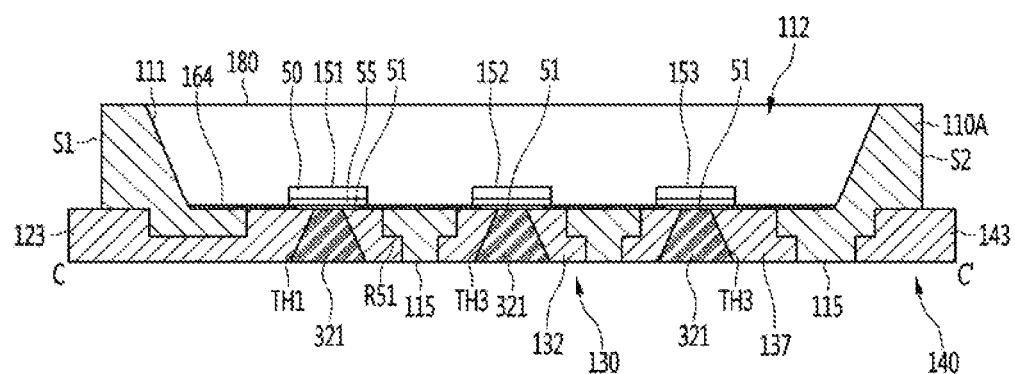
FIG. 7 is another example of the first embodiment, illustrating a modification example of the light emitting device package shown in FIG. 4.
Figure 8:
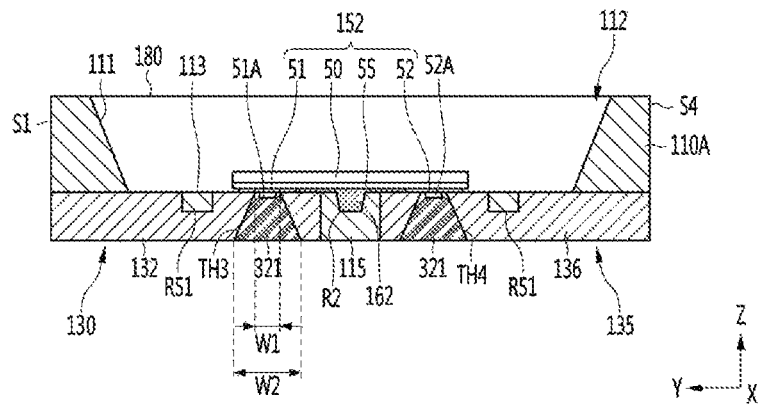
FIG. 8 is another example of the first embodiment, illustrating another example of a light emitting device disposed in the light emitting device package shown in FIG. 3.
Figure 9:
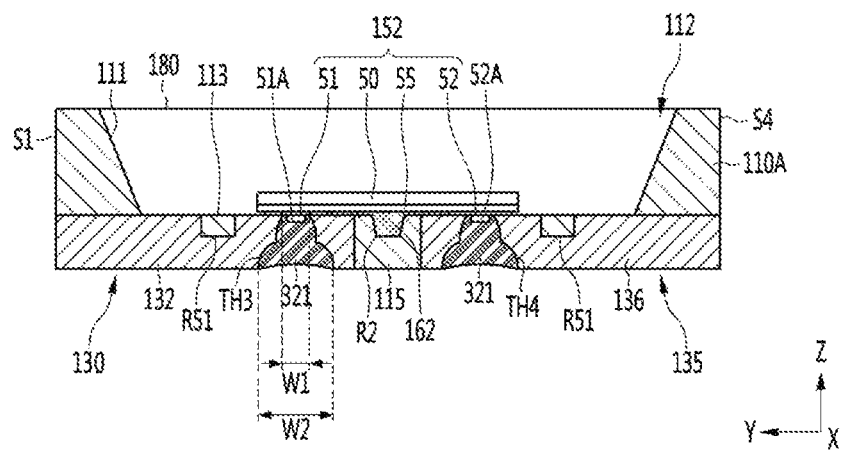
FIG. 9 is another example of the first embodiment, illustrating a modification example of a through-hole of a frame disposed in the light emitting device package shown in FIG. 3.
Figure 10:
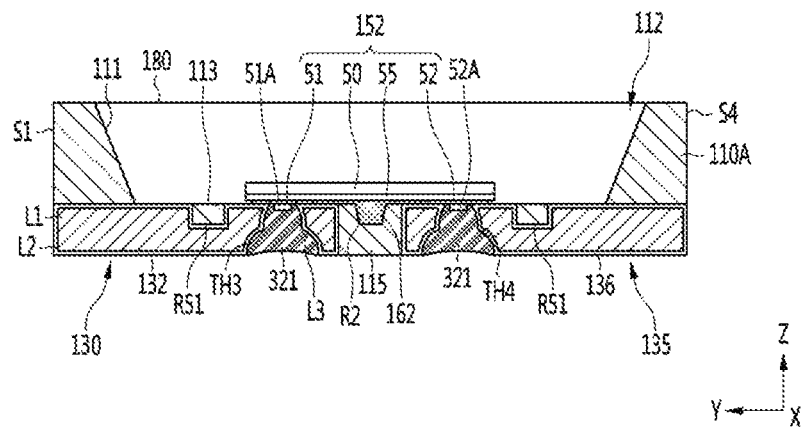
FIG. 10 is another example of the first embodiment, illustrating a modification example of the frame disposed in the light emitting device package shown in FIG. 9.
Figure 11:
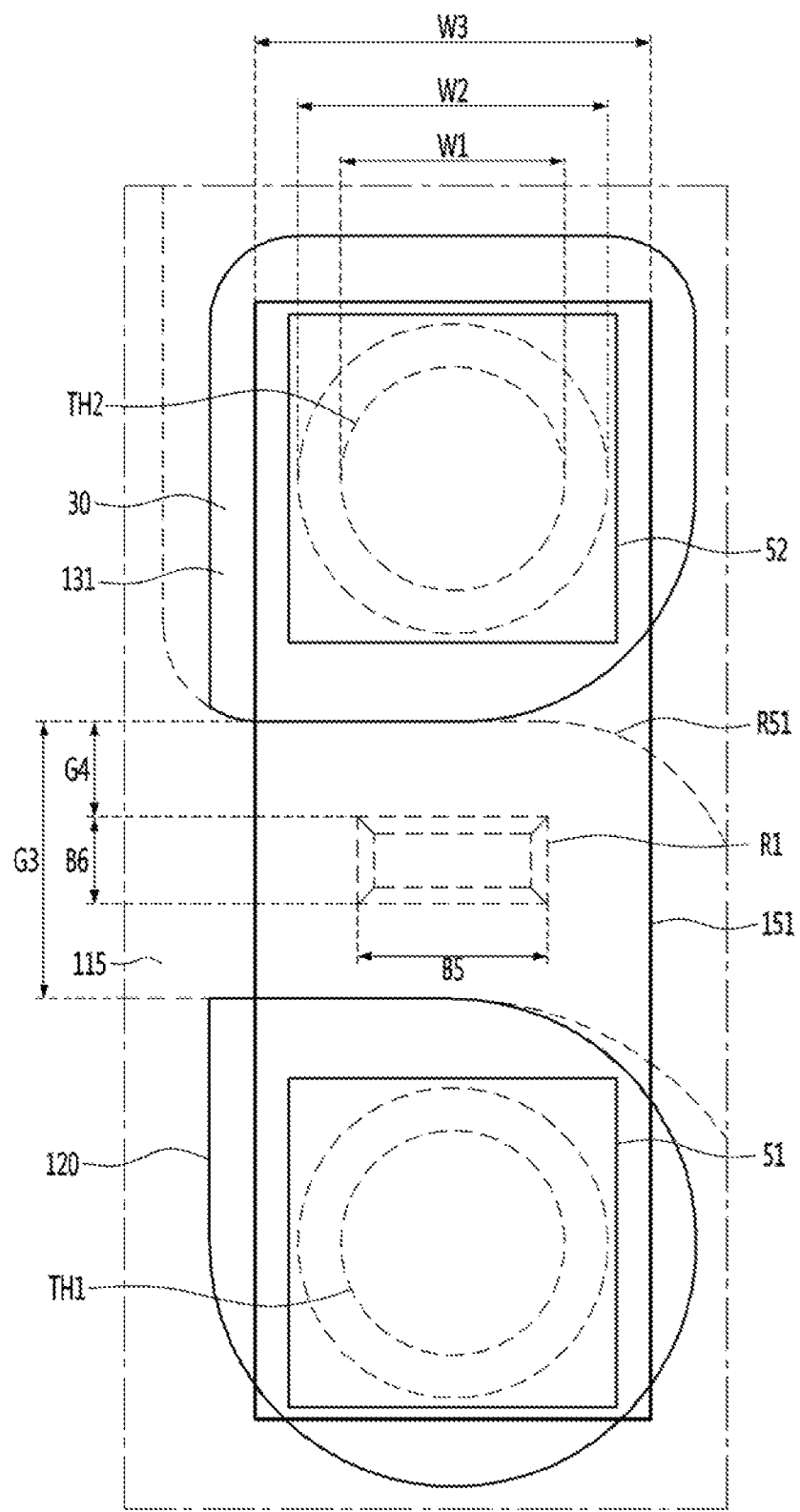
FIG. 11 is a detailed view showing a light emitting device and a recess of a body according to the first embodiment.
Figure 12:
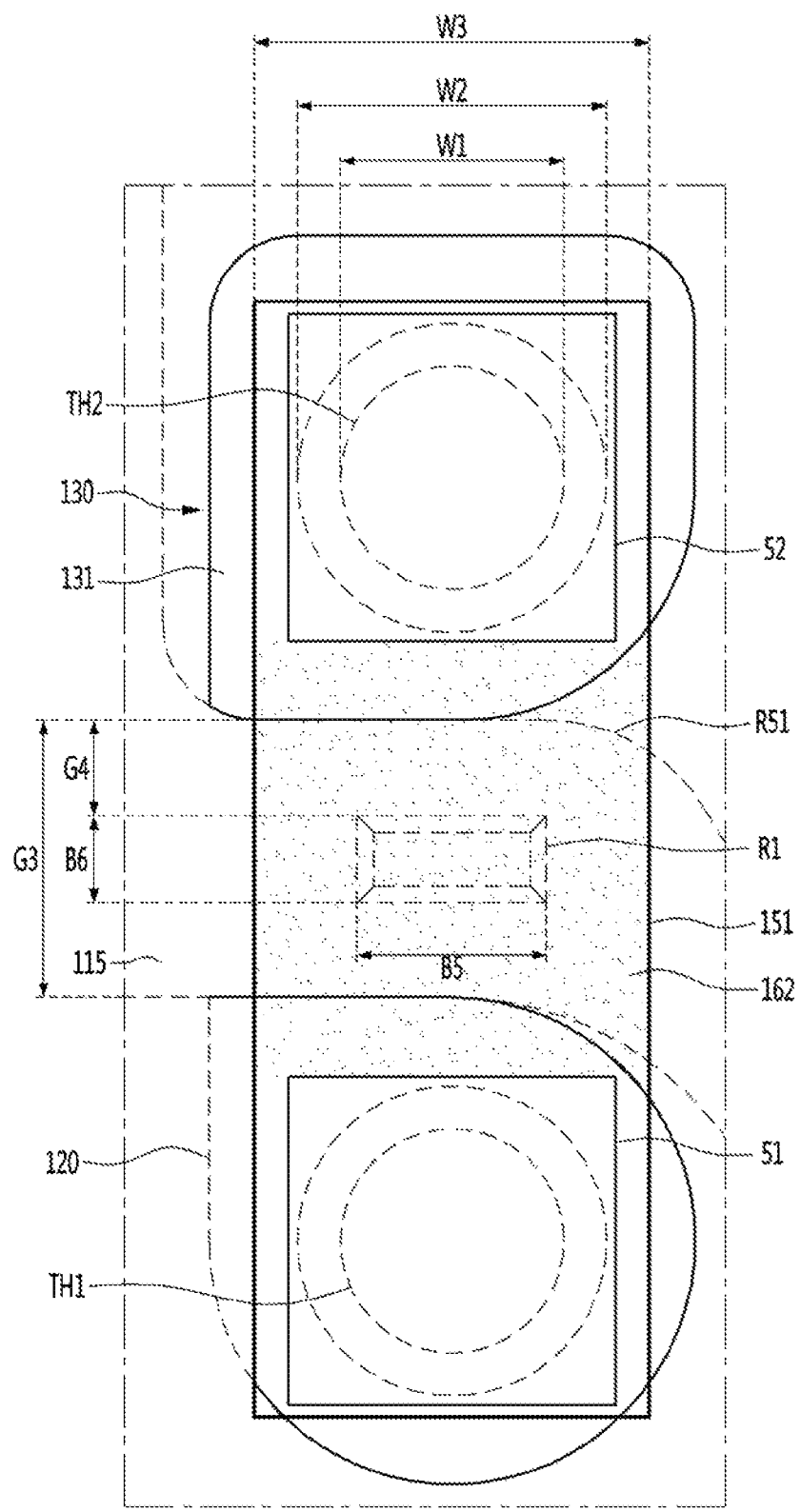
FIG. 12 is a view showing an example in which a first resin is disposed between the body and the light emitting device shown in FIG. 11.

FIG. 1 is a plan view showing a light emitting device package according to a first embodiment of the present invention, FIG. 2 is a plan view showing a package body of the light emitting device package shown in FIG. 1, FIG. 3 is a sectional view showing the light emitting device package taken along line A-A' of FIG. 1, FIG. 4 is a sectional view showing the light emitting device package taken along line A-B of FIG. 1, FIG. 5 is a sectional view showing the light emitting device package taken along line C-C of FIG. 1, FIG. 6 is a sectional view showing the light emitting device package taken along line D-D of FIG. 1, FIG. 7 is another example of the first embodiment, illustrating a modification example of the light emitting device package shown in FIG. 4, FIG. 8 is another example of the first embodiment, illustrating another example of a light emitting device disposed in the light emitting device package shown in FIG. 3, FIG. 9 is another example of the first embodiment, illustrating a modification example of a through-hole of a frame disposed in the light emitting device package shown in FIG. 3, FIG. 10 is another example of the first embodiment, illustrating a modification example of the frame disposed in the light emitting device package shown in FIG. 9, FIG. 11 is a detailed view showing a light emitting device and a recess of a body according to the first embodiment, FIG. 12 is a view showing an example in which a first resin is disposed between the body and the light emitting device shown in FIG. 11, and FIGS. 13 to 15 show modification examples of the recess of the body of the light emitting device package according to the first embodiment.

Referring to FIGS. 1 to 15, according to an embodiment, a semiconductor device package or a light emitting device package 100 includes a plurality of frames 120, 130, 135, and 140 spaced apart from each other, a body 115 for supporting the frames 120, 130, 135, and 140, a plurality of semiconductor devices or a plurality of light emitting devices 151, 152, and 153 disposed on the frames 120, 130, 135, and 140. Hereinafter, the package in which the light emitting devices 151, 151, and 153 are arranged will be described as a light emitting device package. According to an embodiment, the light emitting devices 151, 152, and 153 may be arranged to be driven individually, or may be connected to each other to be driven in series or in parallel. The light emitting device package 100 may change or switch a driving voltage according to the number of connected light emitting devices 151, 152, and 153. In addition, at least one or all of the light emitting devices 151, 152, and 153 may include one or a plurality of light emitting cells. The light emitting cell may include at least one of an n-p junction, a p-n junction, an n-p-n junction, and a p-n-p junction. The light emitting cells may be connected to each other in series in one light emitting device. Accordingly, each of the light emitting devices 151, 152, and 153 may have one or a plurality of light emitting cells, and may be driven with a driving voltage of n times if n light emitting cells are disposed in one light emitting device. For example, if the driving voltage of one light emitting cell is 3V and two light emitting cells are disposed in one light emitting device, each light emitting device may be driven with a driving voltage of 6V. Alternatively, if the driving voltage of one light emitting cell is 3V and three light emitting cells are disposed in one light emitting device, each light emitting device may be driven with a driving voltage of 9V. The number of light emitting cells disposed in one of the light emitting devices may be one, or two to five. Accordingly, if the light emitting devices are connected to each other in series, the driving voltage of the light emitting device package 100 may be obtained by multiplying the total number of light emitting devices, the total number of light emitting cells, and the driving voltage.

A length of the light emitting device package 100 in a first direction (X) may be equal to or different from a length of the light emitting device package 100 in a second direction (Y). The length of the light emitting device package 100 in the first direction may be at least 2.5 mm, for example, in a range of 2.5 mm to 7 mm. The length in the second direction may be equal to or larger than the length in the first direction. A thickness of the light emitting device package 100 may be smaller than the lengths in the first and second directions.

A length of a package body 110A in a first direction may be equal to or different from a length of the package body 110A in a second direction. The first direction may be an X direction, the second direction may be a Y direction orthogonal to the X direction, and a third direction may be a Z direction orthogonal to the X and Y directions, but embodiments are not limited thereto. A length of the package body 110A in the X direction may be equal to or different from a length of the package body 110A in the Y direction. If the length in the X direction is shorter than the length in the Y direction, widths of the light emitting devices 151, 152, and 153 in the X direction may be reduced to improve the brightness. If the length in the Y direction is shorter than the length in the X direction, lengths of the light emitting devices 151, 152, and 153 in the Y direction may be reduced.

The package body 110A may include first and second side parts S1 and S2 opposite to each other, and third and fourth side parts S3 and S4 opposite to each other. The first and second side parts S1 and S2 may have long lengths in the Y direction, and may be connected to both ends of the third and fourth side parts S3 and S4. The first to fourth side parts S1, S2, S3, and S4 may be formed as a surface perpendicular or inclined to the bottom of the body 115.

The package body 110A may be coupled to the body 115. The body 115 may be disposed between the frames 120, 130, 135, and 140. The body 115 may be formed integrally with or separately from the package body 110A. The body 115 may be coupled to the frames 120, 130, 135, and 140 to support the frames 120, 130, 135, and 140. The package body 110A and the body 115 may be formed of the same material or mutually different materials.

The package body 110A may be disposed on the body 115, and may cover peripheries of the light emitting devices 151, 152, and 153. The package body 110A may be formed therein with a cavity 112, and the light emitting devices 151, 152, and 153 may be disposed in the cavity 112. The cavity 112 may be open at a top or at a light emission region. A side surface 111 of the cavity 112 may be formed as a vertical or inclined surface, and may reflect light at the periphery of the light emitting devices 151, 152, and 153. In this case, the body 115 and the frames 120, 130, 135, and 140 may be defined as a lower package body, and the package body 110A may be defined as an upper package body or a reflective part.

A top view shape of the package body 110A may be a polygonal shape, a circular shape, or an elliptical shape, and the polygonal shape may be a rectangular shape or a square shape. A top view shape of the cavity 112 may be a polygonal shape, a circular shape, or an elliptical shape, and the polygonal shape may be a rectangular shape or a square shape.

<Frames 120, 130, 135, and 140>

Referring to FIGS. 1, and 3 to 9, the frames 120, 130, 135, and 140 may include at least three frames, for example, a first frame 120, a second frame 130, a third frame 135, and a fourth frame 140. The first frame 120 and the second frame 130 may be spaced apart from each other. The second frame 130 and the third frame 135 may be spaced apart from each other. The third frame 135 and the fourth frame 140 may be spaced apart from each other. The second frame 130 may be disposed between the first frame 120 and the third frame 135. The third frame 135 may be disposed between the second frame 120 and the fourth frame 140. The first and fourth frames 120 and 140 may be spaced apart from each other in the first direction (X). One, two, or three or more frames may be disposed between the first frame 120 and the fourth frame 140, depending on the number of the light emitting devices.

The first frame 120 may be disposed under the first light emitting device 151. The first frame 120 may overlap with a partial region of the first light emitting device 151 in the Z direction or a vertical direction. The first frame 120 may be disposed at the bottom (denoted as 113 in FIG. 1) of the cavity 112. The first frame 120 may include a first extension part 123. The first extension part 123 may be exposed at an outside of the first side part S1 of the package body 110A, or may protrude further outward than the first side part S1. The first extension part 123 may protrude from the first frame 120. The first extension part 123 may protrude outward from the first frame 120 through the first side part S1. A length of the first extension part 123 in the second direction may be equal to or at least half of the length of the package body 110A in the second direction, thereby preventing a heat radiation area from being reduced. The first frame 120 has the first extension part 123 and is coupled to the body 115, thereby enhancing the bonding strength between the package body 110A and the body 115. The protruding width of the first extension part 123 in the X direction may be at least 100 micrometers.

The second frame 130 may include a first frame part 131, a second frame part 132, and a first connection frame part 133. In the second frame 130, the first frame part 131 may correspond to the first frame 120 in the Y direction, and the second frame part 132 may correspond to the first frame 120 in the X direction. The first connection frame part 133 may connect the first frame part 131 to the second frame part 132. The first frame part 131 and the first frame 120 may be disposed under the first light emitting device 151, and may be electrically connected to the first light emitting device 151. The second frame part 132 may be disposed under the second light emitting device 152, and may be electrically connected to the second light emitting device 152. The second frame 130 may connect the first light emitting device 151 to the second light emitting device 152 in series.

The third frame 135 may include a third frame part 136, a fourth frame part 137, and a second connection frame part 138. In the third frame 135, the third frame part 136 may correspond to the second frame part 132 in the Y direction, and the fourth frame part 137 may correspond to the fourth frame 140 in the Y direction. The second connection frame part 138 may connect the third frame part 136 to the fourth frame part 137. The third frame part 136 and the second frame part 132 of the second frame 130 may be disposed under the second light emitting device 152, and may be electrically connected to the second light emitting device 152. The fourth frame part 137 and the fourth frame 140 may be disposed under the third light emitting device 153, and may be electrically connected to the third light emitting device 153. The third frame 135 may connect the second light emitting device 152 to the third light emitting device 153 in series.

A connection region between the second and third through-holes TH2 and TH3 is the first connection frame part 133, and a width or a minimum width of the first connection frame part 133 may be smaller than a maximum width of upper surfaces of the second and third through-holes TH2 and TH3. A connection region between the fourth and fifth through-holes TH4 and TH5 is the second connection frame part 138, and a width or a minimum width of the second connection frame part 138 may be smaller than a maximum width of upper surfaces of the fourth and fifth through-holes TH4 and TH5. If the minimum width of the first and second connection frame parts 133 and 138 is larger than the maximum width of the upper surfaces of the through-holes TH1, TH2, TH3, TH4, TH5, and TH6, interference with an adjacent recess may occur, and it may be difficult to form the through-holes TH1, TH2, TH3, TH4, TH5, and TH6. As another example, the connection region between the second and third through-holes TH2 and TH3 and the connection region between the fourth and fifth through-holes TH4 and TH5 may be connected by an electrode pattern of the circuit board so as to function as each of the connection frame parts.

The second frame part 132 may be disposed between the first frame 120 and the fourth frame part 137 of the third frame 135 in the X direction. The third frame part 136 may be disposed between the first frame part 131 and the fourth frame 140 in the X direction. The second frame part 132 and the fourth frame part 137 may be spaced apart from each other in the Y direction.

The fourth frame 140 may be disposed under the third light emitting device 153. The fourth frame 140 may overlap with a partial region of the third light emitting device 153 in the Z direction or the vertical direction. The fourth frame 140 may be disposed at the bottom of the cavity 112. The fourth frame 140 may include a second extension part 143. The second extension part 143 may be exposed at the second side part S2 of the package body 110A, or may protrude further outward than the second side part S2. The second extension part 143 may protrude from the fourth frame 140. The second extension part 143 may protrude outward from the fourth frame 140 through the second side part S2. A length of the second extension part 143 in the Y direction may be equal to or at least half of the length of the package body 110A in the Y direction, thereby preventing a heat radiation area from being reduced and enhancing the bonding strength between the package body 110A and the body 115. The protruding width of the second extension part 143 in the X direction may be at least 100 micrometers.

The first to fourth frames 120, 130, 135, and 140 may be provided as conductive frames. The first frame 120 and the first frame part 131 of the second frame 130 may stably provide the structural strength of the body 115, and may be electrically connected to the first light emitting device 151. The second frame part 132 of the second frame 130 and the third frame part 136 of the third frame 130 may stably provide the structural strength of the body 115, and may be electrically connected to the second light emitting device 152. The fourth frame part 137 of the third frame 135 and the fourth frame 140 may stably provide the structural strength of the body 115, and may be electrically connected to the fourth light emitting device 153.

As shown in FIGS. 2 to 7, lower surfaces of the first to fourth frames 120, 130, 135, and 140 may be exposed at the bottom of the body 115. When the first to fourth frames 120, 130, 135, and 140 are conductive frames, the first to fourth frames 120, 130, 135, and 140 may be defined as lead frames, and may reflect light or radiate heat generated from the light emitting devices 151, 152, and 153.

When the first to fourth frames 120, 130, 135, and 140 are formed of a conductive material, the first to fourth frames 120, 130, 135, and 140 may include a metal, for example, at least one of platinum (Pt), titanium (Ti), nickel (Ni), copper (Cu), gold (Au), tantalum (Ta), aluminum (Al), and silver (Ag). The first to fourth frames 120, 130, 135, and 140 may be formed in a single layer or a multi-layer having mutually different metal layers.

As another example, the first to fourth frames 120, 130, 135, and 140 may be provided as insulating frames. When the first to fourth frames 120, 130, 135, and 140 are insulating frames, the structural strength of the package body 110A may be stably provided. When the first to fourth frames 120, 130, 135, and 140 are insulating frames, the body 115 and the frames 120, 130, 135, and 140 may be integrally formed of the same material, or may be formed of mutually different materials. When the first to fourth frames 120, 130, 135, and 140 are formed as insulating frames, a conductive layer 321 that will be described later may be electrically connected to each of the light emitting devices 151, 152, and 153.

When the first to fourth frames 120, 130, 135, and 140 are formed of an insulating material, the insulating material may be a resin material or an insulating material. For example, the first to fourth frames 120, 130, 135, and 140 may be formed of at least one selected from the group consisting of polyphthalamide (PPA), polychloro tri phenyl (PCT), liquid crystal polymer (LCP), polyamide 9T (PA9T), silicone, an epoxy molding compound (EMC), a silicone molding compound (SMC), ceramic, photo sensitive glass (PSG), sapphire (Al2O3), and the like. In addition, the first to fourth frames 120, 130, 135, and 140 may be formed of an epoxy material including a high refractive filler such as TiO2 and SiO2. The first to fourth frames 120, 130, 135, and 140 may be formed of a reflective resin material.

The first connection frame part 133 may be disposed between the first frame 120 and the third frame part 136 of the third frame 135. The second connection frame part 138 may be disposed between the second frame part 132 of the second frame 130 and the fourth frame 140. The first and second connection frame parts 133 and 138 may be exposed at the lower surface of the body 115. As another example, the first and second connection frame parts 133 and 138 may be spaced apart from each other at the lower surface of the body 115. The first and second connection frame parts 133 and 138 may have a thickness smaller than depths of the through-holes TH1, TH2, TH3, TH4, THS, and TH6 in the Z direction or the vertical direction. The first and second connection frame parts 133 and 138 may have a thickness smaller than a thickness of each of the frames 120, 130, 135, and 140 in the Z direction or the vertical direction, that is, the maximum thickness of the frames 120, 130, 135, and 140.

Some of the first to fourth frames 120, 130, 135, and 140 may have one or a plurality of protrusions exposed at the third side S3 and the fourth side S4 and coupled to the body 115.

Each of the first to fourth frames 120, 130, 135, and 140 may have a lower surface area larger than an upper surface area. As another example, each of the first to fourth frames 120, 130, 135, and 140 may have an upper surface area larger than a lower surface area. The first and fourth frames 120 and 140 may have the same shape or mutually different symmetrical shapes. The second and third frames 130 and 135 may have the same shape.

Each of the first to fourth frames 120, 130, 135, and 140 may be provided on the upper portion thereof with an upper recess R51 or a step difference structure, and the body 115 may be coupled to the upper recess R51 or the step difference structure. In each of the first to fourth frames 120, 130, 135, and 140, a thickness of a region where the upper recess R51 is formed may be smaller than thicknesses of other regions. The region where the upper recess R51 is formed may have a thin thickness, thereby enhancing the coupling with the body 115. The upper recess R51 may allow a region where the through-holes TH1, TH2, TH3, TH4, TH5, and TH6 are arranged among regions of the first to fourth frames 120, 130, 135, and 140 at the bottom of the cavity 112 to have an island shape.

The depth of the upper recess R51 may be in a range of 40% to 60% of the thicknesses of the frames 121, 130, 135, and 140, so as to be formed in a range capable of supporting the frames 120, 130, 135, and 140 and preventing the strength of the frames 120, 130, 135, and 140 from being reduced. The upper recess R51 may be arranged in a region where the upper recess R51 does not overlap with a lower recess or the step difference structure in the third direction. The upper recess R51 may overlap or may not overlap with the light emitting devices 151, 152, and 153 in the third direction.

The upper surfaces of the first and fourth frames 120 and 140 may have an island shape due to a resin part filled in the upper recess R51. The upper surfaces of the first and second frame parts 131 and 132 of the second frame 130 and the upper surfaces of the third and fourth frame parts 136 and 137 of the third frame 135 may have an island shape due to a resin part filled in the upper recess R51. If the resin part is formed of a material representing low adhesive strength and low wettability with the conductive layer 321, or a material representing low surface tension between the resin part and the conductive layer 321, the conductive layer 321 filled in the through-holes TH1, TH2, TH3, TH4, TH5, and TH6 may be prevented from diffusing into other regions. The conductive layer 321 may be formed of a material different from the material of the frames 120, 130, 135, and 140.

Each of the first to fourth frames 120, 130, 135, and 140 may have a curved shape, or a curved shape having a predetermined curvature at a boundary portion between the first to fourth frames 120, 130, 135, and 140 and the upper recess R51, thereby enhancing the bonding strength of the body 115.

Each of the first to fourth frames 120, 130, 135, and 140 may be provided without a step difference structure or a recess in a region where the first to fourth frames 120, 130, 135, and 140 vertically overlap with the through-holes TH1, TH2, TH3, TH4, TH5, and TH6. As shown in FIG. 2, an upper region overlapping with regions of the through-holes TH1, TH2, TH3, TH4, TH5, and TH6 in each of the first to fourth frames 120, 130, 135, and 140 may be spaced apart from the upper recess R51 by an interval D4, which is a minimum interval, thereby ensuring the rigidity of a frame portion making contact with the body 115, and preventing the frame from being damaged due to the step difference structure or the recess when the injection molding is performed with the through-holes TH1, TH2, TH3, TH4, TH5, and TH6. The interval D4 may be 80 micrometers or more, for example, in a range of 80 to 150 micrometers, thereby preventing the frames 120, 130, 135, and 140 from being affected by the formation of the through-holes TH1, TH3, TH3, TH4, TH5, and TH6. Therefore, a region having the thickness of the frames 120, 130, 135, and 140 may be ensured around the through-holes TH1, TH2, TH3, TH4, TH5, and TH6 by a predetermined distance, thereby ensuring the rigidity of a frame portion coupled with the body 115, and reducing the impact transmitted to the frames TH1, TH2, TH3, TH4, TH5, and TH6 when the through-holes TH1, TH2, TH3, TH4, TH5, and TH6 are formed or injection-molded.

At least one or at least two of the first to fourth frames 120, 130, 135, and 140 may include at least one through-hole. At least one of the first to fourth frames 120, 130, 135, and 140 may include one or a plurality of through-holes. The first frame 120 may include a first through-hole TH1, the second frame 130 may include second and third through-holes TH2 and TH3, the third frame 135 may include fourth and fifth through-holes TH4 and TH5, and the fourth frame 140 may include a sixth through-hole TH6. The second through-hole TH2 may be arranged in the first frame part 131 of the second frame 130, and the third through-hole TH3 may be arranged in the second frame part 132 of the second frame 130. The fourth through-hole TH4 may be arranged in the third frame part 136 of the third frame 135, and the fifth through-hole TH5 may be arranged in the fourth frame part 137 of the third frame 135. The first to sixth through-holes TH1, TH2, TH3, TH4, TH5, and TH6 may be formed from the upper surface to the lower surface of each of the frames 120, 130, 135, and 140.

Referring to FIGS. 1 and 11, the first to sixth through-holes TH1, TH2, TH3, TH4, TH5, and TH6 may not overlap with the body 115 in the vertical direction, that is, in the Z direction. The first to sixth through-holes TH1, TH2, TH3, TH4, TH5, and TH6 may overlap with a cavity region in the vertical direction, that is, the Z direction. The first and second through-holes TH1 and TH2 may overlap with the first light emitting device 151 in the vertical direction, for example, in the Z direction. An interval between the first and second through-holes TH1 and TH2 may be smaller than a length of the first light emitting device 151 in the Y direction. An upper width (or diameter) W1 of each of the first and second through-holes TH1 and TH2 may be smaller than a width W3 of the first light emitting device 151 in the X direction. The third and fourth through-holes TH3 and TH4 may overlap with the second light emitting device 152 in the vertical direction, for example, in the Z direction. An interval between the third and fourth through-holes TH3 and TH4 may be smaller than a length of the second light emitting device 152 in the Y direction. The upper width (or diameter) W1 of each of the third and fourth through-holes TH3 and TH4 may be smaller than the width W3 of the second light emitting device 152 in the X direction.

The fifth and sixth through-holes TH5 and TH6 may overlap with the third light emitting device 153 in the vertical direction, for example, the Z direction. An interval between the fifth and sixth through-holes TH5 and TH6 may be smaller than a length of the third light emitting device 153 in the Y direction. The upper width (or diameter) W1 of each of the fifth and sixth through-holes TH5 and TH6 may be smaller than the width W3 of the third light emitting device 153 in the X direction.

The interval between the first and second through-holes TH1 and TH2, the interval between the third and fourth through-holes TH3 and TH4, and the interval between the fifth and sixth through-holes TH5 and TH6 may be equal to each other. The interval between the first and second through-holes TH1 and TH2, the interval between the third and fourth through-holes TH3 and TH4, and the interval between the fifth and sixth through-holes TH5 and TH6 are intervals between the through-holes in the Y direction, and may be larger than intervals between the through-holes in the X direction. The intervals between the through-holes in the X direction and the Y direction may be changed according to sizes of the light emitting devices 151, 152, and 153 or an interval G1 between the light emitting devices 151, 152, and 153.

<Through-hole of Frame>

As shown in FIGS. 2 to 8, according to an embodiment, the light emitting device package 100 may include a plurality of through-holes TH1, TH2, TH3, TH4, TH5, and TH6 under the light emitting devices 151, 152, and 153. The first frame 120 may include the first through-hole TH1. The second frame 130 may include the second and third through-holes TH2 and TH3 spaced apart from each other. The third frame 135 may include the fourth and fifth through-holes TH4 and TH5 spaced apart from each other. The fourth frame 140 may include the sixth through-hole TH6.

The first to sixth through-holes TH1, TH2, TH3, TH4, TH5, and TH6 may be provided in at least one of the frames 120, 130, 135, and 140 as one through-hole or plural through-holes. The through-holes TH1, TH2, TH3, TH4, TH5, and TH6 may be formed through the frames 120, 130, 135, and 140. The first to sixth through-holes TH1, TH2, TH3, TH4, TH5, and TH6 may be formed through the upper and lower surfaces of the frames 120, 130, 135, and 140 in the vertical direction or the third direction. The through-holes TH1, TH2, TH3, TH4, TH5, and TH6 may be defined as openings or holes in the frame. The through-holes TH1, TH2, TH3, TH4, TH5, and TH6 may be defined as openings or holes in the frame, which are surrounded by the frame.

The first through-hole TH1 and the sixth through-hole TH6 may be spaced apart from each other in the first direction and the second direction orthogonal to the first direction. The second through-hole TH2 may overlap with the first through-hole TH1 in the second direction, the third through-hole TH3 may overlap with the first through-hole TH1 in the first direction, and the fourth through-hole TH4 may overlap with the third through-hole TH3 in the second direction. The second and fourth through-holes TH2 and TH4 may overlap with the sixth through-hole TH6 in the first direction. The fifth through-hole TH5 may overlap the sixth through-hole TH6 in the second direction. The fifth through-hole TH5 may overlap with the first and third through-holes TH1 and TH3 in the first direction.

The first, third, and fifth through-holes TH1, TH3, and TH5 may overlap with each other in the first direction. The second, fourth, and sixth through-holes TH2, TH4, and TH6 may be spaced apart from the first, third, and fifth through-holes TH1, TH3, and TH5 in the second direction, and may overlap with each other in the first direction.

The through-holes TH1, TH2, TH3, TH4, TH5, and TH6 may be spaced apart from a bottom edge of the cavity 112.

A connection region between the second and third through-holes TH2 and TH3 is the first connection frame part 133, and a width or a minimum width of the first connection frame part 133 may be smaller than a maximum width of upper surfaces of the second and third through-holes TH2 and TH3. A connection region between the fourth and fifth through-holes TH4 and TH5 is the second connection frame part 138, and a width or a minimum width of the second connection frame part 138 may be smaller than a maximum width of upper surfaces of the fourth and fifth through-holes TH4 and TH5. If the minimum width of the first and second connection frame parts 133 and 138 is larger than the maximum width of the upper surfaces of the through-holes TH1, TH2, TH3, TH4, TH5, and TH6, interference with an adjacent recess may occur, and it may be difficult to determine the sizes of the through-holes TH1, TH2, TH3, TH4, TH5, and TH6. As another example, the connection region between the second and third through-holes TH2 and TH3 and the connection region between the fourth and fifth through-holes TH4 and TH5 may be connected by an electrode pattern of the circuit board so as to function as each of the connection frame parts.

The number of the through-holes TH1, TH2, TH3, TH4, TH5, and TH6 in the light emitting device package 100 may be two times based on the number of the light emitting devices 151, 152, and 153.

The first light emitting device 151 may be formed at a lower portion thereof with the first through-hole TH1 facing a lower surface of a first bonding part 51, and the second through-hole TH2 facing a lower surface of a second bonding part 52. The second light emitting device 152 may be formed at a lower portion thereof with the third through-hole TH3 facing the lower surface of the first bonding part 51, and the fourth through-hole TH4 facing the lower surface of the second bonding part 52 of the second light emitting device 152. The third light emitting device 153 may be formed at a lower portion thereof with the fifth through-hole TH5 facing the lower surface of the first bonding part 51, and the sixth through-hole TH6 facing the lower surface of the second bonding part 52 of the third light emitting device 153.

The first through-hole TH1 and the second through-hole TH2 may be arranged in a region overlapping with the first light emitting device 151 while being spaced apart from the body 115. The third through-hole TH3 and the fourth through-hole TH4 may be spaced apart from each other under the lower surface of the second light emitting device 152. The third through-hole TH3 and the fourth through-hole TH4 may be arranged in a region overlapping with the second light emitting device 152 while being spaced apart from the body 115. The fifth through-hole TH5 and the sixth through-hole TH6 may be spaced apart from each other under the lower surface of the third light emitting device 153. The fifth through-hole TH5 and the sixth through-hole TH6 may be arranged in a region overlapping with the third light emitting device 153 while being spaced apart from the body 115.

The depth of each of the through-holes TH1, TH2, TH3, TH4, TH5, and TH6 may be the same as the thickness of each of the frames 120, 130, 135, and 140, thereby maintaining the stable strength of each of the frames 120, 130, 135, and 140. For example, the depth of each of the through-holes TH1, TH2, TH3, TH4, TH5, and TH6 may be at least 180 micrometers, for example, in a range of 180 to 220 micrometers.

According to an embodiment, the width of an upper region of each of the through-holes TH1, TH2, TH3, TH4, TH5, and TH6 in the first and second directions X and Y may be equal to or smaller than the width of a lower region of each of the through-holes TH1, TH2, TH3, TH4, TH5, and TH6. The widths of the upper regions of the through-holes TH1, TH2, TH3, TH4, TH5, and TH6 may be equal to each other in the first and second directions, or the width in the first direction may be larger than the width in the second direction. The width of the upper region of each of the through-holes TH1, TH2, TH3, TH4, TH5, and TH6 in the first and second directions may be equal to or smaller than the length of a lower surface of each of the bonding parts 51 and 52 facing the through-holes TH1, TH2, TH3, TH4, TH5, and TH6. An upper area of each of the through-holes TH1, TH2, TH3, TH4, TH5, and TH6 may be smaller than a lower area of each of the bonding parts 51 and 52. Each of the through-holes TH1, TH2, TH3, TH4, TH5, and TH6 may be covered by the bonding parts 51 and 52 of the light emitting devices 151, 152 and 153. An upper portion of each of the through-holes TH1, TH2, TH3, TH4, TH5, and TH6 may have a circular shape or a polygonal shape. A shape of each of the through-holes TH1, TH2, TH3, TH4, TH5, and TH6 may be the same as or different from a lower surface shape of each of the bonding parts 51 and 52. The lower surfaces of the bonding parts 51 and 52 may have a circular shape or a polygonal shape, but embodiments are not limited thereto.

The upper surface area of each of the through-holes TH1, TH2, TH3, TH4, TH5, and TH6 may be set to be 50% or more, for example, 50% to 98% of the lower surface area of each of the bonding parts 51 and 52. In addition, each of the through-holes TH1, TH2, TH3, TH4, TH5, and TH6 and each of the bonding parts 51 and 52 may have a partially facing region, and a non-overlapping region where they do not face each other.

The distance from the upper region of each of the through-holes TH1, TH2, TH3, TH4, TH5, and TH6 to a side end of each of the bonding parts 51 and 52 in the X direction may be 40 micrometers or more, for example, in a range of 40 to 60 micrometers. When the distance is 40 micrometers or more, it is possible to ensure a process margin for preventing the bonding parts 51 and 52 from being exposed at the lower surface of each of the through-holes TH1, TH2, TH3, TH4, TH5, and TH6. In addition, when the distance is 60 micrometers or less, it is possible to ensure an area of each of the bonding parts 51 and 52 exposed through each of the through-holes TH1, TH2, TH3, TH4, TH5, and TH6, and reduce the resistance of each of the bonding parts 51 and 52 exposed through the through-holes TH1, TH2, TH3, TH4, TH5, and TH6, thereby allowing a current to be smoothly injected to the bonding parts 51 and 52 exposed through the through-holes TH1, TH2, TH3, TH4, TH5, and TH6.

As shown in FIGS. 2 and 11, each of the through-holes TH1, TH2, TH3, TH4, TH5, and TH6 may have a lower width W2 larger than an upper width W1. The through-holes TH1, TH2, TH3, TH4, TH5, and TH6 may have a shape in which the width or diameter gradually decreases in the upper direction. A side surface of each of the through-holes TH1, TH2, TH3, TH4, TH5, and TH6 may be formed as an inclined or vertical surface, or may be formed as a curved surface having a predetermined curvature. Referring to modification examples of the through-holes, as shown in FIG. 9, the side surfaces of the through-holes TH3 and TH4 may be curved, so that the width or diameter of the through-holes TH3 and TH4 may gradually decrease in the upper direction. Alternatively, the side surfaces of the through-holes TH3 and TH4 may be formed as curved surfaces having mutually different curvatures, in which a curvature radius of a lower side surface may be larger than a curvature radius of an upper side surface. The curved surface may be convex outward from the center of the through-holes TH3 and TH4.

<Conductive Layer 321>

According to an embodiment, as shown in FIGS. 3 to 8, the light emitting device package 100 may include a conductive layer 321. The conductive layer 321 may be provided on at least one or all of the through-holes TH1, TH2, TH3, TH4, TH5, and TH6. The conductive layer 321 may be disposed under the bonding parts 51 and 52 of the light emitting devices 151, 152, and 153. The upper width of the conductive layer 321 in the first direction (X) and the second direction (Y) may be smaller than the width of the bonding parts 51 and 52.

The conductive layer 321 may make direct contact with the lower surface of each of the bonding parts 51 and 52. The conductive layer 321 may be electrically connected to each of the bonding parts 51 and 52. A periphery of the conductive layer 321 may be disposed in each of the frames 120, 130, 135, and 140, and may be connected to each of the frames 120, 130, 135, and 140.

The conductive layer 321 may include one material selected from the group consisting of Ag, Au, Pt, Sn, Cu, Zn, In, Bi, Ti, and the like, or an alloy thereof. The conductive layer 321 may be formed of a material capable of ensuring a function of electric conductivity. The conductive layer 321 may include a solder paste or an Ag paste, and may be formed, for example, by mixing a powder particle or a particle with a flux. For example, the solder paste may include Sn—Ag—Cu. For example, the conductive layer 321 may be composed of a multi-layer formed of mutually different materials, or a multi-layer or a single layer formed of an alloy.

In the light emitting device package 100 according to an embodiment, a power source may be connected to the first and second bonding parts 51 and 52 of the first light emitting device 151 through the conductive layers 321 of the first through-hole TH1 and the second through-hole TH2. A power may be supplied to the first and second bonding parts 51 and 52 of the second light emitting device 152 through the conductive layers 321 of the third through-hole TH3 and the fourth through-hole TH4. The power may be supplied to the first and second bonding parts 51 and 52 of the third light emitting device 153 through the conductive layers 321 of the fifth through-hole TH5 and the sixth through-hole TH6. The bonding parts 51 and 52 of the light emitting devices 151, 152, and 153 may be electrically connected to the conductive layers 321 disposed in the through-holes TH1, TH2, TH4, TH5, and TH6. The conductive layers 321 disposed in the through-holes TH1, TH2, TH3, TH4, TH5, and TH6 may connect the light emitting devices 151, 152, and 153 to each other in series.

If the first to fourth frames 120, 130, 135, and 140 are formed of a conductive material, the first to fourth frames 120, 130, 135, and 140 may be electrically connected to the bonding parts 51 and 52 of the light emitting devices 151, 152, and 153. The first to fourth frames 120, 130, 135, and 140 may connect the light emitting devices 151, 152, and 153 to each other in series.

The bonding parts 51 and 52 of the light emitting devices 151, 152, and 153 may be electrically connected to at least one or both of the conductive layers 321 and 322 and the frames 120, 130, 135, and 140. The conductive layers 321 and 322 and the frames 120, 130, 135, and 140 may connect the light emitting devices 151, 152, and 153 to each other in series. Accordingly, the light emitting devices 151, 152, and 153 may be driven by the driving power supplied through each of the bonding parts 51 and 52. In addition, the light emitted from the light emitting devices 151, 152, and 153 may be radiated upward of the package body 110A. The driving voltage supplied to the light emitting device package may be increased in proportion to the number of light emitting cells in the light emitting devices 151, 152, and 153. For example, if one light emitting cell is provided in each of the light emitting devices 151, 152, and 153, the driving voltage may be determined as a multiplication of the number of light emitting devices and the driving voltage of individual light emitting cells. If two light emitting cells are provided in each of the light emitting devices, the driving voltage may be determined as two times based on the multiplication of the number of light emitting devices and the driving voltage of individual light emitting cells. If n light emitting cells (wherein n is two or more) are provided in each of the light emitting devices, the driving voltage may be determined as n times based on the multiplication of the number of light emitting devices and the driving voltage of individual light emitting cells. Accordingly, when the number of light emitting devices is m, the number of light emitting cells in the light emitting device is n, and the driving voltage of each light emitting cell is Vf, the driving voltage supplied to the light emitting device package may be calculated by m×n×Vf. If the light emitting device package has three light emitting devices and the driving voltage of each light emitting cell is 3V, the driving voltage may be supplied at a high voltage such as 9V, 18V, 27V, or 36V. Such a high voltage light emitting device package may be capable of controlling the dimming, thereby adjusting the brightness of the emitted light.

As shown in FIG. 10, according to an embodiment, the frames 120, 130, 135, and 140 may include first and second metal layers L1 and L2. The first metal layer L1 may be a base layer, may include Cu, Ni and Ti, and may be formed in a single layer or a multi-layer. The second metal layer L2 may include at least one of an Au layer, an Ni layer and an Ag layer. When the second metal layer L2 includes the Ni layer, since the Ni layer has a small change in thermal expansion, even if the size or arrangement position of the package body is changed due to the thermal expansion, the position of the light emitting device disposed on an upper portion of the package body may be stably fixed by the Ni layer. When the second metal layer L2 includes the Ag layer, the Ag layer may efficiently reflect the light emitted from the light emitting device disposed on the upper portion of the package body and improve the brightness. When the second metal layer L2 includes the Au layer, the bonding strength between the light emitting devices 151, 152, and 153 and the bonding parts 51 and 52 may be improved, and the reflection efficiency of the light emitting devices 151, 152, and 153 may be improved.

The conductive layer 321 may include one material selected from the group consisting of Ag, Au, Pt, Sn, Cu, Zn, In, Bi, Ti, and the like, or an alloy thereof. The conductive layer 321 may be filled in the through-holes TH1, TH2, TH3, TH4, TH5, and TH6 by 100% or less, for example, in a range of 30% to 100%. If the amount of the conductive layer 321 filled in the through-holes exceeds the above-mentioned range, the bonding strength between the conductive layer 321 and the circuit board may be reduced, and if the amount of the conductive layer 321 filled in the through-holes is smaller than the above-mentioned range, the conductive characteristics may be deteriorated.

An alloy layer L3 may be formed between the conductive layer 321 and the frame 120, 130, 135 or 140. The alloy layer L3 may be formed by combining the material constituting the conductive layer 321 and the second material L2 of the frame 120, 130, 135 or 140. The alloy layer L3 may be formed on the surfaces of the through-hole TH1,TH2, TH3,TH4,TH5,TH6 of the frame 120, 130, 135 or 140. The alloy layer L3 may include at least one intermetallic compound layer selected from the group consisting of AgSn, CuSn, AuSn and the like. The intermetallic compound layer may be formed by combining first and second materials, where the first material may be provided from the conductive layer 321 and the second material may be provided from the second metal layer L2 or a base layer of the frame 120, 130, 135 or 140. When the conductive layer 321 includes Sn and the second metal layer L2 includes Ag, the intermetallic compound layer of AgSn may be formed through the combining of Sn and Ag in the process of providing the conductive layer 321 or in the heat treatment process after the conductive layer 321 is provided.

Alternatively, when the conductive layer 321 includes Sn and the second metal layer L2 includes Au, the intermetallic compound layer of AuSn may be formed through the combining of Sn and Au in the process of providing the conductive layer 321 or in the heat treatment process after the conductive layer 321 is provided.

Alternatively, when the conductive layer 321 and 322 includes Sn and the first metal layer L1 of the frame 120, 132, 134 or 140 includes Cu, the intermetallic compound layer of CuSn may be formed through the combining of Cu and Ag in the process of providing the conductive layer 321 or in the heat treatment process after the conductive layer 321 is provided.

Alternatively, when the conductive layer 321 includes Ag and the second metal layer L2 or a layer of the frame 120, 132, 134 or 140 includes Sn, the intermetallic compound layer of AgSn may be formed through the combining of Ag and Sn in the process of providing the conductive layer 321 or in the heat treatment process after the conductive layer 321 is provided.

The intermetallic compound layer described above may have a higher melting point than other bonding materials. In addition, the heat treatment process in which the metal compound layer is formed may be performed at a lower temperature than the melting point of a general bonding material. Therefore, even when the light emitting device package 100 according to an embodiment is bonded to a main substrate through a reflow process, since re-melting phenomenon does not occur, the electrical connection and physical bonding force are not deteriorated.

In addition, according to the light emitting device package 100 and the light emitting device package manufacturing method of an embodiment, the package body 110A does not need to be exposed to a high temperature in the process of manufacturing a light emitting device package. Therefore, according to the embodiment, the package body 110A may be prevented from being exposed to high temperatures to be damaged or discolored. Accordingly, the selection range for the material constituting the body 115 may be widened. According to an embodiment, the body 115 may be provided by using a relatively inexpensive resin material as well as an expensive material such as ceramic.

Meanwhile, In the lower surface region of the frames 120, 130, 135, and 140, the interval between the first and second through-holes TH1 and TH2 spaced apart from each other in the Y direction, the interval between the third and fourth through-holes TH3 and TH4 spaced apart from each other in the Y direction, or the interval between the third and fourth through-holes TH3 and TH4 spaced apart from each other in the Y direction may be 100 micrometers or more, for example, 100 micrometers to 150 micrometers. The intervals between the through-holes TH1, TH2, TH3, TH4, TH5, and TH6 may be minimum distances required to prevent electrodes from being electrically shorted when the light emitting device package 100 is mounted on a circuit board, a sub-mount or the like.

A minimum distance between the center of each of the through-holes TH1, TH2, TH3, TH4, TH5, and TH6 and an outer portion of the frames 120, 130, 135, and 140 or the body may be 100 micrometers or more, for example, in a range of 100 to 200 micrometers. Accordingly, the through-holes TH1, TH2, TH3, TH4, TH5, and TH6 have a depth the same as the thickness of the frame while being spaced apart from the body by the distance, thereby maintaining the shape of the through-holes TH1, TH2, TH3, TH4, TH5, and TH6, and preventing breakage due to the formation of the body. The distance may be equal to or less than the upper width of the through-holes TH1, TH2, TH3, TH4, TH5, and TH6.

In FIGS. 1 and 2, the through-holes TH1, TH2, TH3, TH4, TH5, and TH6 spaced apart from each other in the X direction may be arranged under mutually different light emitting devices 151, 152 and 153, and may be spaced apart from each other by an interval larger than the interval G1 between the light emitting devices 151, 152, and 153.

<Body 115>

As shown in FIGS. 1 to 6, the body 115 may be connected to the package body 110A. The body 115 and the package body 110A may be integrally formed of the same material, or may be formed of mutually different materials. When the body 115 is formed of a material different from the material of the package body 110A, the package body 110A may be bonded or attached to the body 115. The package body 110A may provide a cavity 112 having an opened top. The first to fourth frames 120, 130, 135, and 140 may be disposed on the bottom 113 of the cavity 112. The side surface 111 of the cavity 112 may be a surface perpendicular or inclined to the bottom 113 of the body 115.

The body 115 may be disposed between the first frame 120 and the fourth frame 140. The body 115 may function as an electrode separation line. The body 115 may be referred to as an insulating member. The body 115 may be disposed in the first direction and the second direction within the frames 120, 130, 135, and 140, thereby separating the adjacent first to fourth frames 120, 130, 135, and 140 from each other. In the body 115, a portion disposed in the first direction may be connected to a portion disposed in the second direction.

The body 115 may be disposed over the first to fourth frames 120, 130, 135, and 140. The package body 110A may provide an inclined surface disposed over the first to fourth frames 120, 130, 135, and 140. The package body 110A may be provided as side walls formed with the cavity 112 over the first to fourth frames 120, 130, 135, and 140. The package body 110A may be removed. The body 115 may be formed integrally with or separately from the package body 110A. According to an embodiment, the package body 110A may have a structure formed with the cavity 112, or may have a structure provided with a flat upper surface without the cavity 112.

For example, the body 115 may be formed of at least one selected from the group consisting of polyphthalamide (PPA), polychloro tri phenyl (PCT), liquid crystal polymer (LCP), polyamide 9T (PA9T), silicone, an epoxy molding compound (EMC), a silicone molding compound (SMC), ceramic, photo sensitive glass (PSG), sapphire (Al2O3), and the like. In addition, the body 115 may include a high refractive filler such as TiO2 and SiO2. The package body 110A may be formed of the material of the body 115, or may be formed of another material among the above-mentioned materials.

<Recesses R1, R2, and R3 of Body>

According to an embodiment, as shown in FIGS. 1 to 4, the light emitting device package 100 may include recesses R1, R2, and R3. The recesses R1, R2, and R3 may be formed in an upper portion of the body 115. The recesses R1, R2, and R3 may be spaced apart from each other. The recesses R1, R2, and R3 may be arranged in the X direction, and may be arranged in a direction identical to the direction in which the light emitting devices 151, 152, and 153 are arranged. The recesses R1, R2, and R3 may overlap with the bottom of the cavity 112 in the vertical direction or the third direction. The recesses R1, R2, and R3 may be arranged at the bottom of the cavity 112.

The recesses R1, R2, and R3 may include a first recess R1, a second recess R2, and a third recess R3. The lengths of the recesses R1, R2, and R3 in the first direction X may be larger than the width of the recesses R1, R2, and R3 in the second direction Y. The first recess R1 may be arranged between the first frame 120 and the first frame part 131 of the second frame 130, and the second recess R2 may be arranged between the second frame part 132 of the second frame 130 and the third frame part 136 of the third frame 135. The third recess R3 may be arranged between the fourth frame part 137 of the third frame 135 and the fourth frame 140. The first connection frame part 133 may be disposed between the first and second recesses R1 and R2. The second connection frame part 138 may be disposed between the second and third recesses R2 and R3.

The first recess R1 may be disposed between the first and second through-holes TH1 and TH2, and the second recess R2 may be disposed between the third and fourth through-holes TH3 and TH4. The third recess R3 may be disposed between the fifth and sixth through-holes TH5 and TH6.

A virtual line having the shortest length between the first and second through-holes TH1 and TH2 may be disposed, and the first recess R1 may extend in the direction perpendicular to the virtual line. The length of the first recess R1 may be smaller than the width of the light emitting devices 151, 152, and 153 in the direction in which the first recess R1 extends.

A virtual line having the shortest length between the third and fourth through-holes TH3 and TH4 may be disposed, and the second recess R2 may extend in the direction perpendicular to the virtual line. The length of the second recess R2 may be smaller than the width of the light emitting devices 151, 152, and 153 in the direction in which the second recess R2 extends.

A virtual line having the shortest length between the fifth and sixth through-holes TH5 and TH6 may be disposed, and the third recess R3 may extend in the direction perpendicular to the virtual line. The length of the third recess R3 in the first direction may be smaller than the width of the light emitting devices 151, 152, and 153 in the direction in which the third recess R3 extends.

Referring to FIGS. 1 and 11, a length B5 of each of the recesses R1, R2, and R3 in the first direction may be smaller than the width W3 of the light emitting devices 151, 152, and 153. When the light emitting devices 151, 152, and 153 have a rectangular shape, the width of the light emitting devices 151, 152, and 153 may be a length of a short side between a long side and the short side. The length B5 of each of the recesses R1, R2, and R3 may be a length in the direction of the short side of the light emitting devices 151, 152, and 153. The length B5 of each of the recesses R1, R2, and R3 may be smaller than the width W3 of the light emitting devices 151, 152 and 153, thereby reducing the optical loss through regions of the recesses R1, R2, and R3 arranged under the light emitting devices 151, 152, and 153. If the light emitting devices 151, 152 and 153 are mounted as flip chips, the light may be transmitted through the lower portions of the light emitting devices 151, 152 and 153, and radiated toward the bottom of the cavity. The light radiated toward the bottom of the cavity may leak through the recesses R1, R2, and R3, which are regions where the body is relatively thin. Embodiments may reduce the size of the recesses R1, R2, and R3 to reduce the optical loss due to the light leakage.

As shown in FIGS. 1 and 11, a width B6 of each of the recesses R1, R2, and R3 in the second direction may be smaller than the length B5 of each of the recesses R1, R2, and R3 in the first direction. The width B6 of each of the recesses R1, R2, and R3 in the second direction may be smaller than an interval G3 between two frames adjacent to each other in the Y direction, and may be, for example, 70% or less of the interval G3 between two frames adjacent to each other in the Y direction. If the width B6 of each of the recesses R1, R2, and R3 is equal to or less than the above-mentioned range, the rigidity of the body 115 may be prevented from being reduced, and the optical loss through the recesses R1, R2, and R3 may be reduced. The width B6 of the recesses R1, R2, and R3 in the second direction may be 30% or more of the interval G3 between two frames 120, 130, 135, and 140 adjacent to each other in the Y direction, for example, in a range of 30% to 70% of the interval G3, thereby preventing the rigidity of the body 115 disposed between the frames 120, 130, 135, and 140 from being reduced, and preventing the adhesive strength from being reduced.

The length B5 of each of the recesses R1, R2, and R3 may be equal to or smaller than the lower width W1 of each of the through-holes TH1, TH2, TH3, TH4, TH5, and TH6 in the first direction.

The recesses R1, R2, and R3 may be concavely formed in a direction from the upper surface to the lower surface of the body 115. The depths of the recesses R1, R2, and R3 may be smaller than the depths of the through-holes TH1, TH2, TH3, TH4, TH5, and TH6. The depth of the recesses R1, R2, and R3 may be 40% or more of the thickness of the body 115, for example, in a range of 40% to 60% of the thickness of the body 115. If the depths of the recesses R1, R2, and R3 are smaller than the above-mentioned range, an amount of the first resin 160 may be reduced, so that the supporting strength for supporting the light emitting devices 151, 152, and 153 may be rarely improved.

The depths of the recesses R1, R2, and R3 may be determined in consideration of the adhesive strength of the first resin 160. In addition, the depths of the recesses R1, R2, and R3 may be determined in consideration of the stable strength of the body 115 and/or preventing a crack from being generated in the light emitting device package 100 due to the heat emitted from the light emitting devices 151, 152, and 153.

The recesses R1, R2, and R3 may be respectively arranged under the light emitting devices 151, 152, and 153 as one recess or plural recesses. When the recesses R1, R2, and R3 are respectively arranged under the light emitting devices 151, 152, and 153 as one recess, the recesses R1, R2, and R3 may be arranged in a center region of the light emitting devices 151, 152, and 153, or may be biased to one side. When the recesses R1, R2, and R3 are respectively arranged under the light emitting devices 151, 152, and 153 as plural recesses, the plural recesses may be spaced apart from each other in the X direction.

The recesses R1, R2, and R3 may overlap with the light emitting devices 151, 152, and 153 in the Z direction. For example, the depths of the recesses R1, R2, and R3 are determined in consideration of an injection molding process thickness capable of providing crack free to the body 115. According to an embodiment, the ratio of the depths of the recesses R1, R2, and R3 to the depths of the through-holes TH1, TH2, TH3, TH4, TH5, and TH6 may be in a range of 2 to 10. For example, when the depths of the through-holes TH1, TH2, TH3, TH4, TH5, and TH6 are 200 micrometers, the depth of the recesses R1, R2, and R3 may be 20 micrometers to 100 micrometers.

The recesses R1, R2, and R3 may provide a space suitable for performing an under fill process at lower portions of the light emitting devices 151, 152, and 153. The under fill process may be a process of disposing the first resin 160 at the lower portions of the light emitting devices 151, 152, and 153 after mounting the light emitting devices 151, 152, and 153 on the body 115, or a process of disposing the light emitting devices 151, 152, and 153 after disposing the first resin 160 in the recesses R1, R2, and R3 to mount the light emitting devices 151, 152, and 153 on the body 115 through the first resin 160 during a process of mounting the light emitting devices 151, 152, and 153 on the body 115. The recesses R1, R2, and R3 may have a predetermined depth or more to sufficiently provide the first resin 160 between the lower surfaces of the light emitting devices 151, 152, and 153 and the upper surface of the body 115. In addition, the recesses R1, R2, and R3 may have a predetermined depth to provide the stable strength to the body 115. As one example, the depths of the recesses R1, R2, and R3 may be 40 micrometers or more, for example, in a range of 40 to 60 micrometers. The widths of the recesses R1, R2, and R3 in the second direction may be 140 micrometers or more, for example, in a range of 140 to 160 micrometers. The lengths of the recesses R1, R2, and R3 in the first direction may be smaller than the length of the light emitting devices 151, 152, and 153 in the X direction, thereby guiding the formation of the first resin 160, and enhancing the adhesive strength in the first direction.

A side surface of the recesses R1, R2, and R3 may be a vertical surface or an inclined surface. The side surface of the recesses R1, R2, and R3 may have a predetermined curvature. The recesses R1, R2, and R3 may have a side surface where a flat surface and a curved surface combined.

The recesses R1, R2, and R3 may have an upper area equal to or larger than a lower area. The recesses R1, R2, and R3 may have a structure capable of receiving the first resin 160 and enhancing the supporting strength. Top view shapes of the recesses R1, R2, and R3 may be a polygonal shape, a circular shape, an elliptical shape, or an irregular shape.

As shown in FIGS. 1 and 2, an interval D3 between the recesses R1, R2, and R3 arranged under mutually different light emitting devices 151, 152, and 153 may be smaller than an interval between the light emitting devices 151, 152, and 153. In this case, one recess R1, R2, and R3 is arranged under each of the light emitting devices 151, 152, and 153. In this structure, a space of the body 115 disposed under each of the light emitting devices 151, 152, and 153 in the X direction may be equal to or less than two times based on the light emitting devices 151, 152, and 153. The space of the body 115 in the X direction may be defined in a length direction of the recesses R1, R2, and R3, and may be a space in which the recesses R1, R2, and R3 may be arranged. As shown in FIGS. 1 and 2, the side surface 111 of the cavity 112 and the first and second connection frame parts 133 and 138 may be disposed in the length direction of the recesses R1, R2, and R3. In other words, the side surface 111 of the cavity 112 and the first and second connection frame parts 133 and 138 are disposed in the X direction of the recesses R1, R2, and R3. When the recesses R1, R2, and R3 are arranged under one light emitting device as plural recesses, an interval between the recesses R1, R2, and R3 and the side surface 111 of the cavity 112 or the first and second connection frame parts 133 and 138 may be too narrow. When the an interval between the first and third recesses R1 and R3 and the side surface 111 of the cavity 112 is narrowed, the first resin 160 filled in the first and third recesses R1 and R3 may go over the side surface 111. If an interval between the first to third recesses R1, R2, and R3 and the first and second connection frame parts 133 and 138 is narrowed, the rigidity of the body 115 may be reduced.

<First Resin 160>

According to an embodiment, the light emitting device package 100 may include the first resin 160. The first resin 160 may be disposed between the body 115 and the light emitting devices 151, 152, and 153. The first resin 160 may be disposed between the lower surface of the body 115 and the lower surface of the light emitting devices 151, 152, and 153. The first resin 160 may overlap with the light emitting devices 151, 152, and 153 in the vertical direction or the third direction. The first resin 160 may be adhered to the light emitting devices 151, 152, and 153 and the body 115. The first resin 160 may be disposed between the bonding parts 51 and 52 of the light emitting devices 151, 152, and 153. The first resin 160 disposed in the first recess R1 may be disposed between the first and second bonding parts 51 and 52 while making contact with the lower surface of the first light emitting device 151 and the first and second bonding parts 51 and 52. The first resin 160 disposed in the second recess R2 may be disposed between the lower surface of the second light emitting device 152 and the first and second bonding parts 51 and 52 while making contact with the first and second bonding parts 51 and 52. The first resin 160 disposed in the third recess R3 may be disposed between the lower surface of the third light emitting device 153 and the first and second bonding parts 51 and 52 while making contact with the first and second bonding parts 51 and 52.

The first resin 160 may be disposed in each of the recesses R1, R2, and R3. The first resin 160 may provide the stable fixing strength between the light emitting devices 151, 152, and 153 and the package body 110A and/or the body 115. The first resin 160 may provide the stable fixing strength between the light emitting devices 151, 152, and 153 and the body 115. For example, the first resin 160 may make direct contact with the upper surface of the body 115. The first resin 160 may make direct contact with the lower surface of the light emitting devices 151, 152, and 153.

For example, the first resin 160 may include at least one of an epoxy-based material, a silicone-based material, and a hybrid material including the epoxy-based material and the silicon-based material. In addition, for example, when the first resin 160 includes a reflection function, the first resin 160 may include a metal oxide such as white silicone. The first resin 160 may be formed of a material different from a material of a molding part, or may contain an impurity (for example, a metal oxide) different from an impurity (for example, a fluorescent substance) that may be added to the molding part. The first resin 160 may be an adhesive formed of a reflective material.

If the light is emitted to the lower surface of the light emitting devices 151, 152, and 153, the first resin 160 may provide a light diffusion function between the light emitting devices 151, 152, and 153 and the body 115. When the light is emitted from the light emitting devices 151, 152, and 153 to the lower surfaces of the light emitting device 151, 152, and 153, the first resin 160 may provide a light diffusion function, thereby improving the light extraction efficiency of the light emitting device package 100. In addition, the first resin 160 may reflect the light emitted from the light emitting devices 151, 152, and 153. If the first resin 160 includes a reflection function, the first resin 160 may be composed of a material including a metal oxide such as $TiO_2$, silicone or $Al_2O_3$, or an impurity.

Meanwhile, referring to FIGS. 1 and 4, the first connection frame part 133 may be connected between the first frame part 131 and the second frame part 132 of the second frame 130. As another example, the first connection frame part 133 may have a through-hole, and the through-hole may physically divide the first connection frame part 133 into both sides. In this case, if the conductive layer described in the embodiment is provided in the through-hole, the divided first connection frame part 133 may be connected, and may connect the first frame part 131 to the second frame part 132. Alternatively, if the through-hole of the first connection frame part 133 is left as an empty space, the first frame part 131 and the second frame part 132 may be electrically separated from each other.

The second connection frame part 138 may be connected between the third frame part 136 and the fourth frame part 137 of the third frame 135. As another example, the second connection frame part 138 may have a through-hole, and the through-hole may physically divide the second connection frame part 138 into both sides. In this case, if the conductive layer described in the embodiment is provided in the through-hole, the divided second connection frame part 138 may be connected, and may connect the third frame part 136 to the fourth frame part 137. Alternatively, if the through-hole of the second connection frame part 138 is left as an empty space, the third frame part 136 and the fourth frame part 137 may be electrically separated from each other.

The first and second connection frame parts 133 and 138 may be thinner than the first to fourth frames 120, 130, 135, and 140. The lower surfaces of the first and second connection frame parts 133 and 138 may be coplanar with the lower surfaces of the second and third frames 130 and 135. The upper surfaces of the first and second connection frame parts 133 and 138 may be disposed at positions lower than positions of the upper surfaces of the second and third frames 130 and 135. The first and second connection frame parts 133 and 138 may extend in a straight line, or may be formed in a curved or angled shape.

The width of the first and second connection frame parts 133 and 138 corresponds to a length defined in a direction orthogonal to the length direction of the first and second connection frame parts 133 and 138, and may be smaller than the length of the first and second connection frame parts 133 and 138. The width of the first and second connection frame parts 133 and 138 may vary depending on the supply voltage, and may be, for example, 120 μm or more, for example, in a range of 120 μm to 300 μm, or in a range of 150 μm to 250 μm. The length of the first and second connection frame parts 133 and 138, that is, an interval between two adjacent frame parts, may be 400 micrometers or more, for example, in a range of 400 micrometers to 600 micrometers. The width of the first and second connection frame parts 133 and 138 may be 150 micrometers or more, for example, in a range of 150 micrometers to 300 micrometers. The length of the first and second connection frame parts 133 and 138 may vary depending on the size of a package and the size of each frame, and the width of the first and second connection frame parts 133 and 138 may be determined to the extent that electrical interference between adjacent frames may be prevented.

According to an embodiment, the light emitting device package 100 may be provided on the upper portion thereof with an optical lens or an optical member. The optical lens may change the directivity angle of the incident light, and the optical member may include a light guide plate that diffuses the light to provide a surface light source, or a prism sheet on the light guide plate. One or a plurality of the light emitting device packages 100 may be arranged.

In the light emitting device package 100 according to and embodiment, a plurality of light emitting devices 151, 152, and 153 may be connected to each other in series. As another example, the light emitting devices 151, 152, and 153 may be connected to each other in parallel as shown in FIG. 28.

In the light emitting device package 100 according to and embodiment, if a power source of a first polarity is connected to the first frame 120 and the first extension part 123, a power source of a second polarity is connected to the fourth frame 140 and the second extension part 143, so that the first to third light emitting devices 151, 152, and 153 may be connected in series through the frames 120, 130, 135, and 140. The light emitting device package 100 may serve as a high-voltage package by connecting the light emitting devices 151, 152, and 153 to each other at the inside of the light emitting device package 100. According to an embodiment, the light emitting device package having a plurality of light emitting devices 151, 152, and 153 may be improved in brightness.

According to an embodiment, the supporting strength of the light emitting devices 151, 152, and 153 may be improved. The recesses R1, R2, and R3 may be provided in the body 115 between adjacent frames 120, 130, 135, and 140, and the light emitting devices 151, 152, and 153 may be adhered onto regions of the recesses R1, R2, and R3 through the first resin 160. The first resin 160 supports the light emitting devices 151, 152, and 153 to prevent the light emitting devices 151, 152, and 153 from being moved due to an external factor.

<Light Emitting Devices 151, 152, and 153>

According to an embodiment, the light emitting devices 151, 152, and 153 may include a plurality of light emitting devices, for example, at least two or at least three light emitting devices. The light emitting devices 151, 152, and 153 may include first to third light emitting devices 151, 152, and 153. An embodiment may provide a package having at least two light emitting devices, or having two to five light emitting devices, but embodiments are not limited to three light emitting devices. According to an embodiment, the light emitting devices 151, 152, and 153 may emit light from at least five surfaces within the cavity 112. At least five surfaces of the light emitting devices 151, 152, and 153 may include an upper surface and side surfaces.

Referring to FIGS. 3 to 8, the first to third light emitting devices 151, 152, and 153 may include the first and second bonding parts 51 and 52 and a light emitting structure 55. The first to third light emitting devices 151, 152, and 153 may include a substrate 50 formed of a transparent material on the light emitting structure 55. The light emitting structure 55 may be disposed between the substrate 50 and the bonding parts 51 and 52. The bonding parts 51 and 52 may be defined as first and second bonding parts under the first light emitting device 151, third and fourth bonding parts under the second light emitting device 152, and fifth and sixth bonding parts under the third light emitting device 153. For convenience of explanation, two bonding parts will be described as the first and second bonding parts.

The first and second bonding parts 51 and 52 may be disposed under the light emitting structure 55, and may be an electrode or an electrode pad. The first and second bonding parts 51 and 52 may be electrically connected to each of the frames 120, 130, 135, and 140. An interval between the first and second bonding parts 51 and 52 is a distance in the Y direction, and may be smaller than intervals between the first and second through-holes TH1 and TH2, the third and fourth through-holes TH3 and TH4, and the fifth and sixth through-holes TH5 and TH6 spaced apart from each other in the Y direction. The first bonding part 51 may overlap with the first, third, and fifth through-holes TH1, TH3, and TH5 in the third direction, and the second bonding part 52 may overlap with the second, fourth, and sixth through-holes TH2, TH4, and TH6 in the third direction. A lower surface area of the first and second bonding parts 51 and 52 may be larger than an upper surface area of the first to sixth through-holes TH1, TH2, TH3, TH4, TH5, and TH6.

The first bonding part 51 of the first light emitting device 151 may face or overlap with the first through-hole TH1, or the first through-hole TH1 and the first frame 120 in the third direction, and the second bonding part 52 of the first light emitting device 151 may face or overlap with the second through-hole TH2, or the second through-hole TH2 and the first frame part 131 of the second frame 130 in the third direction. The first bonding part 51 of the second light emitting device 152 may face or overlap with the third through-hole TH3, or the third through-hole TH3 and the second frame part 132 of the second frame 130 in the third direction, and the second bonding part 52 of the second light emitting device 152 may face or overlap with the fourth through-hole TH4, or the fourth through-hole TH4 and the third frame part 136 of the third frame 135 in the third direction. The first bonding part 51 of the third light emitting device 153 may face or overlap with the fifth through-hole TH5, or the fifth through-hole TH5 and the fourth frame part 137 of the third frame 135 in the third direction, and the second bonding part 52 of the third light emitting device 153 may face or overlap with the sixth through-hole TH6, or the sixth through-hole TH4 and the fourth frame 140 in the third direction. The first and second bonding parts 51 and 52 of the first to third light emitting devices 151, 152, and 153 may face and overlap with the through-holes TH1, TH2, TH3, TH4, TH5, and TH6, thereby ensuring a power supply path and a heat radiation path.

The first and second bonding parts 51 and 52 of the first to third light emitting devices 151, 152, and 153 may be adhered to the conductive layer 321 disposed in the through-holes TH1, TH2, TH3, TH4, TH5, and TH6, and may be bonded to the first to fourth frames 120, 130, 135, and 140. The first light emitting device 151 may be electrically connected to the first and second frames 120 and 130. The first light emitting device 151 may be electrically connected to the conductive layer 321 disposed in the first and second through-holes TH1 and TH2. The second light emitting device 152 may be electrically connected to the second and third frames 130 and 135. The second light emitting device 152 may be electrically connected to the conductive layer 321 disposed in the third and fourth through-holes TH3 and TH4. The third light emitting device 153 may be electrically connected to the third and fourth frames 130 and 140. The third light emitting device 153 may be electrically connected to the conductive layer 321 disposed in the fifth and sixth through-holes TH5 and TH6.

The light emitting structure 55 of the first to third light emitting devices 151, 152, and 153 may include a semiconductor layer, and may emit at least one of blue, green, red, ultraviolet, and infrared rays. The semiconductor layer may include a first conductive semiconductor layer, an active layer, and a second conductive semiconductor layer, and may include at least one of an n-p junction, a p-n junction, an n-p-n junction, and a p-n-p junction. The semiconductor layer may selectively include a compound semiconductor of Group 3 to Group 6 elements, and may include, for example, a compound semiconductor layer of Group 3 and Group 5 elements, or a compound semiconductor layer of Group 2 and Group 6 elements. For example, the semiconductor layer may include at least two elements selected from aluminum (Al), gallium (Ga), indium (In), phosphorus (P), arsenic (As), and nitrogen (N). The first bonding part 51 may be connected to one of the first conductive semiconductor layer and the second conductive semiconductor layer, and the second bonding part 52 may be connected to the remaining one.

In the light emitting structure 55, the first and second conductive semiconductor layers may be implemented as at least one among Group III-V or Group II-VI compound semiconductors. The first and second conductive semiconductor layers may be, for example, formed of a semiconductor material having a composition formula of $In_xAl_yGa_{1-x-y}N$, wherein $0 \leq x \leq 1$, $0 \leq y \leq 1$, and $0 \leq x+y \leq 1$. For example, the first and second conductive semiconductor layers may include at least one selected from the group consisting of GaN, AlN, AlGaN, InGaN, InN, InAlGaN, AlInN, AlGaAs, GaP, GaAs, GaAsP, AlGaInP, and the like. The first conductive semiconductor layer may be an n-type semiconductor layer doped with an n-type dopant such as Si, Ge, Sn, Se or Te. The second conductive semiconductor layer may be a p-type semiconductor layer doped with a p-type dopant such as Mg, Zn, Ca, Sr, or Ba.

The active layer may be implemented as a compound semiconductor. The active layer may be implemented as, for example, at least one among Group III-V or Group II-VI compound semiconductors. If the active layer is implemented as a multi-well structure, the active layer may include a plurality of well layers and a plurality of barrier layers, which are alternately arranged with each other, and may be formed of a semiconductor material having a composition formula of $In_xAl_yGa_{1-x-y}N$, wherein $0 \leq x \leq 1$, $0 \leq y \leq 1$, and $0 \leq x+y \leq 1$. For example, the active layer may include at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

The light emitting structure 55 may emit the same peak wavelength or mutually different peak wavelengths through each of the light emitting devices 151, 152, and 153. The light emitting structure 50 of the first to third light emitting devices 151, 152, and 153 may be provided at an upper portion thereof with a substrate 55, in which the substrate 55 may include a transparent material and may be disposed on the light emitting structure 50.

If the light emitting structure 55 is provided therein with one light emitting cell, the light emitting structure 55 may have one semiconductor structure of an n-p junction, a p-n junction, an n-p-n junction, and a p-n-p junction. If the light emitting structure 55 is provided therein with a plurality of light emitting cells, the semiconductor structure may be separated into a plurality of pieces and electrically connected to each other. In other words, one or at least two light emitting cells may be provided in the light emitting structure 55, and at least two light emitting cells may be connected to each other in series to increase the driving voltage of the light emitting device. The light emitting cell(s) of the light emitting structure 55 may be selectively connected to the first and second bonding parts 51 and 52.

The first and second bonding parts 51 and 52 may be formed in a single layer or a multi-layer by using at least one material selected from the group consisting of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO, or and alloy thereof.

Each of the frames 120, 130, 135, and 140 and the bonding parts 51 and 52 may be coupled to each other by an intermetallic compound layer. An intermetallic compound may include at least one of $Cu_xSn_y$, $Ag_xSn_y$, and $Au_xSn_y$, wherein x may satisfy the condition of $0<x<1$, $y=1-x$, and $x>y$.

The bonding parts 51 and 52 of the light emitting devices 151, 152 and 153 may be formed with the intermetallic compound layer between the conductive layer 321 and the frames 120, 130, 135 and 140 in the process of forming material constituting the conductive layer 321 and the conductive layer 321 or in a heat treatment process after providing the conductive layer 321. The conductive layer 321 may include one selected from the group consisting of Ag, Au, Pt, Sn, Cu and the like, or the alloy thereof. However, the embodiment is not limited to above and a material capable of securing a conductive function may be used for the conductive layer 321. For example, the conductive layer 321 may be formed by using conductive paste. The conductive paste may include solder paste, silver paste, or the like, and may be composed of a multi-layer or a single layer composed of a multi-layer or an alloy composed of mutually different materials. For example, the conductive layer 321 may include an SAC (Sn—Ag—Cu) or SAC based-material.

For example, an alloy layer may be formed by combining the material constituting the conductive layer 321 and the metals of the frames 120, 130, 135 and 140. Thus, the conductive layer 321 and the frames 120, 130, 135 and 140 may be coupled to each other to be physically or electrically stable. In addition, the conductive layer 321, the alloy layer and the frame may be coupled to each other to be physically or electrically stable. The alloy layer may include at least one intermetallic compound layer selected from the group consisting of AgSn, CuSn, and AuSn. The intermetallic compound layer may be formed by combining first and second materials, where the first material may be provided from the conductive layer 321 and the second material may be provided from the bonding parts 51 and 52 or the frames 120, 130, 135 and 140.

<Molding Part 180>

According to an embodiment, as shown in FIGS. 3 to 8, the light emitting device package 100 may include a molding part 180. The molding part 180 may be provided on the light emitting devices 151, 152, and 153. The molding part 180 may be disposed on the first to fourth frames 120, 130, 135, and 140. The molding part 180 may be disposed in the cavity 112 formed by the package body 110A. The molding part 180 may be formed of a transparent resin material such as silicone or epoxy. The molding part 180 may include an insulating material. The molding part 180 may be formed in a single layer or a multi-layer.

The molding part 180 may include a wavelength conversion unit for receiving light emitted from the light emitting devices 151, 152, and 153 to provide wavelength-converted light. For example, the molding part 180 may include at least one selected from the group consisting of a fluorescent substance, a quantum dot, and the like. The light emitting devices 151, 152, and 153 may emit blue, green, red, white, infrared, or ultraviolet light. The fluorescent substance or the quantum dot may emit blue, green or red light. A fluorescent substance layer may be formed on each of the light emitting devices 151, 152, and 153 with a thickness thinner than the thickness of the light emitting devices 151, 152, and 153. In this case, the fluorescent substance layer disposed on each of the light emitting devices 151, 152, and 153 may be molded into the molding part 180. The molding part 180 may not be formed.

The light emitting device package according to the embodiment may be selectively applied to a modification example or another embodiment that will be described below, and the following modified examples and embodiments will be described while focusing on parts different from the first embodiment.

FIG. 7 is a first modification example of the package shown in FIG. 5. The light emitting device package of FIG. 7 includes a second resin 164. The second resin 164 may be disposed at a periphery of the lower portion of the light emitting devices 151, 152, and 153. The second resin 164 may be disposed on the first to fourth frames 120, 130, 135, and 140 and the body 115. The second resin 164 may make contact with the lower surface of the light emitting devices 151, 152, and 153. The second resin 164 may partially make contact with a lower side surface of the light emitting devices 151, 152, and 153. The second resin 164 may reflect light emitted in a lateral direction from the light emitting devices 151, 152, and 153. The thickness of the second resin 164 may be smaller than the thickness of the light emitting devices 151, 152, and 153, and the height of the second resin 164 may be set such that an upper surface of the second resin 164 is disposed at a position lower than a position of the lower surface of the light emitting structure 55 of the light emitting devices 151, 152, and 153.

For example, the second resin 164 may include at least one of an epoxy-based material, a silicone-based material, and a hybrid material including the epoxy-based material and the silicon-based material. In addition, the second resin 164 may be a reflective part for reflecting the light emitted from the light emitting devices 151, 152, and 153, may be, for example, a resin including a reflective material such as TiO2, or may include white silicone. The second resin 164 may be formed of a material different from a material of the molding part 180, or may contain an impurity (for example, a metal oxide) different from an impurity (for example, a fluorescent substance) that may be added to the molding part 180.

As another example, in the light emitting device package, a recess of the body 115 disposed under the light emitting devices 151, 152, and 153 may be a hole formed from the upper surface toward the lower surface of the body 115. The formed recess may be defined as a through-hole, and may be arranged between adjacent two through-holes TH1, TH2, TH3, TH4, TH5, and TH6 of the light emitting devices 151, 152, and 153. The first resin 160 is provided in the recess, thereby supporting the lower surfaces of the light emitting devices 151, 152, and 153. When the first resin is filled in the recess having a through-hole shape, it is possible to form the recess after disposing a support sheet in a lower portion of the recess.

Referring to FIGS. 8 and 9, the views show a modification example of the bonding parts of the light emitting devices 151, 152, and 153 in the light emitting device package according to an embodiment. Each of the bonding parts 51 and 52 of the light emitting devices 151, 152, and 153 shown in FIGS. 1 to 7 have an area of at least 10% of a lower surface area of each of the light emitting devices 151, 152, and 153, so that each of the bonding parts 51 and 52 may correspond to an area larger than an upper surface area of each of the through-holes TH1, TH2, TH3, TH4, TH5, and TH6. The light emitting device 152 as shown in FIGS. 8 and 9 may be arranged such that conductors 51A and 52A of the bonding parts 51 and 52 are less than 10% of the lower surface area of the light emitting device 152. Such a light emitting device 152 may be implemented by, for example, FIGS. 32 and 33. For example, a maximum area of the conductors 51A and 52A of the bonding parts 51 and 52 may be smaller than the upper surface area of the through-holes TH3 and TH4. Accordingly, the conductors 51A and 52A of the bonding parts 51 and 52 of the light emitting device 152 may be inserted into the through-holes TH3 and TH4. The lower surfaces of the conductors 51A and 52A of the bonding parts 51 and 52 of the light emitting device 152 may be disposed at a position lower than a position of the upper surface of the body or the frames 130 and 140. The conductors 51A and 52A of the bonding parts 51 and 52 of the light emitting device 152 may be disposed in the through-holes TH3 and TH4, and may be coupled to the conductive layer 321 disposed in the through-holes TH3 and TH4. The conductive layer 321 may make contact with peripheries of the conductors 51A and 52A of the bonding parts 51 and 52 of the light emitting device 152, thereby improving the adhesive strength between the conductive layer 321 and the light emitting device 152. In this case, a power may be supplied to each bonding part of the light emitting device 152 through the conductive layer 321. According to an embodiment, the conductors 51A and 52A of the light emitting device 152 may be applied to other light emitting devices, but embodiments are not limited thereto. The conductors 51A and 52A may be one material selected from the group consisting of Al, Au, Ag, Pt, and the like, or an alloy thereof. The conductors 51A and 52A may be formed in a single layer or a multi-layer.

The conductors 53A and 54A of the light emitting device 152 may be formed with the intermetallic compound layer between the conductive layer 321 and the frames 130 and 140 in the process of forming material constituting the conductive layer 321 and the conductive layer 321 or in a heat treatment process after providing the conductive layer 321. The conductive layer 321 may include one selected from the group consisting of Ag, Au, Pt, Sn, Cu, Zn, In, Bi, Ti, and the like, or the alloy thereof. However, the embodiment is not limited to the above and a material capable of securing the conductive function as the conductive layer 321. As an example, the conductive layer 321 may formed by using conductive paste. The conductive paste may include solder paste, silver paste, or the like, and may be composed of a multi-layer or a single layer composed of a multi-layer or an alloy composed of mutually different materials. For example, the conductive layer 321 may include Sn—Ag—Cu (SAC) material.

For example, an alloy layer may be formed by combining the material constituting the conductive layer 321 and the metal of the frame. Thus, the conductive layer 321 and the frame may be coupled to each other to be physically or electrically stable. The conductive layer 321, the alloy layer and the frame may be coupled to each other to be physically or electrically stable. The alloy layer may include at least one intermetallic compound layer selected from the group consisting of AgSn, CuSn, and AuSn. The intermetallic compound layer may be formed by combining first and second materials, where the first material may be provided from the conductive layer 321 and the second material may be provided from the bonding parts or the frames.

FIG. 11 is a detailed view showing a light emitting device and a recess of a body according to the first embodiment, FIG. 12 is a view showing an example in which a first resin is disposed between the body and the light emitting device shown in FIG. 11, and FIGS. 13 to 15 show modification examples of the recess of the body of the light emitting device package according to the first embodiment. For convenience of explanation, the first light emitting device and the structure of the lower portion of the first light emitting device will be described, and the description may be applied to other light emitting devices and a structure of a lower portion of other light emitting devices. For convenience of explanation, the first light emitting device and the body 115 and the recess R1 at the lower portion of the first light emitting device will be described.

As shown in FIGS. 11 and 12, the length B5 of the recess R1 in the first direction may be larger than the width B6 of the recess R1 in the second direction, and may be, for example, in a range of 80 to 120 micrometers. The length B5 of the recess R1 may be smaller than the width W3 of the light emitting device 151 in the first direction. In other words, relation represented by B5<W3 may be formed. The first resin 160 may be disposed in the recess R1 and a region between the body 115 and the light emitting device 151. The first resin 160 may be supported by a support protrusion in the recess R1, may adhere the body 115 to the light emitting device 151.

The width W3 of the light emitting device 151 in the first direction may be larger than the lower width W2 of the through-holes TH1 and TH2, and the lower width W2 of the through-holes TH1 and TH2 may be larger than the upper width W1 of the through-holes TH1 and TH2. The length B5 of the recess R1 in the first direction may be equal to or smaller than the upper width W2 of the through-holes TH1 and TH2. The length B5 of the recess R1 in the first direction may be equal to or smaller than the lower width W3 of the through-holes TH1 and TH2. If the length B5 of the recess R1 in the first direction is larger than the above-mentioned range, the optical loss may be increased toward the bottom of the body.

An interval G3 between the first frame 120 and the first frame part 131 of the second frame 130 may be larger than the width B6 of the recess R1. The recess R1 may be spaced apart from the first frame 120 or the first frame part 131 of the second frame 120 by an interval G4, which is in a range of 15% to 35% of the interval G3. Accordingly, it is possible to prevent the rigidity of the body 115 from being reduced between the two frames 120 and 130.

Figure 13:
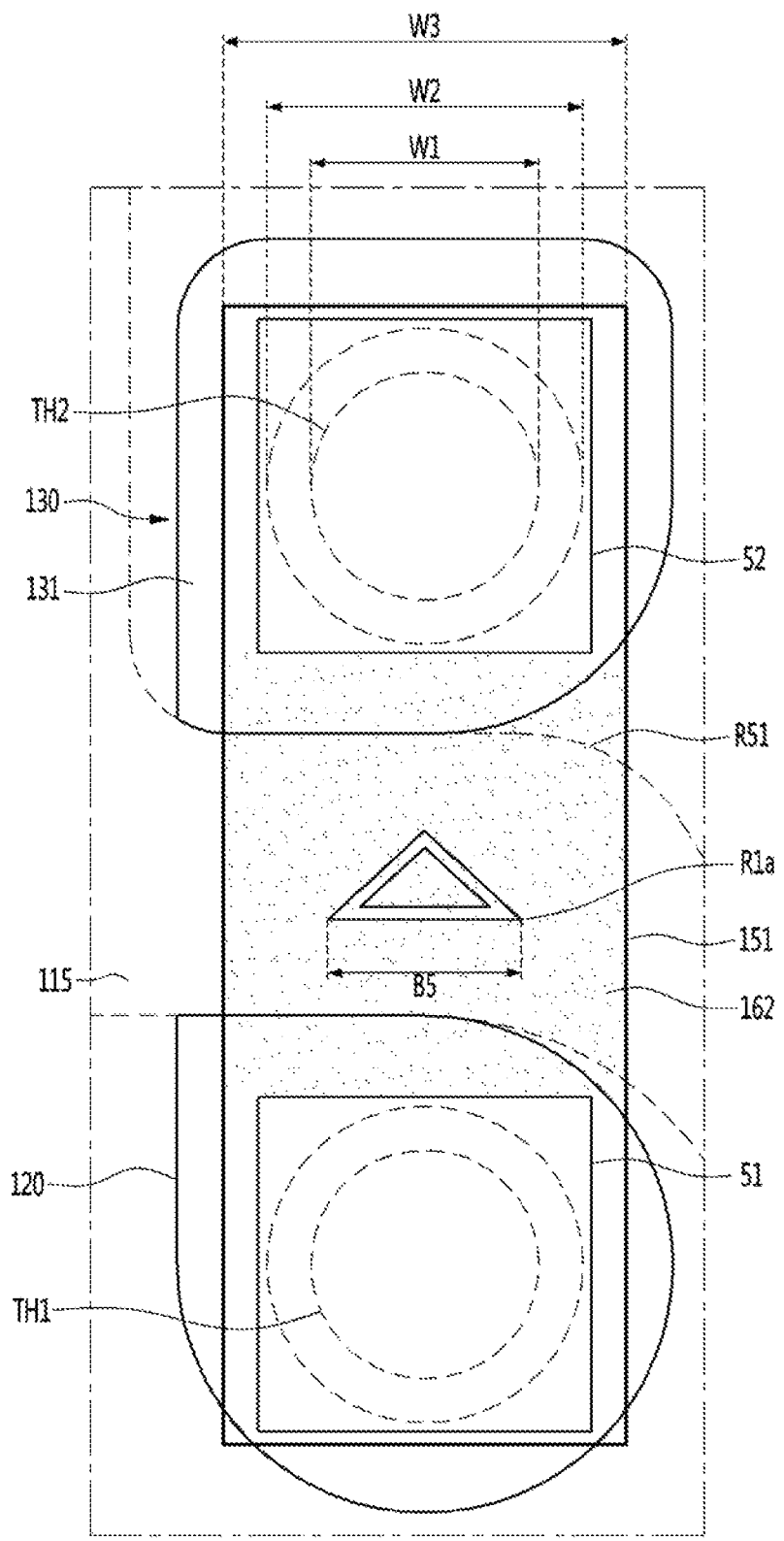
FIGS. 13 to 15 show modification examples of the recess of the body of the light emitting device package according to the first embodiment.
Figure 14:
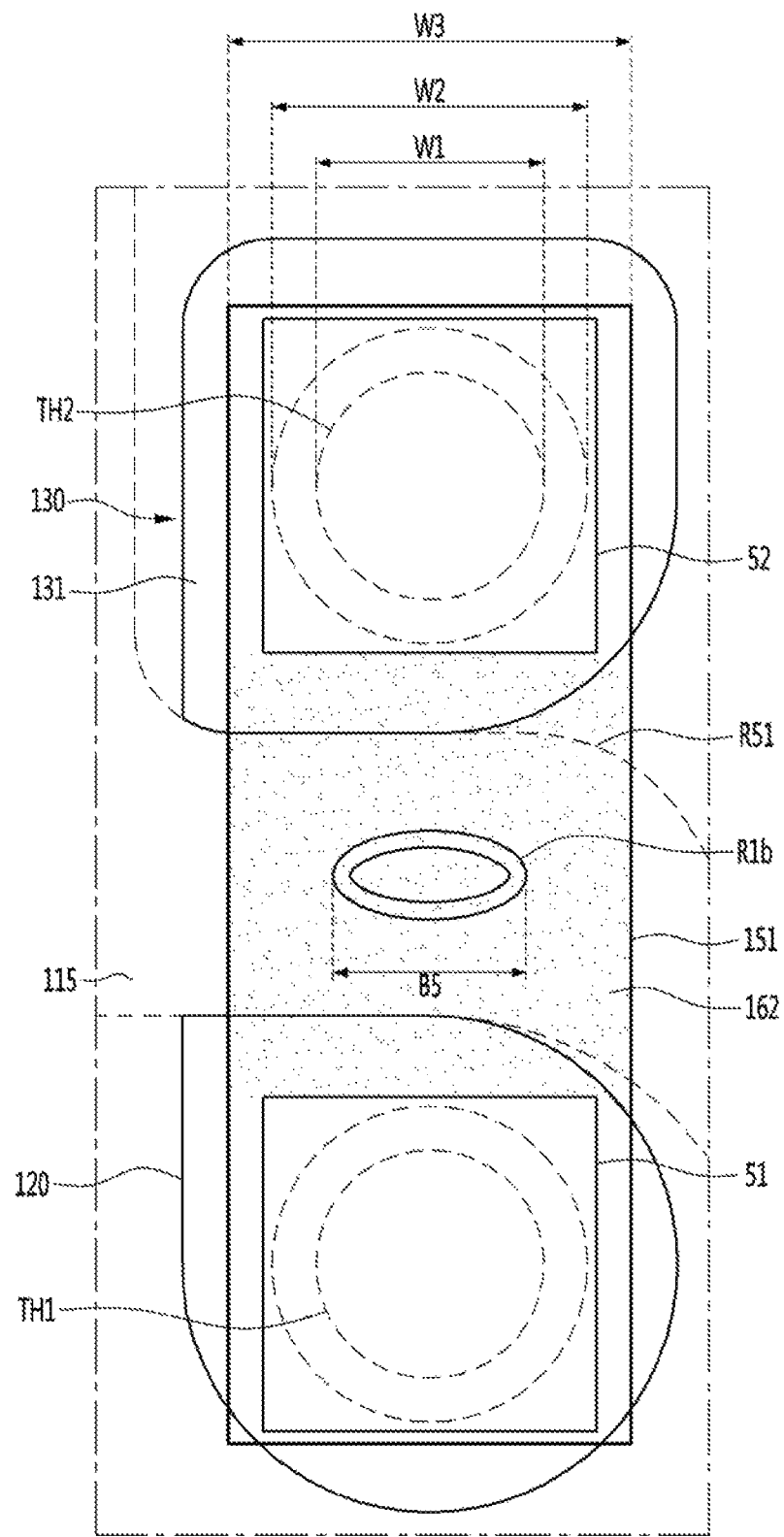

A top view shape of the recess R1 may be a polygonal shape, for example, a square or a rectangle, or a pentagonal or hexagonal shape. Alternatively, as shown in FIG. 13, the recess R1a may be formed in a triangular shape. Alternatively, as shown in FIG. 14, the recesses R1b may be formed in an elliptical shape. As another example, the recess may be formed in a shape in which a curved line and a straight line are mixed, but embodiments are not limited thereto. The shape of the recess may include a shape having a predetermined curvature or an angled shape, and may be changed into a structure that facilitates the injection molding of the body or improves the supporting strength upon the bonding.

Figure 15:
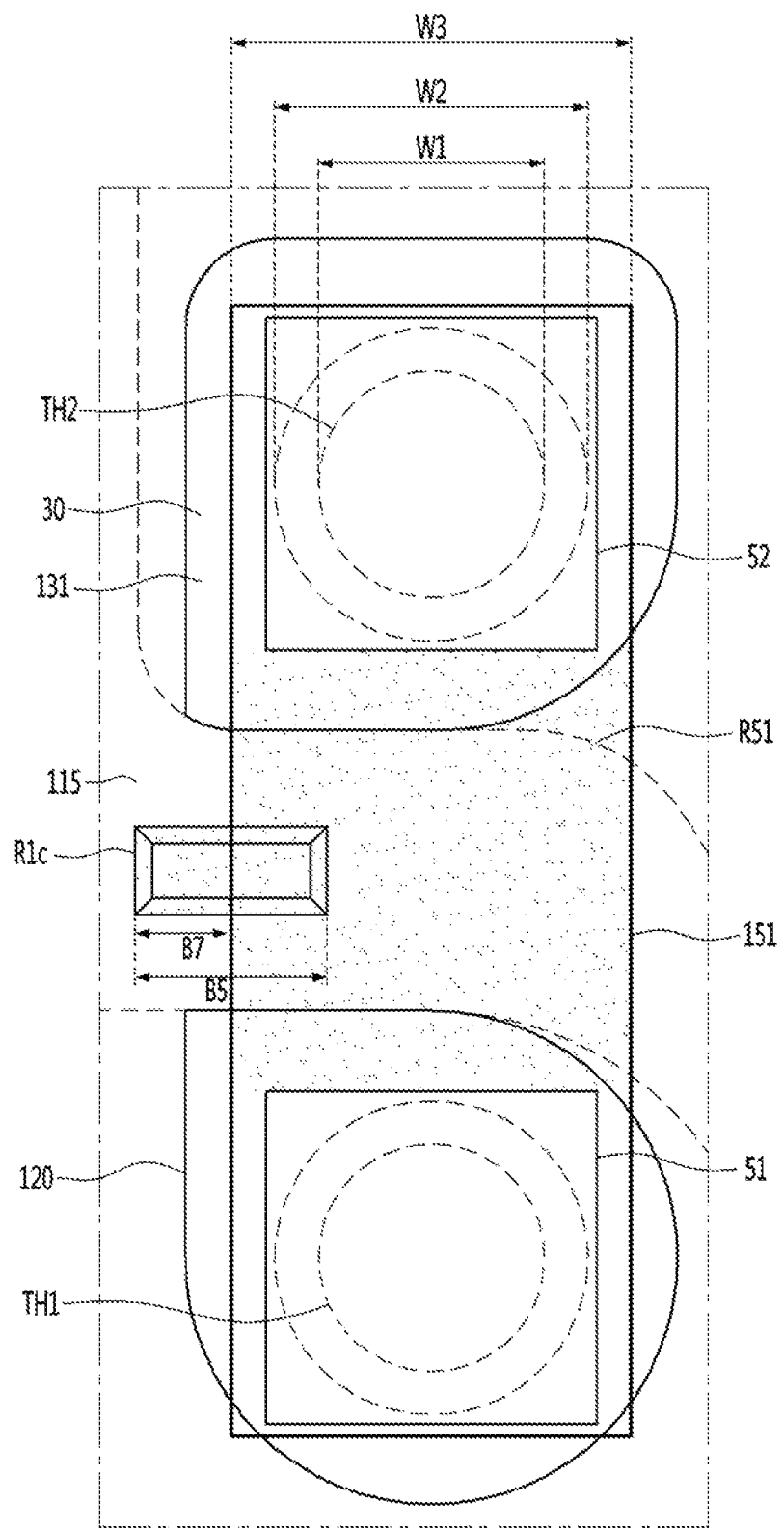

As shown in FIG. 15, the recess R1c may partially overlap with the light emitting device 151 in the vertical direction or the third direction. An outer portion of the recess R1c may protrude further outward than a long side among sides of the light emitting device 151, and an inner portion may overlap with the light emitting device 151 under the light emitting device 151. The outer portion of the recess R1c protrudes outward of a region of the light emitting device 151, so that the first resin 160 may be guided and filled in the recess R1c, and a region where the recess R1c overlaps with the light emitting device 151 may be reduced. Accordingly, if the optical loss occurs through the recess R1c overlapping with the light emitting device 151, the optical loss may be reduced by reducing the overlapping recess region.

The length B7 of the outer portion of the recess R1c may be 40% or more of the length B5 of the recess R1c, for example, in a range of 40% to 60% of the length B5 of the recess R1c. The length B7 of the outer portion of the recess R1c is provided within the above-mentioned range, the flow of the first resin 160 may be guided, and the optical loss may be reduced. In addition, when the length B7 of the outer portion of the recess R1c is within the above-mentioned range, a distance between the recess R1c and the side surface of the cavity may be ensured.

Figure 16A:
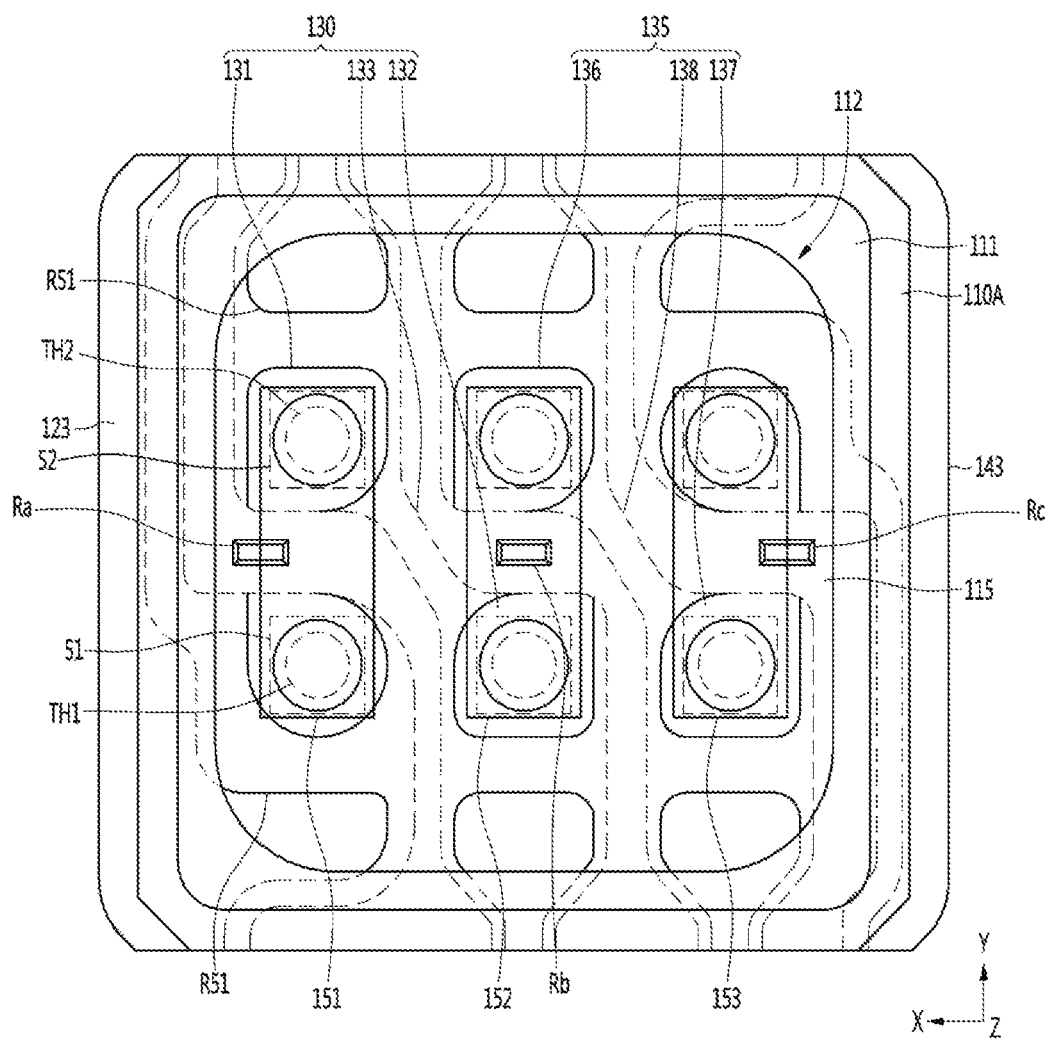
FIG. 16a shows another arrangement example of the recess for the light emitting device package shown in FIG. 1.

As shown in FIG. 16a, the outer portion of the first recess Ra arranged under the first light emitting device 151 may protrude outward from the first light emitting device 151 while being adjacent to the side surface of the cavity 112. The first recess Ra may be spaced apart from the side surface of the cavity 112. The first recess Ra may be spaced apart from the cavity side surface 111 by 50 micrometers, for example, 50 to 100 micrometers, thereby preventing the first resin 160 from flowing toward the cavity side surface.

The outer portion of the third recess Rc arranged under the third light emitting device 153 may protrude outward from the third light emitting device 153 while being adjacent to the side surface of the cavity 112. The third recess Rc may be spaced apart from the side surface of the cavity 112. The third recess Rc may be spaced apart from the side surface of the cavity 112 by 50 micrometers, for example, 50 to 100 micrometers, thereby preventing the first resin 160 from flowing toward the cavity side surface.

The second recess Rb arranged under the second light emitting device 152 may be one recess or plural recesses, and may be arranged under a center region of the second light emitting device 152 or may partially protrude outward. Since the second recess Rb has to be spaced apart from the first and second connection frame parts 133 and 138, the second recess Rb is arranged in a region of the second light emitting device 152, thereby reducing the interference between the second recess Rb and the first and second connection frame parts 133 and 138, and preventing the rigidity of the body 115 from being reduced.

Figure 16B:
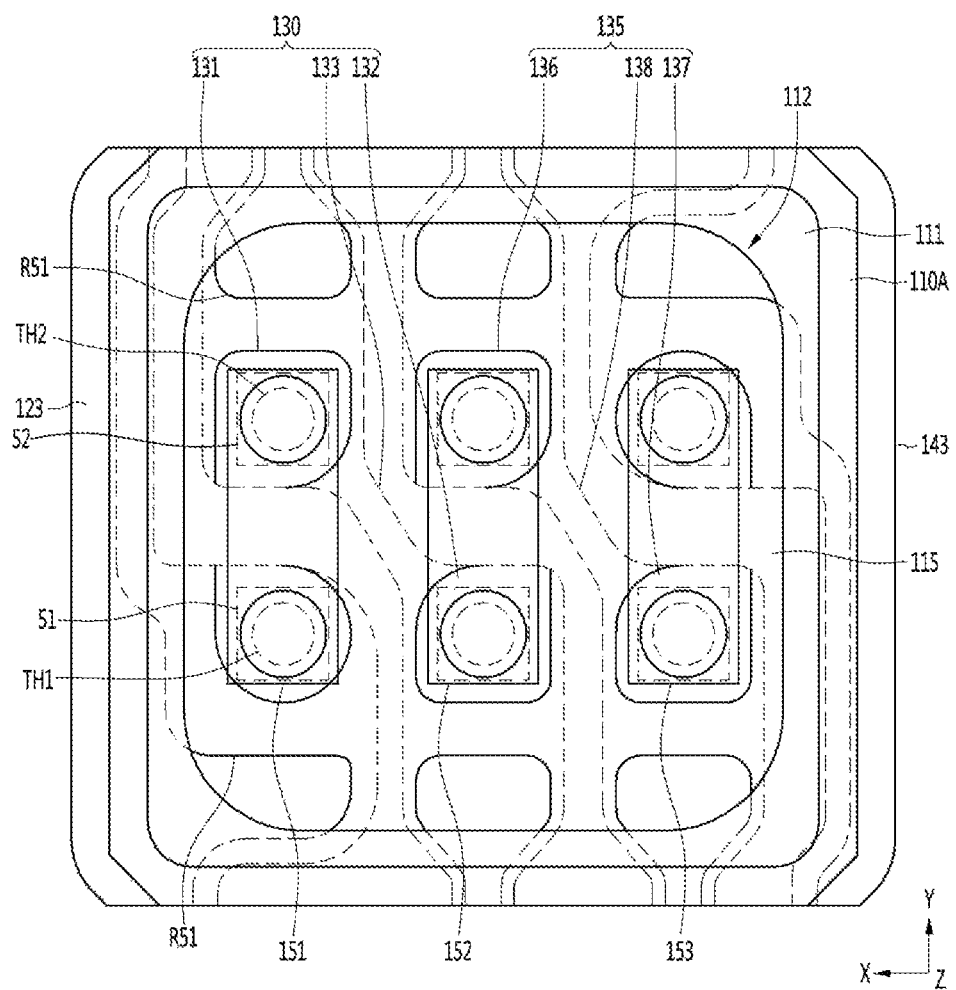
FIG. 16b shows an example of the light emitting device package shown in FIG. 1 where the recess is omitted.

As another example, as shown in FIG. 16b, the body 115 overlapping with the light emitting devices 151, 152, and 153 may be provided without the recesses described above. In other words, the body 115 disposed between the frames 120, 130, 135, and 140 may be provided without a recess in a region overlapping with the light emitting devices 151, 152, and 153 to reduce the optical loss.

In this case, an adhesive such as the first resin or a reflective resin material may be disposed between the body 115 and each of the light emitting devices 151, 152, and 153, thereby supporting the light emitting devices 151, 152, and 153, or improving the light diffusion efficiency.

Figure 28A:
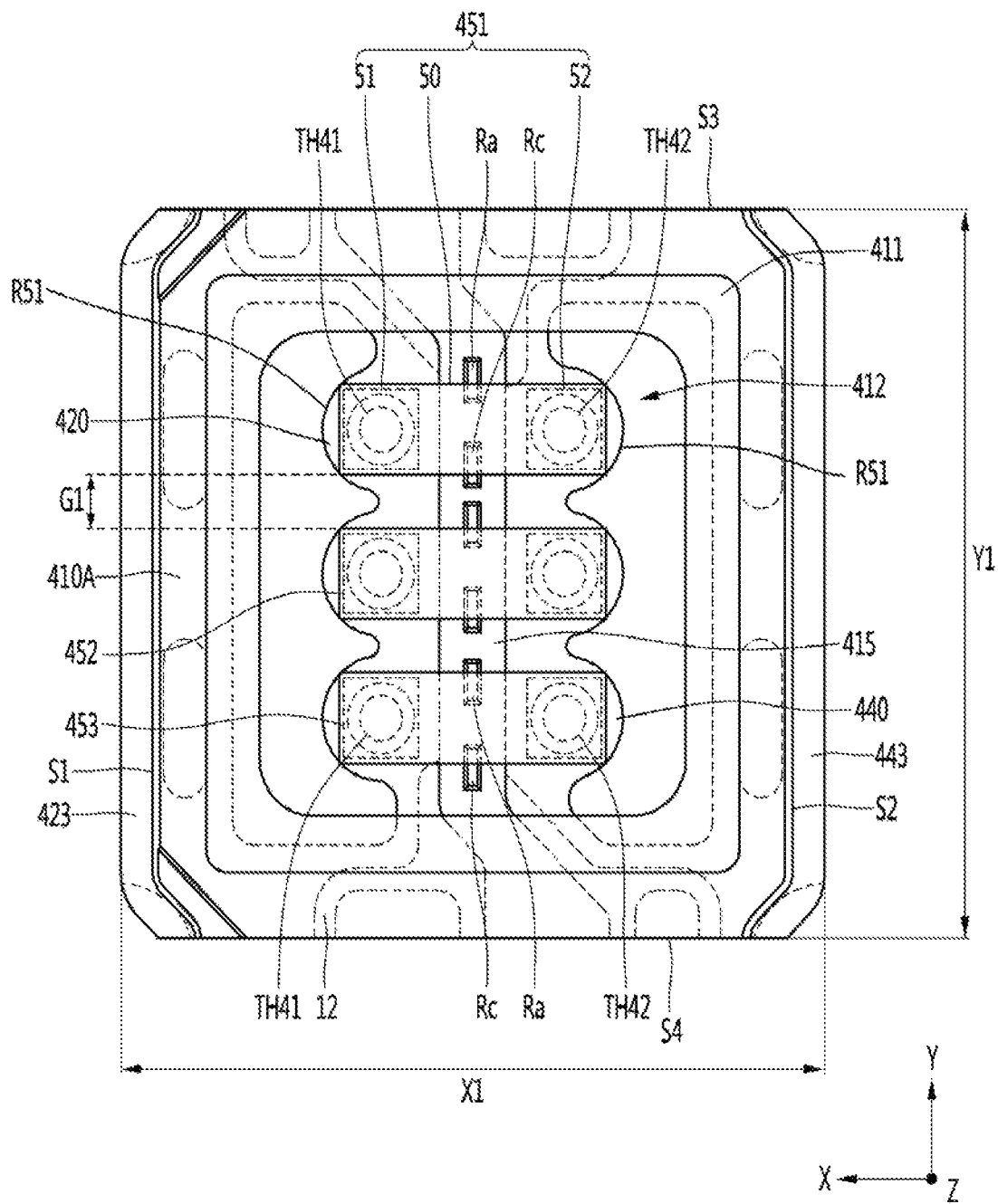
FIG. 28a is a plan view of a light emitting device package according to a fourth embodiment.
Figure 28B:
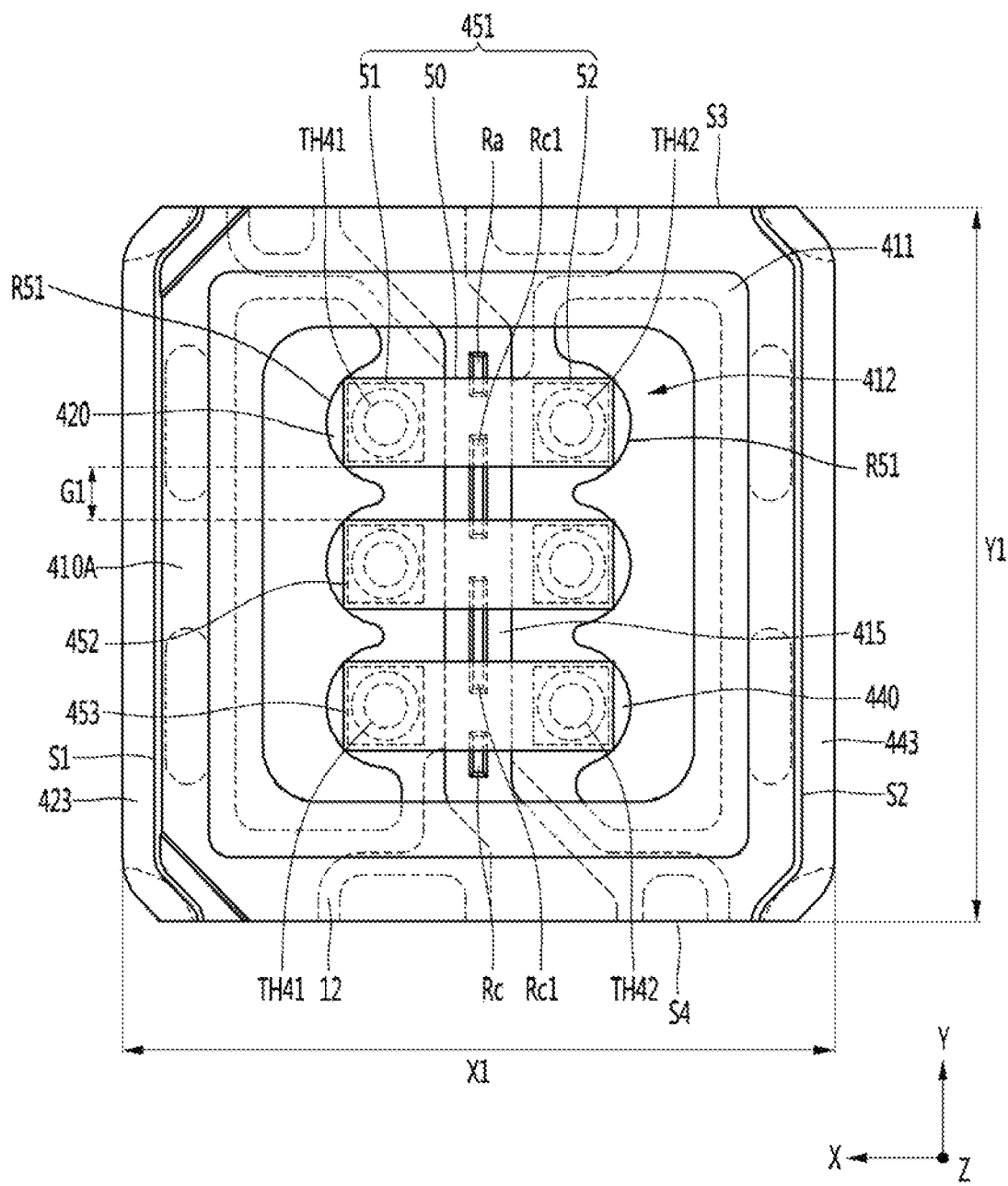

As another example, FIG. 16b shows a structure where a recess is omitted from the body, but the recesses Ra, Re, and Rc1 as shown in FIG. 28b may be applied to the present embodiment(s) in the structure as shown in FIG. 16a. For example, at least one of the recesses Ra, Rc, and Rc1 may have a longer length. For example, at least one (Rc1) of the recesses Ra, Rc, and Rc1 may have a length that allows the recess Rc1 to at least partially overlap with two adjacent light emitting devices. The recesses Ra, Rc, and Rc1 may include one or at least two recesses having a relatively long length. The configuration for the long recess or the recess at least partially overlapping with two adjacent light emitting devices may be applied to the embodiment(s) of the present invention.

<Second Embodiment>

Figure 17:
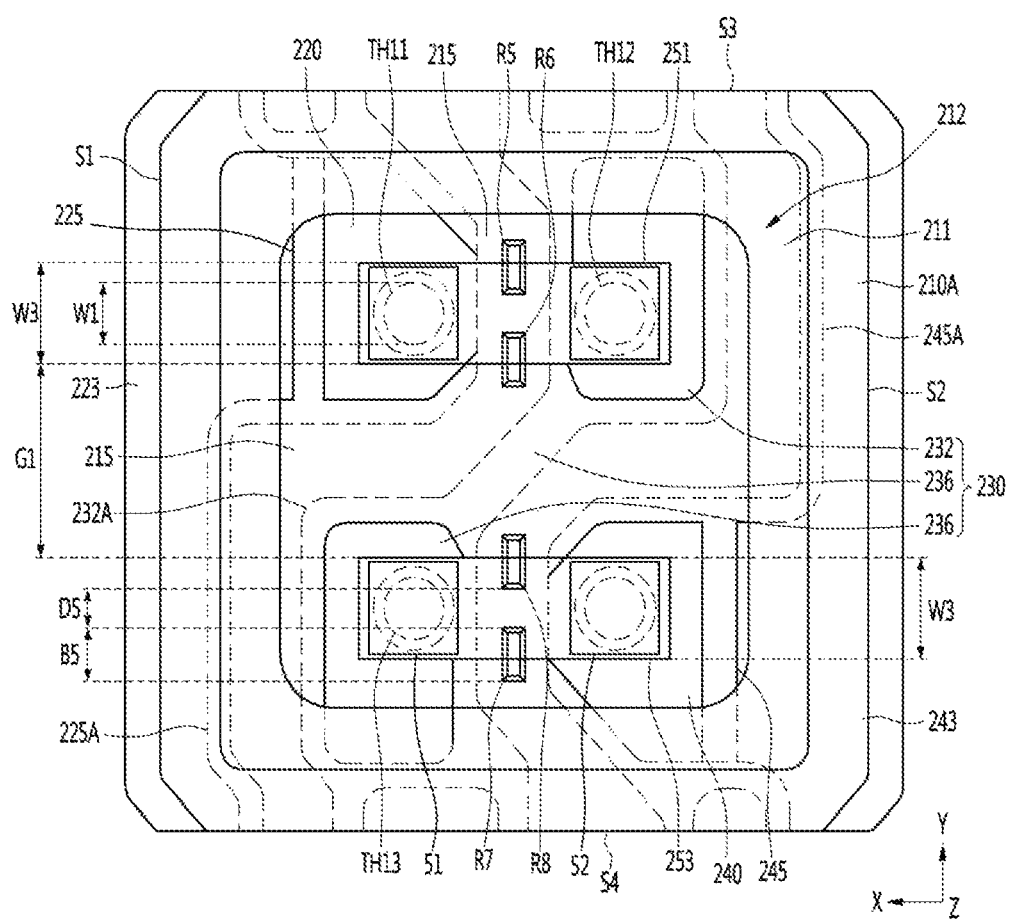
FIG. 17 is a plan view of a light emitting device package according to a second embodiment.
Figure 18:
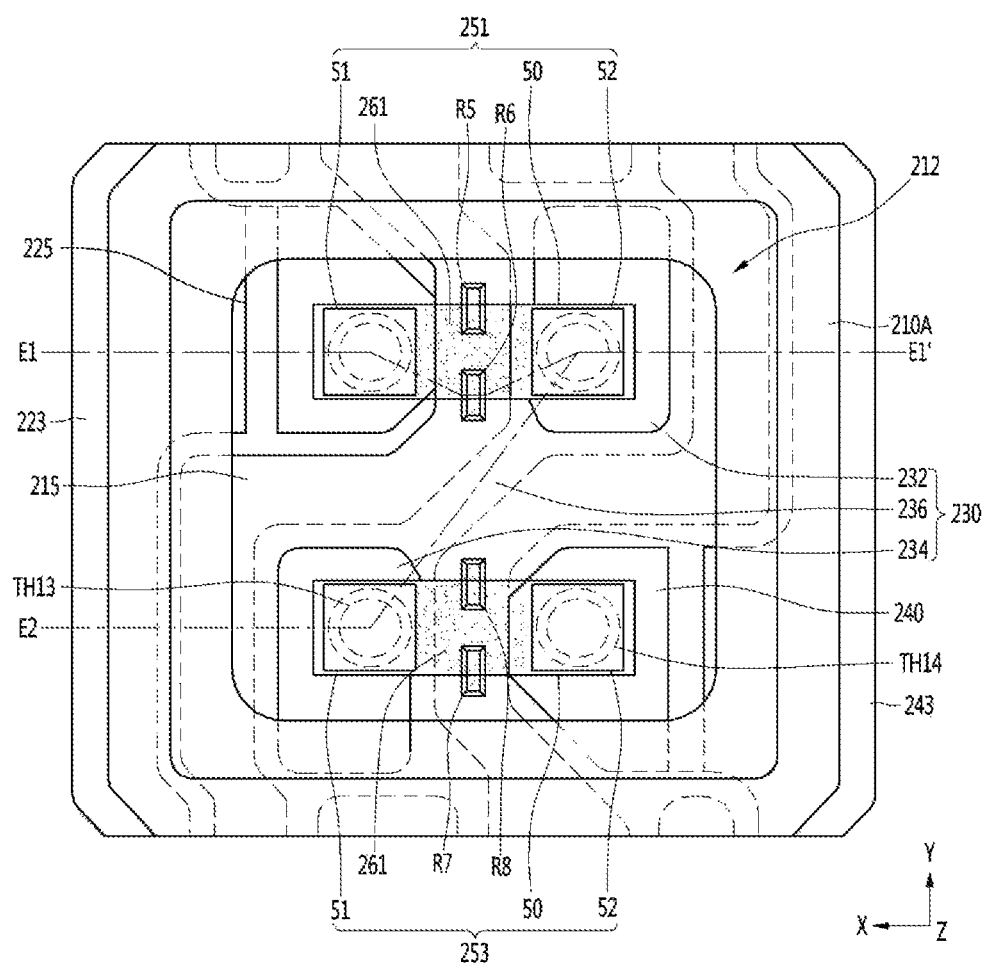
FIG. 18 shows an example in which a first resin is disposed between a light emitting device and a body shown in FIG. 17.
Figure 19:
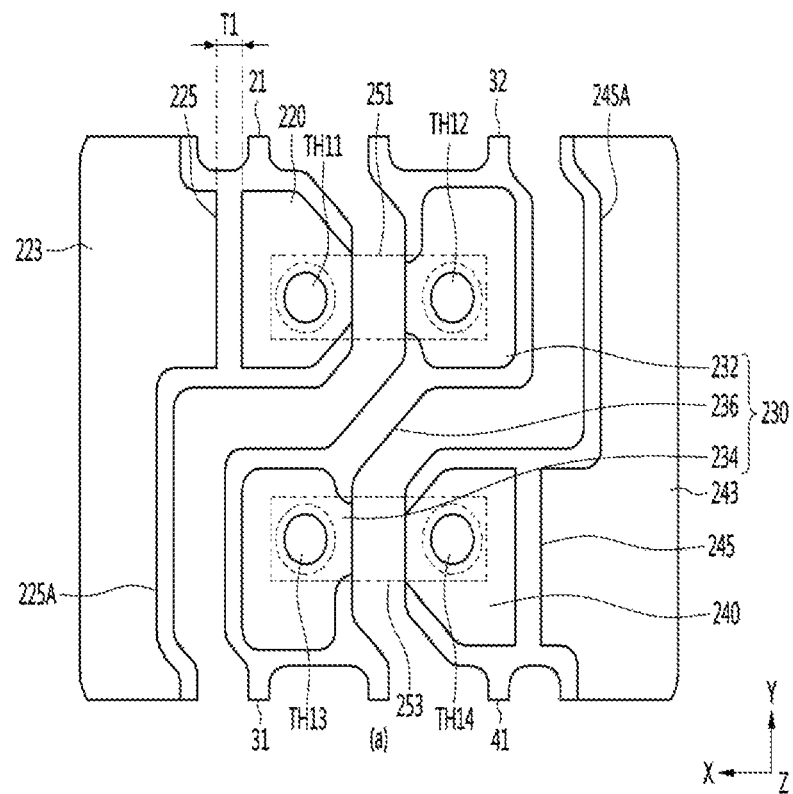
FIGS. 19(a) and 19(b) are a front view and a rear view showing a frame of the light emitting device package shown in FIG. 17, respectively.
Figure 19:
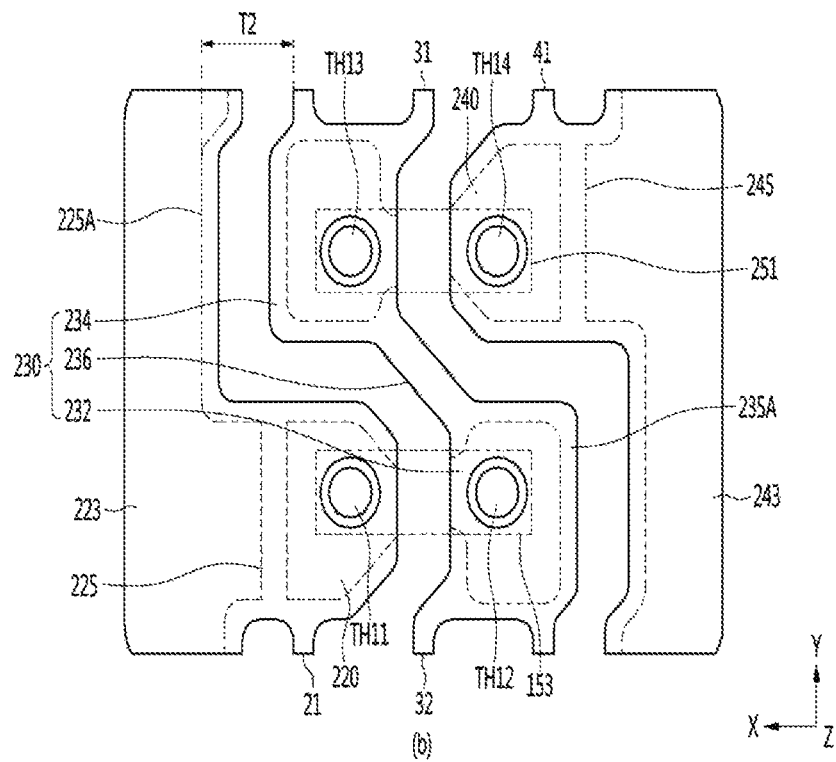
Figure 20:
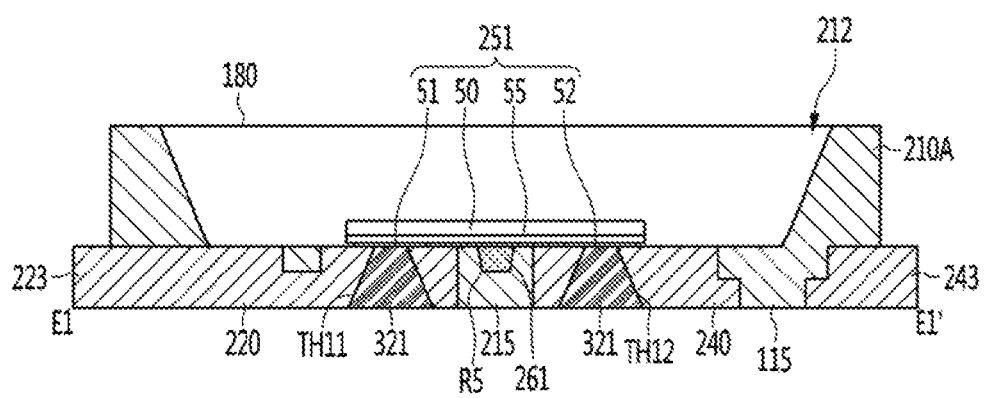
FIG. 20 is a sectional view showing the light emitting device package taken along line E1-E1' of FIG. 18.
Figure 21:
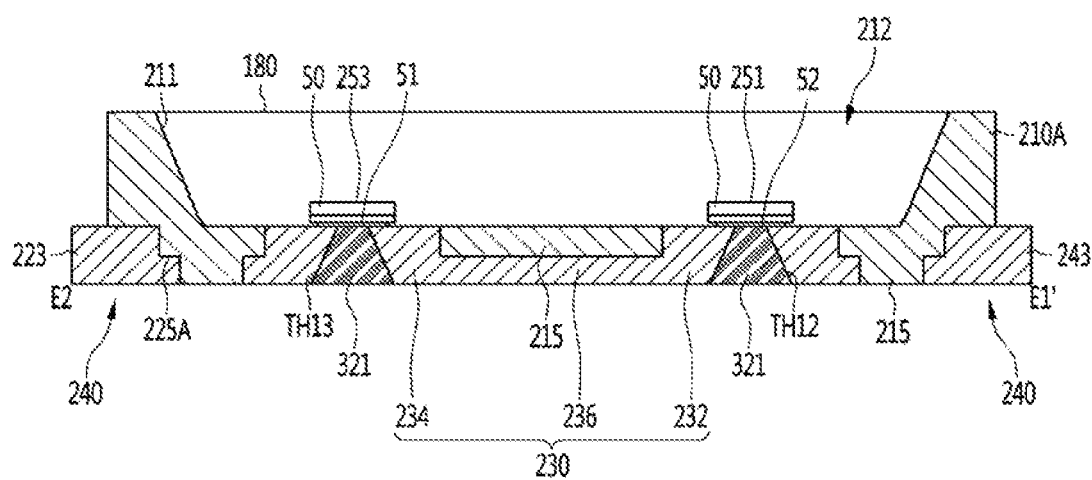
FIG. 21 is a sectional view showing the light emitting device package taken along line E2-E1' of FIG. 18.
Figure 22:
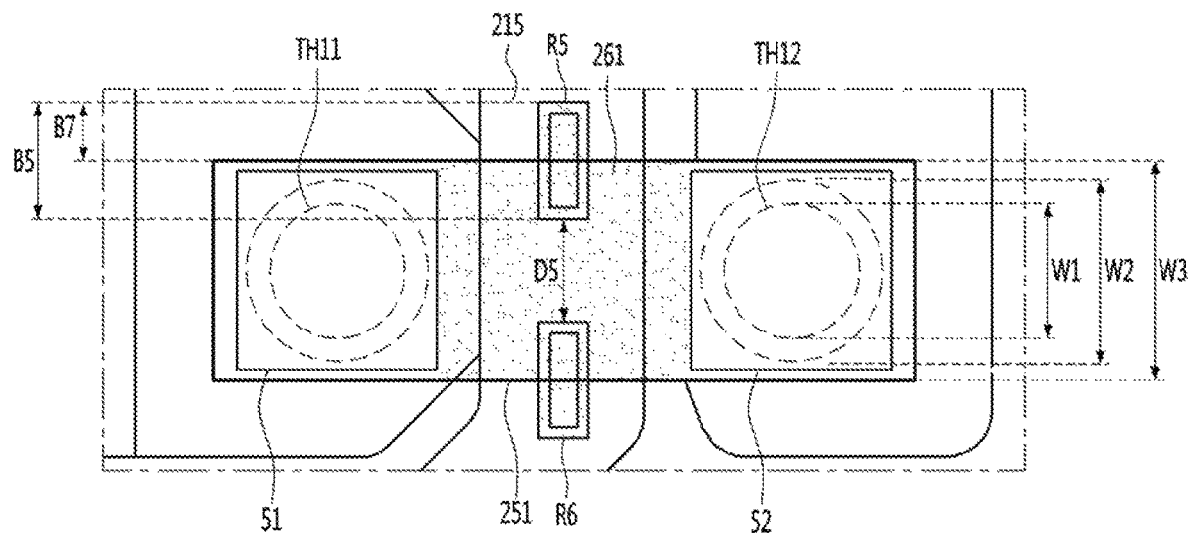
FIG. 22 is a view for describing a recess of the light emitting device package shown in FIG. 18.

FIGS. 17 to 26 are views showing a second embodiment. FIG. 17 is a plan view of a light emitting device package according to the second embodiment, FIG. 18 shows an example in which a first resin is disposed between a light emitting device and a body shown in FIG. 17, FIGS. 19(a) and 19(b) are a front view and a rear view showing a frame of the light emitting device package shown in FIG. 17, respectively, FIG. 20 is a sectional view showing the light emitting device package taken along line E1-E1' of FIG. 18, FIG. 21 is a sectional view showing the light emitting device package taken along line E2-E1' of FIG. 18, FIG. 22 is a view for describing a recess of the light emitting device package shown in FIG. 18, and FIGS. 23 to 26 show modification examples of the recess shown in FIG. 22. Upon describing the second embodiment, the same parts as those of the first embodiment may include the description and the configuration of the first embodiment, and the parts different from those of the first embodiment will be described below.

Referring to FIGS. 17 to 26, according to an embodiment, the semiconductor device package or the light emitting device package includes a plurality of frames 220, 230, and 240 spaced apart from each other, a body 215 for supporting between the frames 220, 230, and 240, and a plurality of semiconductor devices or a plurality of light emitting devices 251 and 153 disposed on the frames 220, 230, and 240. According to an embodiment, the light emitting devices 251 and 253 may be arranged to be driven individually, or may be connected to each other so as to be driven in series or in parallel. The light emitting device package may change or switch a driving voltage according to the number of connected light emitting devices 251 and 253. In addition, at least one or all of the light emitting devices 251 and 253 may include one or a plurality of light emitting cells. The light emitting cell may include at least one of an n-p junction, a p-n junction, an n-p-n junction, and a p-n-p junction. The light emitting cells may be connected to each other in series in one light emitting device. Accordingly, each of the light emitting devices 251 and 253 may have one or a plurality of light emitting cells, and may be driven with a driving voltage of n times if n light emitting cells are disposed in one light emitting device. For example, if the driving voltage of one light emitting cell is 3V and two light emitting cells are disposed in one light emitting device, each light emitting device may be driven with a driving voltage of 6V. Alternatively, if the driving voltage of one light emitting cell is 3V and three light emitting cells are disposed in one light emitting device, each light emitting device may be driven with a driving voltage of 9V. The number of light emitting cells disposed in one of the light emitting devices may be one, or two to five. Accordingly, if the light emitting devices are connected to each other in series, the driving voltage of the light emitting device package may be obtained by multiplying the total number of light emitting devices, the total number of light emitting cells, and the driving voltage.

The length of the light emitting device package in the first direction may be equal to or different from the length of the light emitting device package in the second direction. The length of the light emitting device package in the first direction may be at least 2.5 mm, for example, in a range of 2.5 mm to 7 mm. The length in the second direction may be equal to or larger than the length in the first direction. The thickness of the light emitting device package may be smaller than the lengths in the first and second directions.

A length of a package body 210A in the first direction may be equal to or different from a length of the package body 210A in the second direction. The first direction may be the X direction, the second direction may be the Y direction orthogonal to the X direction, and the third direction may be the Z direction orthogonal to the X and Y directions, but embodiments are not limited thereto. A length of the package body 210A in the X direction may be equal to or different from a length of the package body 210A in the Y direction. If the length in the X direction is shorter than the length in the Y direction, widths of the light emitting devices 251 and 253 in the X direction may be reduced to improve the brightness. If the length in the Y direction is shorter than the length in the X direction, lengths of the light emitting devices 251 and 253 in the Y direction may be reduced.

The package body 210A may include first and second side parts S1 and S2 opposite to each other, and third and fourth side parts S3 and S4 opposite to each other. The first and second side parts S1 and S2 may have long lengths in the Y direction, and may be connected to both ends of the third and fourth side parts S3 and S4. The first to fourth side parts S1, S2, S3, and S4 may be formed as a surface perpendicular or inclined to the bottom of the body 115.

The package body 210A may be coupled to the body 215. The body 215 may be disposed between the frames 220, 230, and 240. The body 215 may be formed integrally with or separately from the package body 210A. The body 215 may be coupled to the frames 220, 230, and 240 to support the frames 220, 230, and 240. The package body 210A and the body 215 may be formed of the same material or mutually different materials.

The package body 210A may be disposed on the body 215, and may cover peripheries of the light emitting devices 251 and 253. The package body 210A may be formed therein with a cavity 212, and the light emitting devices 251 and 253 may be disposed in the cavity 212. The cavity 212 may be open at a top or at a light emission region, and may reflect light at the peripheries of the light emitting devices 251 and 253.

A top view shape of the package body 210A may be a polygonal shape, a circular shape, or an elliptical shape, and the polygonal shape may be a rectangular shape or a square shape. A top view shape of the cavity 212 may be a polygonal shape, a circular shape, or an elliptical shape, and the polygonal shape may be a rectangular shape or a square shape.

As shown in FIGS. 17 and 18, a first extension part 223 of a first frame 220 may extend to the first side part S1 of the package body 210A, and the second extension part 243 of the third frame 240 may extend to the second side part S2 of the package body 210A. The second frame 230 may include a first frame part 232, a second frame part 234, and a connection frame part 236. The first frame part 232 may be disposed in a region corresponding to the first frame 220, and the second frame part 234 may be disposed in a region corresponding to the third frame 240. The connection frame part 236 may be connected between the first and second frame parts 232 and 234.

As another example, the connection frame part 236 may have a through-hole, in which a conductive layer may be filled in the through-hole, or the connection frame part 236 may be provided without the conductive layer. In this case, a plurality of light emitting devices may be connected to each other in series or in parallel depending on the formation of the conductive layer in the through-hole of the connection frame part.

The first light emitting device 251 may be disposed on the first frame 220 and the first frame part 232 of the second frame 230, and the first and second bonding parts 51 and 52 of the first light emitting device 251 may be electrically connected to the first frame 220 and the first frame part 232. The conductive layer 321 may be provided in the first through-hole TH11 of the first frame 220, and the second through-hole TH12 formed in the first frame part 232 of the second frame 230. The conductive layer 321 disposed in the first and second through-holes TH11 and TH12 may make contact with and may be electrically connected to the first and second bonding parts 51 and 52 of the first light emitting device 251.

The second light emitting device 253 may be disposed on the second frame part 234 of the second frame 230 and the third frame 240, and the first and second bonding parts 51 and 52 of the second light emitting device 253 may be electrically connected to the second frame part 234 of the second frame 230 and the third frame 240. The conductive layer 321 may be provided in the third through-hole TH13 formed in the second frame part 234 of the second frame 230, and the fourth through-hole TH14 formed in the third frame 240. The conductive layer 321 disposed in the third and fourth through-holes TH13 and TH14 may make contact with and may be electrically connected to the first and second bonding parts 51 and 52 of the second light emitting device 253.

Each of the frames 220, 230, and 240 and the bonding parts 51 and 52 may be coupled to each other by an intermetallic compound layer. An intermetallic compound may include at least one of $Cu_xSn_y$, $Ag_xSn_y$, and $Au_xSn_y$, wherein x may satisfy the condition of $0<x<1$, $y=1-x$, and $x>y$.

The bonding parts 51 and 52 of the light emitting devices 251 and 253 may be formed with the intermetallic compound layer between the conductive layer 321 and the frames 220, 230 and 240 in the process of forming material constituting the conductive layer 321 and the conductive layer 321 or in a heat treatment process after providing the conductive layer 321. The conductive layer 321 may include one selected from the group consisting of Ag, Au, Pt, Sn, Cu and the like, or the alloy thereof. However, the embodiment is not limited to above and a material capable of securing a conductive function may be used for the conductive layer 321. For example, the conductive layer 321 may be formed by using conductive paste. The conductive paste may include solder paste, silver paste, or the like, and may be composed of a multi-layer or a single layer composed of a multi-layer or an alloy composed of mutually different materials. For example, the conductive layer 321 may include an SAC (Sn—Ag—Cu) or SAC based-material.

For example, an alloy layer may be formed by combining the material constituting the conductive layer 321 and the metals of the frames 220, 230 and 240. Thus, the conductive layer 321 and the frames 220, 230 and 240 may be coupled to each other to be physically or electrically stable. In addition, the conductive layer 321, the alloy layer and the frame may be coupled to each other to be physically or electrically stable. The alloy layer may include at least one intermetallic compound layer selected from the group consisting of AgSn, CuSn, and AuSn. The intermetallic compound layer may be formed by combining first and second materials, where the first material may be provided from the conductive layer 321 and the second material may be provided from the bonding parts 51 and 52 or the frames 220, 230 and 240.

The intermetallic compound layer described above may have a higher melting point than other bonding materials. In addition, the heat treatment process in which the metal compound layer is formed may be performed at a lower temperature than the melting point of a general bonding material. Therefore, even when the light emitting device package according to an embodiment is bonded to a main substrate through a reflow process, since re-melting phenomenon does not occur, the electrical connection and physical bonding force are not deteriorated.

In addition, according to the light emitting device package and the light emitting device package manufacturing method of an embodiment, the package body 210A does not need to be exposed to a high temperature in the process of manufacturing a light emitting device package. Therefore, according to the embodiment, the package body 210A may be prevented from being exposed to high temperatures to be damaged or discolored. Accordingly, the selection range for the material constituting the body 215 may be widened. According to an embodiment, the body 215 may be provided by using a relatively inexpensive resin material as well as an expensive material such as ceramic.

As shown in FIGS. 19(a) and 19(b), the first to third frames 220, 230, and 240 may have protrusions 21, 31, 32, and 41 protruding outward. The protrusions 21, 31, 32, and 41 may enhance the coupling between the first to third frames 220, 230, and 240 and the body 115. The first to third frames 220, 230, and 240 may have step difference structures 225A, 232A, and 245A. The step difference structure may allow a region where the light emitting devices 251 and 253 are disposed to be provided in an island shape, and may enhance the coupling between the first to third frames 220, 230, and 240 and the body 115.

On upper surfaces of the frames 220, 230, and 240, a minimum interval T2 between the upper surface of the first extension part 223 of the first frame 220 and the upper surface of the second frame 230 may be narrower than an interval between the upper surface of the first frame 220 and the upper surface of the first frame part 132 of the second frame 230. Such an interval is ensured, so that when the light emitting device package is bonded onto the circuit board, the electrical interference due to the diffusion of a solder paste may be prevented. Upper recesses 225 and 245 between the upper surfaces of the first and third frames 220 and 240 and the upper surfaces of the first and second extension parts 223 and 243 may be provided in an island shape, and may be coupled to a resin part. The upper recesses 225 and 245 may be exposed to the bottom of the cavity, and have a width of 50 micrometers or more, for example, in a range of 50 to 150 micrometers, thereby preventing a substance such as a paste from moving to a side surface of the cavity.

As shown in FIGS. 17 and 19, the first frame 220 may be concavely formed at an upper portion thereof with a first upper recess 225, and the first upper recess 225 may be arranged between the bonding region where the first light emitting device 251 is disposed and the first extension part 223 in the second direction. The fourth frame 240 may be concavely formed at an upper portion thereof with a second upper recess 245, and the second upper recess 245 may be arranged between the bonding region where the second light emitting device 253 is disposed and the second extension part 243 in the second direction. The first and second upper recesses 225 and 245 of the first and third frames 220 and 240 may partially overlap with the bottom of the cavity 212 in the Z direction. The first and second upper recesses 225 and 245 of the first and third frames 220 and 240 may be coupled to a resin part, for example, a portion of the body 115. Accordingly, the efficiency of reflection performed by the resin part in the cavity bottom 212 may be improved.

As shown in FIGS. 18, 20 and 21, the body 215 may include recesses R5, R6, R7, and R8. The recesses R5, R6, R7, and R8 may be formed in an upper portion of the body 215. The recesses R5, R6, R7, and R8 may be spaced apart from each other. The recesses R5, R6, R7, and R8 may be arranged in the second direction, and may be arranged in a direction identical to the direction in which the light emitting devices 251 and 253 are arranged. The recesses R5, R6, R7, and R8 may overlap with the bottom of the cavity 212 in the vertical direction or the third direction. The recesses R5, R6, R7, and R8 may be arranged at the bottom of the cavity 212.

The recesses R5, R6, R7, and R8 may include a first recess R5 and a second recess R6 under the first light emitting device 251, and a third recess R7 and a fourth recess R8 under the second light emitting device 253. The lengths B5 of the recesses R5, R6, R7, and R8 in the second direction may be larger than the width of the recesses R5, R6, R7, and R8 in the first direction. The first and second recesses R5 and R6 may be arranged between the first frame 220 and a first frame part 232 of the second frame 230, and the third and fourth recesses R7 and R8 may be arranged between a second frame part 234 of the second frame 230 and the third frame 240. The second and fourth recesses R6 and R8 may be spaced apart from each other on both sides of the connection frame part 236. In other words, the connection frame part 236 may be disposed between the second and fourth recesses R6 and R8.

The first and second recesses R5 and R6 may be disposed between the first and second through-holes TH11 and TH12, and the third and fourth recesses R7 and R8 may be disposed between the third and fourth through-holes TH13 and TH14. A distance D5 between the first and second recesses R5 and R6 and the distance D5 between the third and fourth recesses R7 and R8 may be smaller than a width W3 of the light emitting devices 251 and 253. The distance D5 may be equal to or smaller than an upper width W1 of the through-holes TH11, TH12, TH13, and TH14, and may be larger than a half of the upper width W1. In other words, the distance D5 may be in a range of 50% to 100% of W1. The recesses R5, R6, R7, and R8 disposed under the light emitting devices 251 and 253 are spaced apart from each other by a predetermined distance D5, so that the thickness of the body 215 disposed under central sides of each of the light emitting devices 251 and 253 may not be reduced, thereby reducing the optical loss due to the light leaking through the recesses R5, R6, R7, and R8 of the body 215.

The length B5 of each of the recesses R5, R6, R7, and R8 in the second direction (Y) may be smaller than the width W3 of the light emitting devices 251 and 253. The length B5 of each of the recesses R5, R6, R7, and R8 is smaller than the width W3 of the light emitting elements 251 and 253, thereby reducing the optical loss through regions of the recesses R5, R6, R7, and R8. If the light emitting devices 251 and 253 are mounted as flip chips, the light may be transmitted through the lower portions of the light emitting devices 251 and 253, and radiated toward the bottom of the cavity. The light radiated toward the bottom of the cavity may leak through the recesses R5, R6, R7, and R8, which are regions where the body is relatively thin. Embodiments may reduce the size of the recesses R5, R6, R7, and R8 to reduce the optical loss due to the light leakage.

A width of each of the recesses R5, R6, R7, and R8 in the second direction may be smaller than the length B5 of each of the recesses R5, R6, R7, and R8 in the second direction. The width of each of the recesses R5, R6, R7, and R8 in the second direction may be smaller than an interval between two frames adjacent to each other in the X direction, and may be, for example, 70% or less of the interval between two frames adjacent to each other in the X direction. If the width of each of the recesses R5, R6, R7, and R8 is equal to or less than the above-mentioned range, the rigidity of the body 215 may be prevented from being reduced, and the optical loss through the recesses R5, R6, R7, and R8 may be reduced. The width of the recesses R5, R6, R7, and R8 in the X direction may be 30% or more of the interval between two frames 220, 230, and 240 adjacent to each other in the X direction, for example, in a range of 30% to 70% of the interval, thereby preventing the rigidity of the body 215 disposed between the frames 220, 230, and 240 from being reduced, and preventing the adhesive strength due to the first resin from being reduced.

The recesses R5, R6, R7, and R8 may be concavely formed in a direction from the upper surface to the lower surface of the body 215. The depths of the recesses R5, R6, R7, and R8 may be smaller than the depths of the through-holes TH11, TH12, TH13, and TH14. The depth of the recesses R5, R6, R7, and R8 may be 40% or more of the thickness of the body 215, for example, in a range of 40% to 60% of the thickness of the body 215. If the depths of the recesses R5, R6, R7, and R8 are smaller than the above-mentioned range, an amount of the first resin 261 may be reduced, so that the supporting strength for supporting the light emitting devices 251 and 253 may be rarely improved.

The depths of the recesses R5, R6, R7, and R8 may be determined in consideration of the adhesive strength of the first resin 261. In addition, the depths of the recesses R5, R6, R7, and R8 may be determined in consideration of the stable strength of the body 215 and/or preventing a crack from being generated in the light emitting device package due to the heat emitted from the light emitting devices 251 and 253.

The recesses R5, R6, R7, and R8 may be disposed under the light emitting devices 251 and 253 as plural recesses. The recesses R5, R6, R7, and R8 may be spaced apart from each other in the Y direction by a predetermined distance D5 under the light emitting devices 251 and 253. In this case, a distance between the second and fourth recesses R6 and R8 disposed under mutually different light emitting devices 251 and 253 may be smaller than an interval G1 between the light emitting devices 251 and 253.

The inner portions of the recesses R5, R6, R7, and R8 may overlap with each of the light emitting devices 251 and 253 in the vertical direction or the third direction. The outer portions of the recesses R5, R6, R7, and R8 may not overlap with each of the light emitting devices 251 and 253 in the vertical direction or the third direction. The ratio of the inner portion to the outer portion of the recesses R5, R6, R7, and R8 may be 4:6 to 6:4.

Referring to FIG. 22, the length B7 of the outer portions of the recesses R5, R6, R7, and R8 may be in a range of 40% to 60% of the length B5 of the recesses R5, R6, R7, and R8. The outer portions of the recesses R5, R6, R7, and R8 protrude outward of the light emitting devices 251 and 253 so as to be spaced apart from a center region of the light emitting devices 251 and 253, thereby reducing the optical loss through the center region of the light emitting devices 251 and 253.

As shown in FIGS. 18 and 22, according to an embodiment, the light emitting device package may include the first resin 261. The first resin 261 may be disposed between the body 215 and the light emitting devices 251 and 253. The first resin 261 may be disposed between the lower surface of the body 215 and the lower surface of the light emitting devices 251 and 253. The first resin 261 may overlap with the light emitting devices 251 and 253 in the vertical direction or the third direction. The first resin 261 may be adhered to the light emitting devices 251 and 253 and the body 215. The first resin 261 may be disposed between the bonding parts 51 and 52 of the light emitting devices 251 and 253. The first resin 261 disposed in the first recess R1 may be disposed between the first and second bonding parts 51 and 52 while making contact with the lower surface of the first light emitting device 251 and the first and second bonding parts 51 and 52. The first resin 261 disposed in the second recess R2 may be disposed between the lower surface of the second light emitting device 252 and the first and second bonding parts 51 and 52 while making contact with the first and second bonding parts 51 and 52. The first resin 261 disposed in the third recess R3 may be disposed between the lower surface of the third light emitting device 253 and the first and second bonding parts 51 and 52 while making contact with the first and second bonding parts 51 and 52.

The recesses R5, R6, R7, and R8 are spaced apart from each other by a predetermined distance (D5<W3) under the light emitting devices 251 and 253, so that the first resin 261 may be disposed in the recesses R5, R6, R7, and R8 and may adhere the light emitting devices 251 and 253 to the body 215. Accordingly, each of the light emitting devices 251 and 253 may be supported by the first resin 261 coupled to the recesses R5, R6, R7, and R8, and may be adhered to and supported by the first resin 261.

For example, the depths of the recesses R5, R6, R7, and R8 are determined in consideration of an injection molding process thickness capable of providing crack free to the body 215. According to an embodiment, the ratio of the depths of the recesses R5, R6, R7, and R8 to the depths of the through-holes TH11, TH12, TH13, and TH14 may be in a range of 2 to 10. For example, when the depths of the through-holes TH11, TH12, TH13, and TH14 are 200 micrometers, the depth of the recesses R5, R6, R7, and R8 may be 20 micrometers to 100 micrometers.

The recesses R5, R6, R7, and R8 may provide a space suitable for performing an under fill process at lower portions of the light emitting devices 251 and 253. The under fill process may be a process of disposing the first resin 261 at the lower portions of the light emitting devices 251 and 253 after mounting the light emitting devices 251 and 253 on the body 215, or a process of disposing the light emitting devices 251 and 253 after disposing the first resin 261 in the recesses R5, R6, R7, and R8 to mount the light emitting devices 251 and 253 on the body 215 through the first resin 261 during a process of mounting the light emitting devices 251 and 253 on the body 215. The recesses R5, R6, R7, and R8 may have a predetermined depth or more to sufficiently provide the first resin 261 between the lower surfaces of the light emitting devices 251 and 253 and the upper surface of the body 215. In addition, the recesses R5, R6, R7, and R8 may have a predetermined depth to provide the stable strength to the body 215. As one example, the depths of the recesses R5, R6, R7, and R8 may be 40 micrometers or more, for example, in a range of 40 to 60 micrometers. The widths of the recesses R5, R6, R7, and R8 may be 140 micrometers or more, for example, in a range of 140 to 160 micrometers.

The first resin 261 may be disposed in each of the recesses R5, R6, R7, and R8 so as to provide the stable fixing strength between the light emitting devices 251 and 253 and the body 215. For example, the first resin 261 may make direct contact with the upper surface of the body 215. The first resin 261 may make direct contact with the lower surface of the light emitting devices 251 and 253.

For example, the first resin 261 may include at least one of an epoxy-based material, a silicone-based material, and a hybrid material including the epoxy-based material and the silicon-based material. In addition, for example, when the first resin 261 includes a reflection function, the first resin 261 may include a metal oxide such as white silicone. The first resin 261 may be formed of a material different from a material of a molding part, or may contain an impurity (for example, a metal oxide) different from an impurity (for example, a fluorescent substance) that may be added to the molding part. The first resin 261 may be an adhesive. The first resin 261 may be an adhesive formed of a reflective material.

If the light is emitted to the lower surface of the light emitting devices 251 and 253, the first resin 261 may provide a light diffusion function between the light emitting devices 251 and 253 and the body 215. When the light is emitted from the light emitting devices 251 and 253 to the lower surfaces of the light emitting device 251 and 253, the first resin 261 may provide a light diffusion function, thereby improving the light extraction efficiency of the light emitting device package. In addition, the first resin 261 may reflect the light emitted from the light emitting devices 251 and 253. If the first resin 261 includes a reflection function, the first resin 261 may be composed of a material including a metal oxide such as TiO2, silicone or A1203, or an impurity.

The first resin 261 may be disposed in outer portions of the recesses R5, R6, R7, and R8, for example, a portion protruding outward than the side surfaces of the light emitting devices 251 and 253. When the first resin 261 is disposed in the outer portions of the recesses R5, R6, R7, and R8, the coupling with the molding part 180 may be enhanced, and light exposed at the side surfaces of the light emitting devices 251 and 253 may be reflected.

Figure 23:
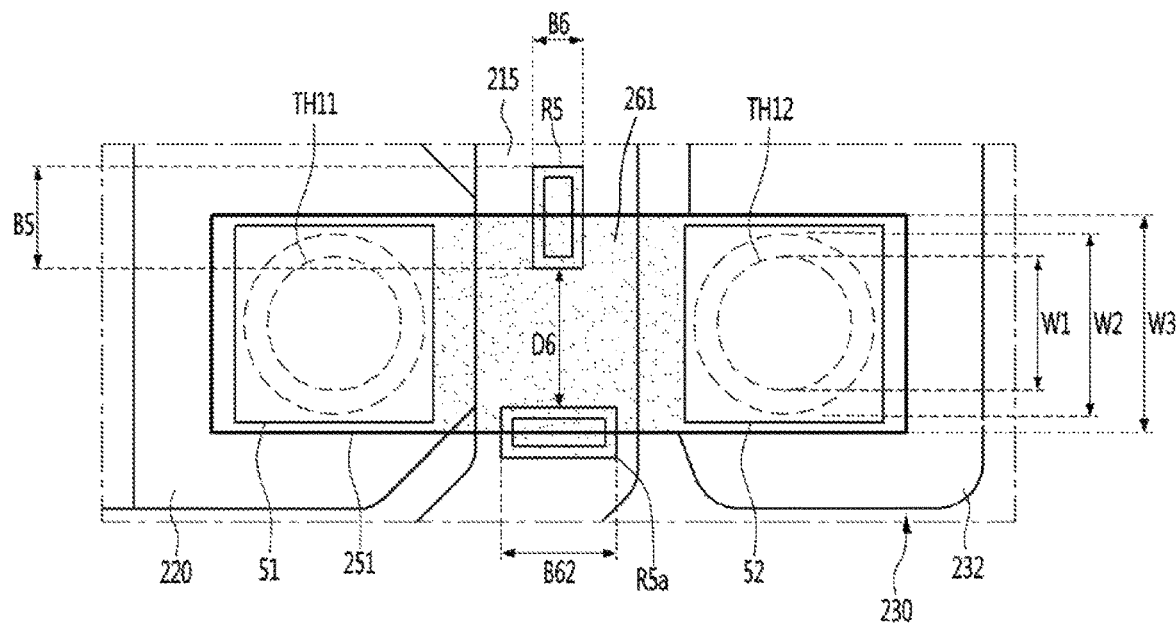
FIGS. 23 to 26 show modification examples of the recess shown in FIG. 22.

Referring to FIGS. 18 and 23, a plurality of recesses R5 and R5a may be concavely formed at the upper portion of the body 215 under the light emitting device 251. A first recess R5 among the recesses R5 and R5a may have a length B5 in the second direction larger than a width B6 in the first direction, and a second recess R5a may have a length in the second direction smaller than a width B62 in the first direction. Inner portions of the second recess R5a and the first recess R5 may overlap with the light emitting device 251 in the third direction, and outer portions of the second recess R5a and the first recess R5 may protrude outward without overlapping with the light emitting device 251 in the third direction.

A distance D6 between the first and second recesses R5 and R5a may be 50% or more of the width W3 of the light emitting device 251, the first resin 261 may be disposed in the first and second recesses R5 and R5a, and the first resin 261 may adhere the body 215 to the light emitting device 251. In other words, the first resin 261 may be diffused and filled in the first and second recesses R5 and R6 in a process of dispensing the first resin 261 and bonding the light emitting device 251 by pressing the light emitting device 251.

Figure 24:
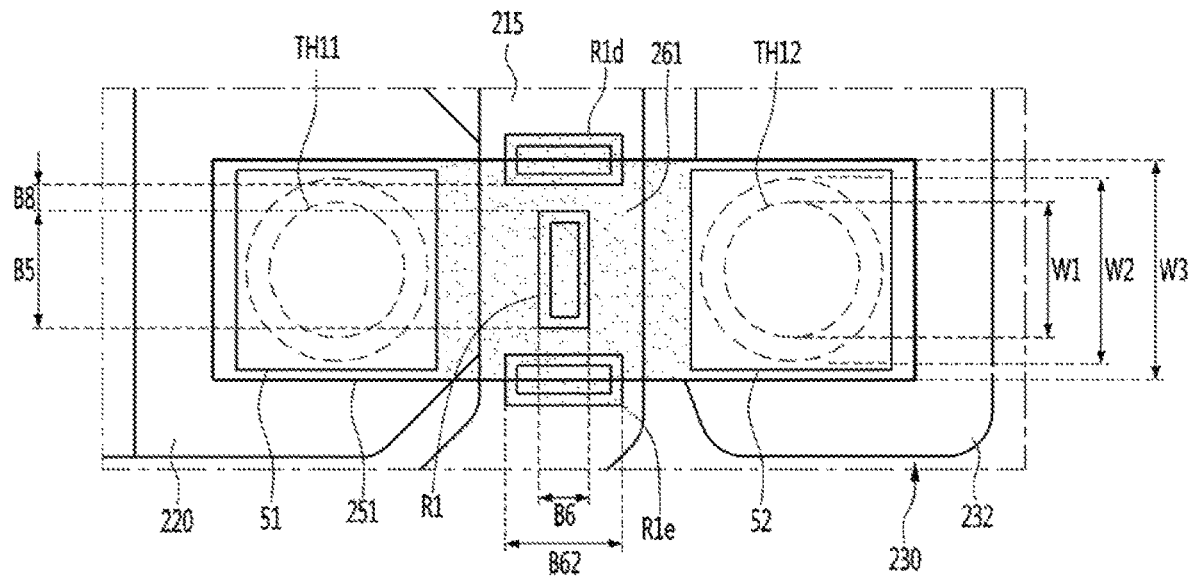

Referring to FIG. 24, three recesses RI, Rid, and Rle may be arranged under the light emitting device 251, and the three recesses R1, Rld, and Rte may have lengths in which at least one length B5 is longer than another length. An interval B8 between adjacent recesses R1, R1d, and R1e may be smaller or larger than the length B5, but embodiments are not limited thereto. The interval B8 may be 50 micrometers or more, for example, in a range of 50 to 200 micrometers, thereby preventing the rigidity of the body 215 from being reduced due to the integration of two adjacent recesses.

A size or area of the recess R1 at a center among the three recesses R1, R1d, and R1e may be smaller than a size or area of other recesses R1d and R1e. In this case, the optical loss in the body 215 under the center region of the light emitting device 251 may be reduced.

Figure 25:
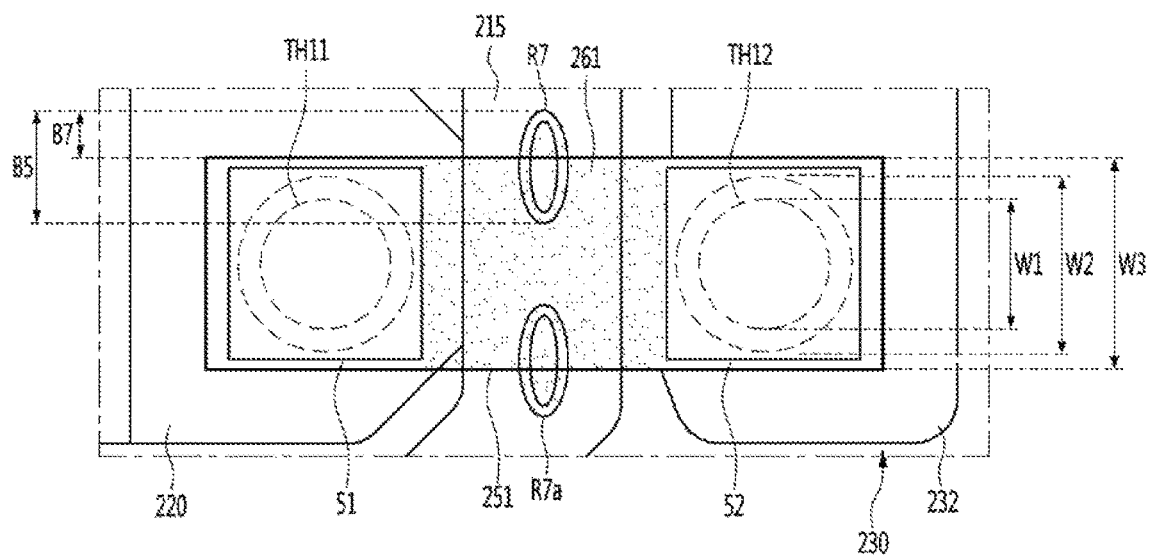

Referring to FIG. 25, a plurality of recesses R7 and R7a may be disposed under the light emitting device, and top view shapes of the recesses R7 and R7a may be an elliptical shape or a circular shape. The recesses R7 and R7a having an elliptical shape may be concavely formed in the upper portion of the body 215, and may have the length B5 in the second direction longer than the width in the first direction.

Figure 26:
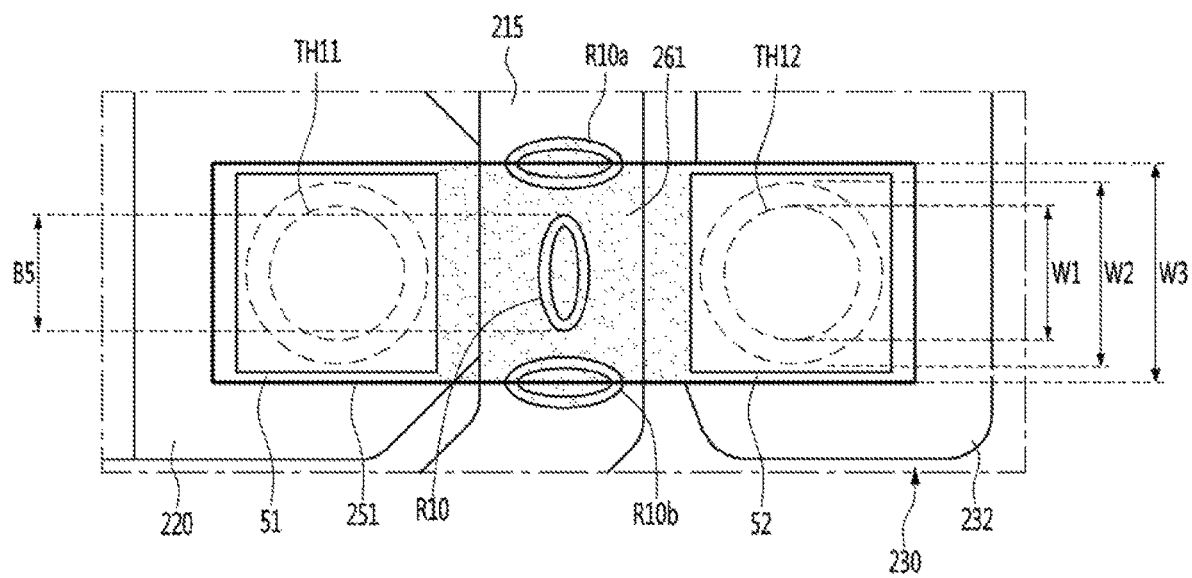

Referring to FIG. 26, three recesses R10, R10a, and R10b may be arranged under the light emitting device 251, and the three recesses R10, R10a, and R10b may have lengths in which at least one length B5 is longer than another length. An interval between adjacent recesses R10, R10a, and R10b may be smaller or larger than the length B5, and the rigidity of the body 215 may be prevented from being reduced due to the integration of two adjacent recesses.

A size or area of the recess R10 at a center among the three recesses R10, R10a, and R10b may be smaller than a size or area of other recesses R10a and R10b. In this case, the optical loss in the body 215 under the center region of the light emitting device 251 may be reduced.

Figure 27:
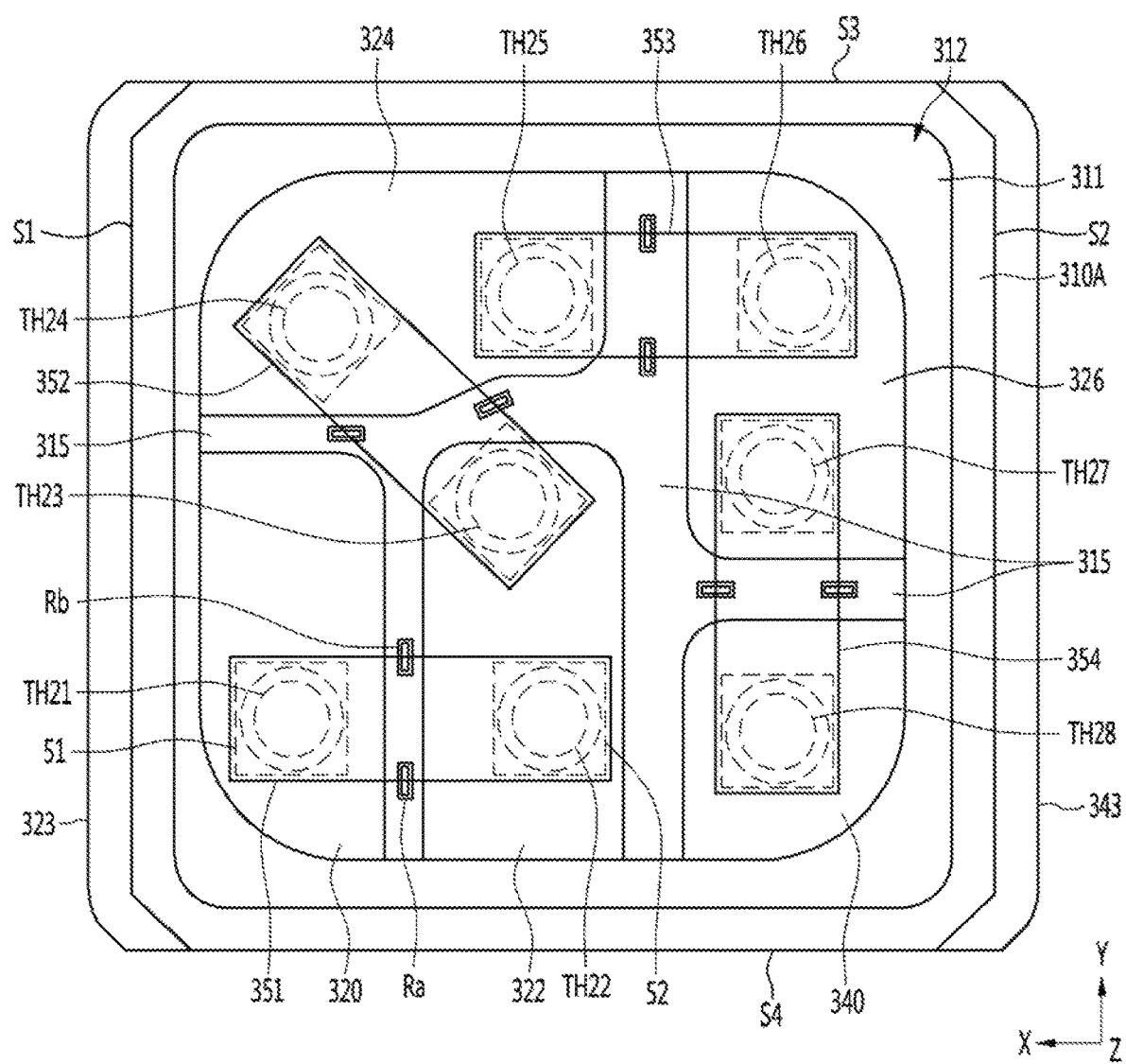
FIG. 27 is a plan view of a light emitting device package according to a third embodiment.

FIG. 27 is a plan view of a light emitting device package according to a third embodiment. Upon describing the third embodiment, a configuration identical to the configuration described above may be selectively applied, and the description about the parts the same as described above may refer to the above-mentioned description.

Referring to FIG. 27, according to an embodiment, the semiconductor device package or the light emitting device package includes a plurality of frames 320, 322, 324, 326, and 340 spaced apart from each other, a body 315 for supporting between the frames 320, 322, 324, 326, and 340, and a plurality of semiconductor devices or a plurality of light emitting devices 351, 352, 353, and 354 disposed on the frames 320, 322, 324, 326, and 340. According to an embodiment, the light emitting devices 351, 352, 353, and 354 may be arranged to be driven individually, or may be connected to each other so as to be driven in series or in parallel. For example, According to an embodiment, the light emitting devices 351, 352, 353, and 354 may be connected to each other to be driven in series by the plurality of flames 320, 322, 324, 326, and 340. The light emitting device package may change or switch a driving voltage according to the number of connected light emitting devices 351, 352, 353, and 354. In addition, at least one or all of the light emitting devices 351, 352, 353, and 354 may include one or a plurality of light emitting cells. The light emitting cell may include at least one of an n-p junction, a p-n junction, an n-p-n junction, and a p-n-p junction. The light emitting cells may be connected to each other in series in one light emitting device. Accordingly, each of the light emitting devices 351, 352, 353, and 354 may have one or a plurality of light emitting cells, and may be driven with a driving voltage of n times if n light emitting cells are disposed in one light emitting device. For example, if the driving voltage of one light emitting cell is 3V and two light emitting cells are disposed in one light emitting device, each light emitting device may be driven with a driving voltage of 6V. Alternatively, if the driving voltage of one light emitting cell is 3V and three light emitting cells are disposed in one light emitting device, each light emitting device may be driven with a driving voltage of 9V. The number of light emitting cells disposed in one of the light emitting devices may be one, or two to five. Accordingly, if the light emitting devices are connected to each other in series, the driving voltage of the light emitting device package may be obtained by multiplying the total number of light emitting devices, the total number of light emitting cells, and the driving voltage.

The length of the light emitting device package in the first direction may be equal to or different from the length of the light emitting device package in the second direction. The length of the light emitting device package in the first direction may be at least 2.5 mm, for example, in a range of 2.5 mm to 7 mm. The length in the second direction may be equal to or larger than the length in the first direction. The thickness of the light emitting device package may be smaller than the lengths in the first and second directions.

A length of a package body 310A in the first direction may be equal to or different from a length of the package body 310A in the second direction. The first direction may be the X direction, the second direction may be the Y direction orthogonal to the X direction, and the third direction may be the Z direction orthogonal to the X and Y directions, but embodiments are not limited thereto. A length of the package body 310A in the X direction may be equal to or different from a length of the package body 310A in the Y direction.

The package body 310A may include first and second side parts S1 and S2 opposite to each other, and third and fourth side parts S3 and S4 opposite to each other. The first and second side parts S1 and S2 may have long lengths in the Y direction, and may be connected to both ends of the third and fourth side parts S3 and S4. The first to fourth side parts S1, S2, S3, and S4 may be formed as a surface perpendicular or inclined to the bottom of the body 315.

The package body 310A may be coupled to the body 315. The body 315 may be disposed between the frames 320, 322, 324, 326, and 340. The body 315 may be formed integrally with or separately from the package body 310A. The body 315 may be coupled to the frames 320, 322, 324, 326, and 340 to support the frames 320, 322, 324, 326, and 340. The package body 310A and the body 315 may be formed of the same material or mutually different materials.

The package body 310A may be disposed on the body 315, and may cover peripheries of the light emitting devices 351, 352, 353, and 354. The package body 310A may be formed therein with a cavity 312, and a side surface 311 of the cavity 312 may be disposed at the peripheries of the light emitting devices 351, 352, 353, and 354. The cavity 312 may be open at a top or at a light emission region, and may reflect light at the peripheries of the light emitting devices 351, 352, 353, and 354.

A top view shape of the package body 310A may be a polygonal shape, a circular shape, or an elliptical shape, and the polygonal shape may be a rectangular shape or a square shape. A top view shape of the cavity 312 may be a polygonal shape, a circular shape, or an elliptical shape, and the polygonal shape may be a rectangular shape or a square shape.

A first extension part 323 of a first frame 320 may extend to the first side part S1 of the package body 310A, and the second extension part 343 of the fifth frame 340 may extend to the second side part S2 of the package body 310A. One through-hole TH21 may be disposed in the first frame 320, and one through-hole TH28 may be disposed in the fifth frame 340. The second to fourth frames 422, 424, and 426 disposed between the first and fifth frames 420 and 440 may have a plurality of through-holes, for example, second and third through-holes TH22 and TH23, fourth and fifth through-holes TH24 and TH25, and sixth and seventh through-holes TH26 and TH27, respectively.

The first light emitting device 351 may be disposed on the first frame 320 and the second frame 322, and the first and second bonding parts 51 and 52 of the first light emitting device 351 may be disposed on and electrically connected to the first frame 320 and the second frame 322. The conductive layer 321 shown in FIG. 3 may be provided in a first through-hole TH21 of the first frame 320 and a second through-hole TH22 of the second frame 322. The conductive layers disposed in the first and second through-holes TH21 and TH22 may make contact with and may be electrically connected to the first and second bonding parts 51 and 52 of the first light emitting device 251.

The second light emitting device 352 may be disposed on the second frame 322 and the third frame 324, and the first and second bonding parts 51 and 52 of the second light emitting device 352 may be disposed on and electrically connected to the second frame 322 and the third frame 324. The conductive layer 321 shown in FIG. 3 may be provided in a third through-hole TH23 of the second frame 322 and a fourth through-hole TH24 of the third frame 324. The conductive layers disposed in the third and fourth through-holes TH23 and TH24 may make contact with and may be electrically connected to the first and second bonding parts 51 and 52 of the second light emitting device 352.

The third light emitting device 353 may be disposed on the third frame 324 and the fourth frame 326, and the first and second bonding parts 51 and 52 of the third light emitting device 353 may be disposed on and electrically connected to the third frame 324 and the fourth frame 326. The conductive layer 321 shown in FIG. 3 may be provided in a fifth through-hole TH25 of the third frame 324 and a sixth through-hole TH26 of the fourth frame 326. The conductive layers disposed in the fifth and sixth through-holes TH25 and TH26 may make contact with and may be electrically connected to the first and second bonding parts 51 and 52 of the third light emitting device 353.

The fourth light emitting device 354 may be disposed on the fourth frame 324 and the fifth frame 340, and the first and second bonding parts 51 and 52 of the fourth light emitting device 354 may be disposed on and electrically connected to the fourth frame 324 and the fifth frame 340. The conductive layer 321 shown in FIG. 3 may be provided in a seventh through-hole TH26 of the fourth frame 324 and an eighth through-hole TH28 of the fifth frame 340. The conductive layers disposed in the seventh and eighth through-holes TH27 and TH28 may make contact with and may be electrically connected to the first and second bonding parts 51 and 52 of the fourth light emitting device 354.

Each of the frames 320, 322, 324, 326 and 340 and each of the bonding parts 51 and 52 may be bonded by an intermetallic compound layer. The intermetallic compound layer may include at least one of $Cu_xSn_y$, $Ag_xSn_y$, and $Au_xSn_y$, where 'x' satisfies the condition of "$0<x<1$, $y=1-x$, $x>y$".

The bonding parts 51 and 52 of the light emitting devices 351, 352, 353 and 354 may be formed with the intermetallic compound layer between the conductive layer 321 and the frames 320, 322, 324, 326 and 340 in the process of forming material constituting the conductive layer 321 and the conductive layer 321 or in a heat treatment process after providing the conductive layer 321. The conductive layer 321 may include one selected from the group consisting of Ag, Au, Pt, Sn, Cu and the like, or the alloy thereof. However, the embodiment is not limited to above and a material capable of securing a conductive function may be used for the conductive layer 321. For example, the conductive layer 321 may be formed by using conductive paste. The conductive paste may include solder paste, silver paste, or the like, and may be composed of a multi-layer or a single layer composed of a multi-layer or an alloy composed of mutually different materials. For example, the conductive layer 321 may include an SAC (Sn—Ag—Cu) or SAC based-material.

For example, an alloy layer may be formed by combining the material constituting the conductive layer 321 and the metals of the frames 320, 322, 324, 326 and 340. Thus, the conductive layer 321 and the frames 320, 322, 324, 326and 340 may be coupled to each other to be physically or electrically stable. In addition, the conductive layer 321, the alloy layer and the frame may be coupled to each other to be physically or electrically stable. The alloy layer may include at least one intermetallic compound layer selected from the group consisting of AgSn, CuSn, and AuSn. The intermetallic compound layer may be formed by combining first and second materials, where the first material may be provided from the conductive layer 321 and the second material may be provided from the bonding parts 51 and 52 or the frames 320, 322, 324, 326 and 340.

The intermetallic compound layer described above may have a higher melting point than other bonding materials. In addition, the heat treatment process in which the metal compound layer is formed may be performed at a lower temperature than the melting point of a general bonding material. Therefore, even when the light emitting device package according to an embodiment is bonded to a main substrate through a reflow process, since re-melting phenomenon does not occur, the electrical connection and physical bonding force are not deteriorated.

In addition, according to the light emitting device package and the light emitting device package manufacturing method of an embodiment, the package body 310A does not need to be exposed to a high temperature in the process of manufacturing a light emitting device package. Therefore, according to the embodiment, the package body 310A may be prevented from being exposed to high temperatures to be damaged or discolored. Accordingly, the selection range for the material constituting the body 315 may be widened. According to an embodiment, the body 315 may be provided by using a relatively inexpensive resin material as well as an expensive material such as ceramic.

The body 315 may include recesses Ra and Rb. The recesses Ra and Rb may be formed in the upper portion of the body 315. The recesses Ra and Rb may be spaced apart from each other in a lower region of each of the light emitting devices 351, 352, 353, and 354. The recesses Ra and Rb may overlap with the bottom of the cavity 312 in the vertical direction or the third direction. The recesses Ra and Rb may be arranged at the bottom of the cavity 312.

The recesses Ra and Rb may be arranged between the through-holes TH21, TH22, TH23, TH24, TH25, TH26, TH27, and TH28 facing each other under each of the light emitting devices 351, 352, 353, and 354. An interval between the first and second recesses Ra and Rb may be smaller than the width of the light emitting devices 351, 352, 353, and 354, and the length of each of the recesses Ra and Rb may be smaller than the width of each of the light emitting devices 351, 352, 353, and 354. The description for the embodiment disclosed above may be selectively applied to the interval between the recesses Ra and Rb and the length of the recesses Ra and Rb.

The recesses Ra and Rb are spaced apart from each other by a predetermined distance under the light emitting devices 351, 352, 353, and 354, so that the thickness of the body 315 disposed under central sides of each of the light emitting devices 351, 352, 353, and 354 may not be reduced, thereby reducing the optical loss due to the light leaking through the recesses Ra and Rb of the body 315. If the light emitting devices 351, 352, 353, and 354 are mounted as flip chips, the light may be transmitted through the lower portions of the light emitting devices 351, 352, 353, and 354, and radiated toward the bottom of the cavity. The light radiated toward the bottom of the cavity may leak through the recesses Ra and Rb, which are regions where the body is relatively thin. Embodiments may reduce the size of the recesses Ra and Rb to reduce the optical loss due to the light leakage.

The recesses Ra and Rb may be concavely formed in a direction from the upper surface to the lower surface of the body 315. The depths of the recesses Ra and Rb may be smaller than the depths of the through-holes TH21, TH22, TH23, TH24, TH25, TH26, TH27, and TH28. The depth of the recesses Ra and Rb may be 40% or more of the thickness of the body 315, for example, in a range of 40% to 60% of the thickness of the body 315. If the depths of the recesses Ra and Rb are smaller than the above-mentioned range, an amount of the first resin (denoted as 160 in FIG. 12) may be reduced, so that the supporting strength for supporting the light emitting devices 351, 352, 353, and 354 may be rarely improved.

The depths of the recesses Ra and Rb may be determined in consideration of the adhesive strength of the first resin (denoted as 160 in FIG. 12). In addition, the depths of the recesses Ra and Rb may be determined in consideration of the stable strength of the body 315 and/or preventing a crack from being generated in the light emitting device package due to the heat emitted from the light emitting devices 351, 352, 353, and 354.

The inner portions of the recesses Ra and Rb may overlap with each of the light emitting devices 351, 352, 353, and 354 in the vertical direction or the third direction. The outer portions of the recesses Ra and Rb may not overlap with each of the light emitting devices 351, 352, 353, and 354 in the vertical direction or the third direction. The ratio of the inner portion to the outer portion of the recesses Ra and Rb may be 4:6 to 6:4. The length of the outer portions of the recesses Ra and Rb may be in a range of 40% to 60% of the length of the recesses Ra and Rb. The outer portions of the recesses Ra and Rb protrude outward of the light emitting devices 351, 352, 353, and 354 so as to be spaced apart from a center region of the light emitting devices 351, 352, 353, and 354, thereby reducing the optical loss through the center region of the light emitting devices 351, 352, 353, and 354.

According to an embodiment, the light emitting device package may include a first resin (denoted as 160 in FIG. 12). The first resin may be disposed between the body 315 and the light emitting devices 351, 352, 353, and 354, and may be disposed in the recesses Ra and Rb. The first resin may be disposed between the lower surface of the body 315 and the lower surfaces of the light emitting devices 351, 352, 353, and 354, and may adhere the lower surface of the body 315 to the lower surfaces of the light emitting devices 351, 352, 353, and 354. The detailed configuration of the first resin may refer to the above-mentioned description.

The recesses Ra and Rb may provide a space suitable for performing an under fill process at lower portions of the light emitting devices 351, 352, 353, and 354. The under fill process may be a process of disposing the first resin at the lower portions of the light emitting devices 351, 352, 353, and 354 after mounting the light emitting devices 351, 352, 353, and 354 on the body 315, or a process of disposing the light emitting devices 351, 352, 353, and 354 after disposing the first resin in the recesses Ra and Rb to mount the light emitting devices 351, 352, 353, and 354 on the body 315 through the first resin during a process of mounting the light emitting devices 351, 352, 353, and 354 on the body 315. The recesses Ra and Rb may have a predetermined depth or more to sufficiently provide the first resin between the lower surfaces of the light emitting devices 351, 352, 353, and 354 and the upper surface of the body 315. In addition, the recesses Ra and Rb may have a predetermined depth to provide the stable strength to the body 315. As one example, the depths of the recesses Ra and Rb may be 40 micrometers or more, for example, in a range of 40 to 60 micrometers. The widths of the recesses Ra and Rb may be 140 micrometers or more, for example, in a range of 140 to 160 micrometers.

The first resin may be disposed in outer portions of the recesses Ra and Rb, for example, a portion protruding outward than the side surfaces of the light emitting devices 351, 352, 353, and 354. When the first resin is disposed in the outer portions of the recesses Ra and Rb, the coupling with the molding part may be enhanced, and light exposed at the side surfaces of the light emitting devices 351, 352, 353, and 354 may be reflected.

FIG. 28a is a plan view of a light emitting device package according to a fourth embodiment. Upon describing the fourth embodiment, the same parts as those in the configuration of the embodiment described above may refer to the above-mentioned description, and may be selectively applied.

Referring to FIG. 28a, according to an embodiment, the semiconductor device package or the light emitting device package includes a plurality of frames 420 and 440 spaced apart from each other, a body 415 for supporting between the frames 420 and 440, and a plurality of semiconductor devices or a plurality of light emitting devices 451, 452, and 453 disposed on the frames 420 and 440. According to an embodiment, the light emitting devices 451, 452, and 453 may be connected to each other so as to be driven in parallel. In addition, at least one or all of the light emitting devices 451, 452, and 453 may include one or a plurality of light emitting cells. The light emitting cell may include at least one of an n-p junction, a p-n junction, an n-p-n junction, and a p-n-p junction. The light emitting cells may be connected to each other in series in one light emitting device. Accordingly, each of the light emitting devices 451, 452, and 453 may have one or a plurality of light emitting cells, and may be driven with a driving voltage of n times if n light emitting cells (n is 1 or more) are disposed in one light emitting device. For example, if the driving voltage of one light emitting cell is 3V and two light emitting cells are disposed in one light emitting device, each light emitting device may be driven with a driving voltage of 6V. Alternatively, if the driving voltage of one light emitting cell is 3V and three light emitting cells are disposed in one light emitting device, each light emitting device may be driven with a driving voltage of 9V. The number of light emitting cells disposed in one of the light emitting devices 451, 452, and 453 may be at least three, for example, at least four. Accordingly, if the light emitting devices are connected to each other in series, the driving voltage of the light emitting device package may be obtained by multiplying the total number of light emitting devices, the total number of light emitting cells, and the driving voltage.

The length X1 of the light emitting device package in the first direction may be equal to or different from the length Y1 of the light emitting device package in the second direction. The length of the light emitting device package in the first direction may be at least 2.5 mm, for example, in a range of 2.5 mm to 7 mm. The length in the second direction may be equal to or larger than the length in the first direction. The thickness of the light emitting device package may be smaller than the lengths in the first and second directions.

A length of a package body 410A in the first direction may be equal to or different from a length of the package body 410A in the second direction. The first direction may be the X direction, the second direction may be the Y direction orthogonal to the X direction, and the third direction may be the Z direction orthogonal to the X and Y directions, but embodiments are not limited thereto. A length of the package body 410A in the X direction may be equal to or different from a length of the package body 410A in the Y direction.

The package body 410A may include first and second side parts S1 and S2 opposite to each other, and third and fourth side parts S3 and S4 opposite to each other. The first and second side parts S1 and S2 may have long lengths in the Y direction, and may be connected to both ends of the third and fourth side parts S3 and S4. The first to fourth side parts S1, S2, S3, and S4 may be formed as a surface perpendicular or inclined to the bottom of the body 415.

The package body 410A may be coupled to the body 415. The body 415 may be disposed between the frames 420 and 440. The body 415 may be formed integrally with or separately from the package body 410A. The body 415 may be coupled to the frames 420 and 440 to support the frames 420 and 440. The package body 410A and the body 415 may be formed of the same material or mutually different materials.

The package body 410A may be disposed on the body 415, and may cover peripheries of the light emitting devices 451, 452, and 453. The package body 410A may be formed therein with a cavity 412, and a side surface 411 of the cavity 412 may be disposed at the peripheries of the light emitting devices 420 and 440. The cavity 412 may be open at a top or at a light emission region, and may reflect light at the peripheries of the light emitting devices 451, 452, and 453.

A top view shape of the package body 410A may be a polygonal shape, a circular shape, or an elliptical shape, and the polygonal shape may be a rectangular shape or a square shape. A top view shape of the cavity 312 may be a polygonal shape, a circular shape, or an elliptical shape, and the polygonal shape may be a rectangular shape or a square shape.

A first extension part 423 of a first frame 420 may extend to the first side part S1 of the package body 410A, and the second extension part 443 of the second frame 440 may extend to the second side part S2 of the package body 410A.

An upper recess R51 may be arranged in the first frame 420 and the second frame 440, and the upper recess R51 may be arranged around an outer periphery of the light emitting devices 451, 452, and 453. A resin part may be disposed on the upper recess R51 to reflect light leaking in the lateral direction of the light emitting devices 451, 452, and 453.

The first to fourth light emitting devices 451, 452, and 453 may be disposed on the first frame 420 and the second frame 440, and the first and second bonding parts 51 and 52 of the first, second, and third light emitting devices 451, 452, and 453 may be disposed on and electrically connected to the first frame 420 and the second frame 422. A plurality of first through-holes TH41 of the first frame 420 may be arranged under the bonding parts 51 and 52 of each of the light emitting devices 451, 452, and 453, and a plurality of second through-holes TH42 of the second frame 440 may be arranged under the bonding parts 51 and 52 of each of the light emitting devices 451, 452, and 453. A conductive layer 421 shown in FIG. 3 may be provided in the first and second through-holes TH41 and TH42. The conductive layers disposed in the first and second through-holes TH41 and TH42 may make contact with and may be electrically connected to the first and second bonding parts 51 and 52 of the first light emitting device 251.

Each of the frames 420 and 440 and each of the bonding parts 51 and 52 may be bonded by an intermetallic compound layer. The intermetallic compound layer may include at least one of $Cu_xSn_y$, $Ag_xSn_y$, and $Au_xSn_y$, where 'x' satisfies the condition of "$0<x<1$, $y=1-x$, $x>y$".

The bonding parts 51 and 52 of the light emitting devices 451, 452 and 453 may be formed with the intermetallic compound layer between the conductive layer (denoted as 321 in FIG. 3) and the frames 420 and 440 in the process of forming material constituting the conductive layer 321 and the conductive layer 321 or in a heat treatment process after providing the conductive layer 321. The conductive layer 321 may include one selected from the group consisting of Ag, Au, Pt, Sn, Cu and the like, or the alloy thereof. However, the embodiment is not limited to above and a material capable of securing a conductive function may be used for the conductive layer 321. For example, the conductive layer 321 may be formed by using conductive paste. The conductive paste may include solder paste, silver paste, or the like, and may be composed of a multi-layer or a single layer composed of a multi-layer or an alloy composed of mutually different materials. For example, the conductive layer 321 may include an SAC (Sn—Ag—Cu) or SAC based-material.

For example, an alloy layer may be formed by combining the material constituting the conductive layer 321 and the metals of the frames 420 and 440. Thus, the conductive layer 321 and the frames 420 and 440 may be coupled to each other to be physically or electrically stable. In addition, the conductive layer 321, the alloy layer and the frame may be coupled to each other to be physically or electrically stable. The alloy layer may include at least one intermetallic compound layer selected from the group consisting of AgSn, CuSn, and AuSn. The intermetallic compound layer may be formed by combining first and second materials, where the first material may be provided from the conductive layer 321 and the second material may be provided from the bonding parts 51 and 52 or the frames 420 and 440.

The intermetallic compound layer described above may have a higher melting point than other bonding materials. In addition, the heat treatment process in which the metal compound layer is formed may be performed at a lower temperature than the melting point of a general bonding material. Therefore, even when the light emitting device package according to an embodiment is bonded to a main substrate through a reflow process, since re-melting phenomenon does not occur, the electrical connection and physical bonding force are not deteriorated.

In addition, according to the light emitting device package and the light emitting device package manufacturing method of an embodiment, the package body 410A does not need to be exposed to a high temperature in the process of manufacturing a light emitting device package. Therefore, according to the embodiment, the package body 410A may be prevented from being exposed to high temperatures to be damaged or discolored. Accordingly, the selection range for the material constituting the body 415 may be widened. According to an embodiment, the body 415 may be provided by using a relatively inexpensive resin material as well as an expensive material such as ceramic.

The body 415 may include recesses Ra and Rc. The recesses Ra and Rc may be formed in the upper portion of the body 415. The recesses Ra and Re may be spaced apart from each other in a lower region of each of the light emitting devices 451, 452, and 453. The recesses Ra and Rc may overlap with the bottom of the cavity 412 in the vertical direction or the third direction. The recesses Ra and Re may be arranged at the bottom of the cavity 412.

The recesses Ra and Re may be arranged between the through-holes TH41 and TH42 facing each other under each of the light emitting devices 451, 452, and 453. An interval between the first and second recesses Ra and Rc may be smaller than the width of the light emitting devices 451, 452, and 453, and the length of each of the recesses Ra and Rc may be smaller than the width of each of the light emitting devices 451, 452, and 453. The description for the embodiment disclosed above may be selectively applied to the interval between the recesses Ra and Rc and the length of the recesses Ra and Rc.

The recesses Ra and Rc are spaced apart from each other by a predetermined distance under the light emitting devices 451, 452, and 453, so that the thickness of the body 415 disposed under central sides of each of the light emitting devices 451, 452, and 453 may not be reduced, thereby reducing the optical loss due to the light leaking through the recesses Ra and Rc of the body 415. If the light emitting devices 451, 452, and 453 are mounted as flip chips, the light may be transmitted through the lower portions of the light emitting devices 451, 452, and 453, and radiated toward the bottom of the cavity. The light radiated toward the bottom of the cavity may leak through the recesses Ra and Rc, which are regions where the body is relatively thin. Embodiments may reduce the size of the recesses Ra and Rc to reduce the optical loss due to the light leakage.

The recesses Ra and Rc may be concavely formed in a direction from the upper surface to the lower surface of the body 415. The depths of the recesses Ra and Rc may be smaller than the depths of the through-holes TH41 and TH42. The depth of the recesses Ra and Rc may be 40% or more of the thickness of the body 415, for example, in a range of 40% to 60% of the thickness of the body 415. If the depths of the recesses Ra and Rc are smaller than the above-mentioned range, an amount of the first resin (denoted as 160 in FIG. 12) may be reduced, so that the supporting strength for supporting the light emitting devices 451, 452, and 453 may be rarely improved.

The depths of the recesses Ra and Rc may be determined in consideration of the adhesive strength of the first resin (denoted as 160 in FIG. 12). In addition, the depths of the recesses Ra and Rc may be determined in consideration of the stable strength of the body 415 and/or preventing a crack from being generated in the light emitting device package due to the heat emitted from the light emitting devices 451, 452, and 453.

The inner portions of the recesses Ra and Rc may overlap with each of the light emitting devices 451, 452, and 453 in the vertical direction or the third direction. The outer portions of the recesses Ra and Rc may not overlap with each of the light emitting devices 451, 452, and 453 in the vertical direction or the third direction. The ratio of the inner portion to the outer portion of the recesses Ra and Rc may be 4:6 to 6:4. The length of the outer portions of the recesses Ra and Rc may be in a range of 40% to 60% of the length of the recesses Ra and Rc. The outer portions of the recesses Ra and Rc protrude outward of the light emitting devices 451, 452, and 453 so as to be spaced apart from a center region of the light emitting devices 451, 452, and 453, thereby reducing the optical loss through the center region of the light emitting devices 451, 452, and 453.

According to an embodiment, the light emitting device package may include a first resin (denoted as 160 in FIG. 12). The first resin may be disposed between the body 415 and the light emitting devices 451, 452, and 453, and may be disposed in the recesses Ra and Rc. The first resin may be disposed between the lower surface of the body 415 and the lower surfaces of the light emitting devices 451, 452, and 453, and may adhere the lower surface of the body 415 to the lower surfaces of the light emitting devices 451, 452, and 453. The detailed configuration of the first resin may refer to the above-mentioned description.

The recesses Ra and Rc may provide a space suitable for performing an under fill process at lower portions of the light emitting devices 451, 452, and 453. The under fill process may be a process of disposing the first resin at the lower portions of the light emitting devices 451, 452, and 453 after mounting the light emitting devices 451, 452, and 453 on the body 415, or a process of disposing the light emitting devices 451, 452, and 453 after disposing the first resin in the recesses Ra and Rc to mount the light emitting devices 451, 452, and 453 on the body 415 through the first resin during a process of mounting the light emitting devices 451, 452, and 453 on the body 415. The recesses Ra and Re may have a predetermined depth or more to sufficiently provide the first resin between the lower surfaces of the light emitting devices 451, 452, and 453 and the upper surface of the body 415. In addition, the recesses Ra and Rc may have a predetermined depth to provide the stable strength to the body 415. As one example, the depths of the recesses Ra and Rc may be 40 micrometers or more, for example, in a range of 40 to 60 micrometers. The widths of the recesses Ra and Re may be 140 micrometers or more, for example, in a range of 140 to 160 micrometers.

The first resin may be disposed in outer portions of the recesses Ra and Rc, for example, a portion protruding outward than the side surfaces of the light emitting devices 451, 452, and 453. When the first resin is disposed in the outer portions of the recesses Ra and Rc, the coupling with the molding part may be enhanced, and light exposed at the side surfaces of the light emitting devices 451, 452, and 453 may be reflected.

As another example, a structure where a recess is omitted from the body shown in FIG. 28A may be provided.

As another example, referring to FIG. 28b, at least one of the recesses Ra, Rc, and Rc1 may have a mutually different length in the body 415. For example, at least one (Rc1) of the recesses Ra, Rc, and Rc1 may have a longer length. The long recess Rc1 may be disposed between the recesses Ra and Rc having a short length, or may be disposed in the center region of the body 415. For example, at least one (Rc1) of the recesses Ra, Rc, and Rc1 may at least partially overlap with two adjacent light emitting devices 451 and 452, and 452 and 453. The recesses Ra, Rc, and Rc1 may include one or at least two recesses having a relatively long length.

A first recess Ra may be arranged under the first light emitting device 451, and a second recess Rc may be arranged under the third light emitting device 453. The third recess Rc1 may be arranged in lower regions of the first and second light emitting devices 451 and 452, and lower regions of the second and third light emitting devices 452 and 4553.

The inner portion of the third recess Rc1 may partially overlap with the first light emitting device 451 and the second light emitting device 452, and the outer portion of the third recessRc1 may be connected to each other in a lower region between the first and second light emitting devices 451 and 452. The inner portion of the third recess Rc1 may partially overlap with the second light emitting device 452 and the third light emitting device 453, and the outer portion of the third recess Rc1 may be connected to each other in a lower region between the second and third light emitting devices 452 and 453. In other words, the length of the third recess Rc1 may be longer than the interval between two adjacent light emitting devices, and may be longer than the width or the short side length of each light emitting device. The length of a region overlapping with each of the light emitting devices 451, 452, and 453 in the third recess Rc1 may be smaller than the width or short side length of each of the light emitting devices 451, 452, and 453. A top view shape of the third recess Rc1 may include an elliptical shape, a polygonal shape, or a shape in which a straight line and a curved line are mixed. The length of the region overlapping with each of the light emitting devices 451, 452, and 453 in the third recess Rc1 may be smaller than the length of a region not overlapping with the light emitting devices 451, 452, and 453. The first resin described in the embodiment may be disposed in the recesses Ra, Rc, andRc1, and the first resin may bond the lower surface of the body 415 to the lower surface of each of the light emitting devices 451, 452, and 453.

As described above, the third recessRc1 has a relatively long length, so that a process of dispensing the first resin may be reduced, and the first resin disposed on the third recess Rc1 may support the two light emitting devices, so that the supporting strength of the first resin may be improved. According to the present invention, a body having a relatively long recess may be selectively applied to the above-described embodiment(s). In addition, the configuration of the embodiment described above may be applied to the width of the recess.

Figure 29:
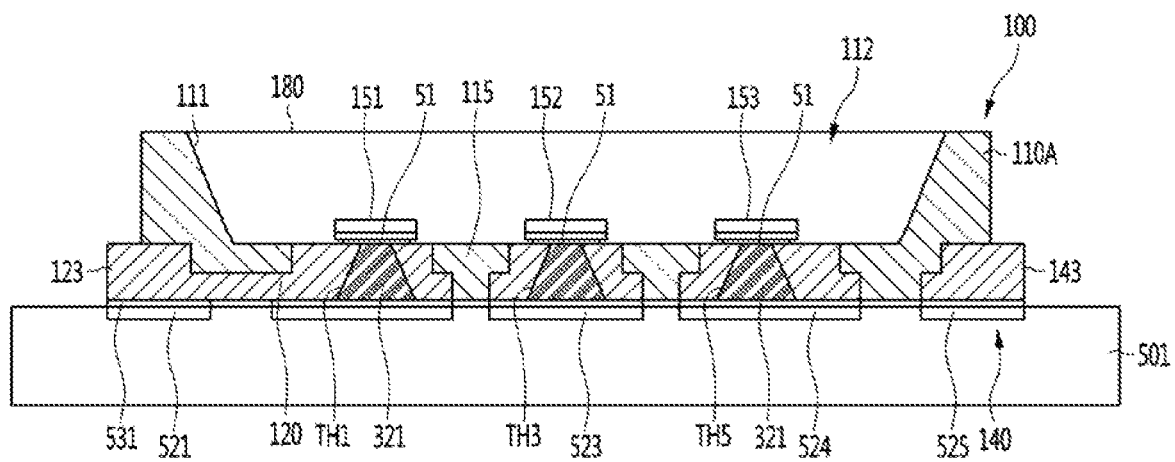
FIG. 29 shows an example of a light source apparatus in which the light emitting device package shown in FIG. 5 is disposed on a circuit board.

FIG. 29 shows an example of a light source apparatus or a light source module in which the light emitting device package shown in FIG. 5 is disposed on a circuit board. As one example, a light source apparatus having the light emitting device package of the first embodiment will be described later with reference to the above descriptions and drawings.

Referring to FIGS. 6 and 29, in the light source module according to an embodiment, one or a plurality of light emitting device packages 100 may be disposed on a circuit board 501.

The circuit board 501 may include a substrate member having pads 521, 523, 524, and 525. A power supply circuit for controlling the driving of the light emitting devices 151, 152, and 153 may be provided on the circuit board 501. The frames 120, 130, 135, and 140 of the light emitting device package 100 may be connected to the pads 521, 523, 524, and 525 of the circuit board 501 through a bonding layer 531. Accordingly, the light emitting devices 151, 152, and 153 of the light emitting device package 100 may receive a power from the pads 521, 523, 524, and 525 of the circuit board 501. Each of the pads 521, 523, 524, and 525 of the circuit board 201 may include, for example, at least one material selected from the group consisting of Ti, Cu, Ni, Au, Cr, Ta, Pt, Sn, Ag, P, Fe, Sn, Zn, and Al, or an alloy thereof The pads 521, 523, 524, and 525 of the circuit board 501 may overlap with the frames 120, 130, 135, and 140 and the through-holes TH1, TH2, TH3, TH4, TH5, and TH6. A bonding layer 531 may be provided between the pads 521, 523, 524, and 525 and the frames 120, 130, 135, and 140. The bonding layer 531 may be connected to the frames 120, 130, 135, and 140 and/or the conductive layers 321 of the through-holes TH1, TH2, TH3, TH4, TH5, and TH6.

According to the light emitting device package of an embodiment, the bonding parts 51 and 52 of the light emitting devices 151, 152 and 153 may receive driving power through the conductive layer 321 disposed in the through-holes TH1 to TH6 of the frames 120, 130, 135 and 140. In addition, the melting point of the conductive layer 321 disposed in the through-holes TH1 to TH6 may be selected to have a higher value than the melting point of the conventional bonding material. Therefore, even when the light emitting device package 100 according to an embodiment is bonded to a main substrate through a reflow process, since re-melting phenomenon does not occur, the electrical connection and physical bonding force are not deteriorated. In addition, according to the light emitting device package and the light emitting device package manufacturing method of an embodiment, the package body 110 and the body 115 does not need to be exposed to a high temperature in the process of manufacturing a light emitting device package. Therefore, according to the embodiment, the package body 110 and the body 115 may be prevented from being exposed to high temperatures to be damaged or discolored.

The light emitting device package 100 according to an embodiment may be mounted on a sub-mount, a circuit board, or the like. However, when a conventional light emitting device package is mounted on a sub-mount, a circuit board or the like, a high temperature process such as reflow may be applied. In the reflow process, a re-melting phenomenon may occur in a bonding region between the frame provided in the light emitting device package and the light emitting device, so that the stability of the electrical connection and physical bonding may be deteriorated, thereby changing the position of the light emitting device and thus, the optical and electrical characteristics and reliability of the light emitting device package may be deteriorated. In addition, the melting point of the conductive layer disposed in the through-hole may be selected to have a higher value than the melting point of a conventional bonding material. Therefore, even when the light emitting device package 100 according to an embodiment is bonded to a main substrate through a reflow process, since re-melting phenomenon does not occur, the electrical connection and physical bonding force are not deteriorated.

Figure 30:
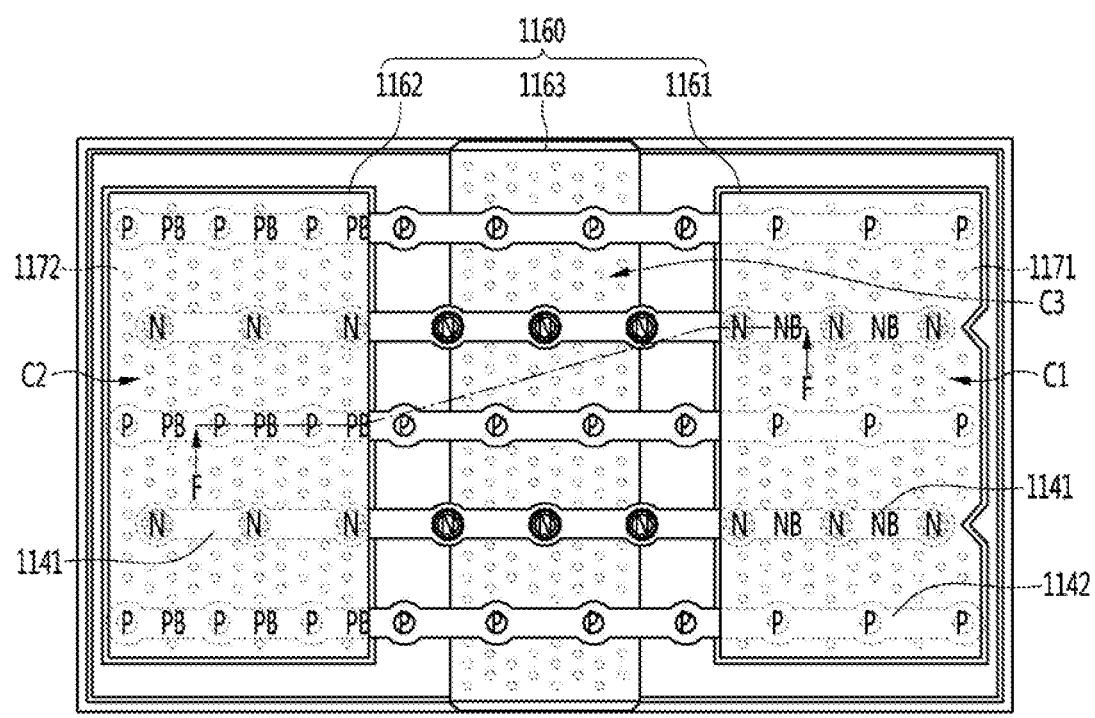
FIG. 30 is a plan view showing a first example of a light emitting device applied to a light emitting device package according to an embodiment.
Figure 31:
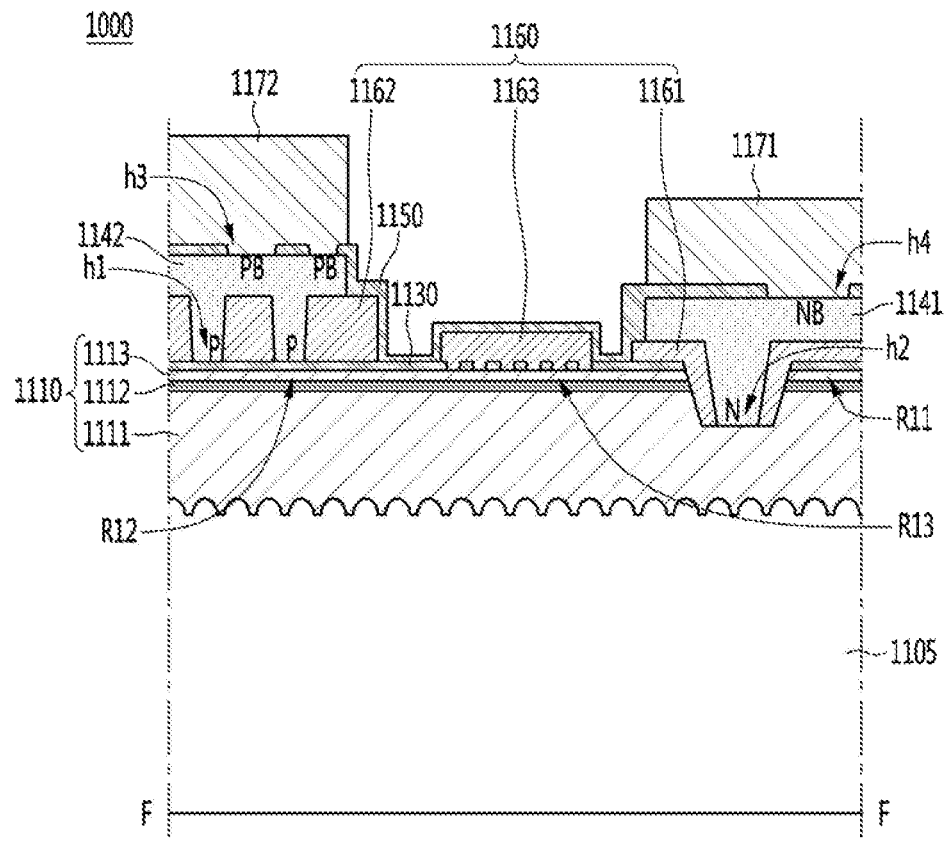
FIG. 31 is a sectional view showing the light emitting device taken along line F-F of FIG. 30.

FIG. 30 is a plan view illustrating a light emitting device according to an embodiment of the present invention, and FIG. 31 is a sectional view taken along the line F-F of a light emitting device shown in FIG. 30.

For better understanding, though disposed under the first bonding part 1171 and the second bonding part 1172, FIG. 30 shows a first sub-electrode 1141 electrically connected to the first bonding part 1171, and a second sub-electrode 1142 electrically connected to the second bonding part 1172.

As shown in FIGS. 29, the light emitting device 1000 according to the embodiment may include a light emitting structure 1110 disposed on a substrate 1105. The substrate 1105 may be selected from the group including a sapphire substrate (Al2O3), SiC, GaAs, GaN, ZnO, Si, GaP, InP and Ge. For example, the substrate 1105 may be provided as a patterned sapphire substrate (PSS) formed on an upper surface thereof with a concavo-convex pattern.

The light emitting structure 1110 may include a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

The light emitting device 1000 according to the embodiment may include a transparent electrode layer 1130. The transparent electrode layer 1130 may increase light output by improving a current diffusion. For example, the transparent electrode layer 1130 may include at least one selected from the group including a metal, metal oxide, and metal nitride. The transparent electrode layer 1130 may include a light transmissive material. The transparent electrode layer 1130 may include selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

The light emitting device 1000 according to the embodiment may include a reflective layer 1160. The reflective layer 1160 may include a first reflective layer 1161, a second reflective layer 1162, and a third reflective layer 1163. The reflective layer 1160 may be disposed on the transparent electrode layer 1130. The second reflective layer 1162 may include a first opening h1 for exposing the transparent electrode layer 1130. The second reflective layer 1162 may include a plurality of first openings h1 disposed on the transparent electrode layer 1130. The first reflective layer 1161 may include second openings h2 for exposing an upper surface of the first conductivity type semiconductor layer 1111.

The third reflective layer 1163 may be disposed between the first reflective layer 1161 and the second reflective layer 1162. For example, the third reflective layer 1163 may be connected to the first reflective layer 1161. In addition, the third reflective layer 1163 may be connected to the second reflective layer 1162. The third reflective layer 1163 may be disposed while physically making direct contact with the first reflective layer 1161 and the second reflective layer 1162.

The reflective layer 1160 according to the embodiment may make contact with the second conductivity type semiconductor layer 1113 through contact holes provided in the transparent electrode layer 1130. The reflective layer 1160 may physically make contact with an upper surface of the second conductivity type semiconductor layer 1113 through the contact holes provided in the transparent electrode layer 1130.

The reflective layer 1160 may be provided as an insulating reflective layer. For example, the reflective layer 1160 may be provided as a distributed Bragg reflector (DBR) layer. In addition, the reflective layer 1160 may be provided as an omni directional reflector (ODR) layer. In addition, the reflective layer 1160 may be provided by stacking the DBR layer and the ODR layer.

The light emitting device 1000 according to the embodiment may include the first sub-electrode 1141 and the second sub-electrode 1142. The first sub-electrode 1141 may be electrically connected to the first conductivity type semiconductor layer 1111 in the second opening h2. The first sub-electrode 1141 may be disposed on the first conductivity type semiconductor layer 1111. For example, according to the light emitting device 1000 of the embodiment, the first sub-electrode 1141 may be disposed on the upper surface of the first conductivity type semiconductor layer 1111 within the recess disposed to a partial region of the first conductivity type semiconductor layer 1111 through the second conductivity type semiconductor layer 1113 and the active layer 1112.

The first sub-electrode 1141 may be electrically connected to the upper surface of the first conductivity type semiconductor layer 1111 through the second opening h2 provided in the first reflective layer 1161. The second opening h2 and the recess may vertically overlap each other. For example, the first sub-electrode 1141 may make direct contact with the upper surface of the first conductivity type semiconductor layer 1111 in recess regions.

The second sub-electrode 1142 may be electrically connected to the second conductivity type semiconductor layer 1113. The second sub-electrode 1142 may be disposed on the second conductivity type semiconductor layer 1113. According to the embodiment, the transparent electrode layer 1130 may be disposed between the second sub-electrode 1142 and the second conductivity type semiconductor layer 1113.

The second sub-electrode 1142 may be electrically connected to the second conductivity type semiconductor layer 1113 through the first opening h1 provided in the second reflective layer 1162. For example, the second sub-electrode 1142 may be electrically connected to the second conductivity type semiconductor layer 1113 through the transparent electrode layer 1130 in P regions.

The second sub-electrode 1142 may make direct contact with an upper surface of the transparent electrode layer 1130 through a plurality of first openings h1 provided in the second reflective layer 1162 in the P regions. According to the embodiment, the first sub-electrode 1141 and the second sub-electrode 1142 may have polarities to each other and may be spaced apart from each other.

The first sub-electrode 1141 and the second sub-electrode 1142 may be formed with a structure having a single layer or multiple layers. For example, the first sub-electrode 1141 and the second sub-electrode 1142 may be ohmic electrodes. For example, the first sub-electrode 1141 and the second sub-electrode 1142 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf. An region R11, R12 and R13 in FIG. 31 shows to distinguish overlapping regions for each of the sub-electrodes.

The light emitting device 1000 according to the embodiment may include a protective layer 1150. The protective layer 1150 may include third openings h3 for exposing the second sub-electrode 1142. The third openings h3 may be disposed corresponding to PB regions provided in the second sub-electrode 1142. In addition, the protective layer 1150 may include fourth openings h4 for exposing the first sub-electrode 1141. The fourth openings h4 may be disposed corresponding to NB regions provided in the first sub-electrode 1141. The protective layer 1150 may be disposed on the reflective layer 1160. The protective layer 1150 may be disposed on the first reflective layer 1161, the second reflective layer 1162, and the third reflective layer 1163. For example, the protective layer 1150 may be provided as an insulating material. For example, the protective layer 1150 may be formed of at least one material selected from the group including SixOy, SiOxNy, SixNy, and AlxOy.

The light emitting device 1000 according to the embodiment may include the first bonding part 1171 and the second bonding part 1172 disposed on the protective layer 1150. The first bonding part 1171 may be disposed on the first reflective layer 1161. In addition, the second bonding part 1172 may be disposed on the second reflective layer 1162. The second bonding part 1172 may be spaced apart from the first bonding part 1171. The first bonding part 1171 may make contact with an upper surface of the first sub-electrode 1141 through the fourth openings h4 provided in the protective layer 1150 in the NB regions. The NB regions may be vertically offset with the second opening h2. When the plurality of NB regions and the second opening h2 are vertically offset from each other, a current injected into the first bonding part 1171 may be uniformly distributed in a horizontal direction of the first sub-electrode 1141, thus the current may be uniformly injected in the NB regions.

In addition, the second bonding part 1172 may make contact with an upper surface of the second sub-electrode 1142 through the third openings h3 provided in the protective layer 1150 in the PB regions. When the PB regions and the first openings h1 are not vertically overlapped with each other, a current injected into the second bonding part 1172 may be uniformly distributed in a horizontal direction of the second sub-electrode 1142, thus the current may be uniformly injected in the PB regions. Thus, according to the embodiment, because the power may be supplied through the regions, a current dispersion effect can be generated and an operating voltage can be reduced according to the increase of a contact area and the dispersion of a contact region.

Accordingly, the first reflective layer 1161 and the second reflective layer 1162 reflect light emitted from the active layer 1112 of the light emitting structure 1110 to minimize the optical absorption in the first sub-electrode 1141 and the second sub-electrode 1142, so that light intensity Po can be improved. The first reflective layer 1161 and the second reflective layer 1162 may have a DBR structure in which materials having different refractive indexes are alternately disposed. For example, the first reflective layer 1161 and the second reflective layer 1162 may be disposed in a single layer or a stacked structure including at least one of TiO2, SiO2, Ta2O5, and HfO2. Without the limitation thereto, according to another embodiment, the first reflective layer 1161 and the second reflective layer 1162 may freely selected to adjust the reflectivity to the light emitted from the active layer 1112 according to a wavelength of the light emitted from the active layer 1112. In addition, according to another embodiment, the first reflective layer 1161 and the second reflective layer 1162 may be provided as the ODR layer. According to still another embodiment, the first reflective layer 1161 and the second reflective layer 1162 may be provided as a sort of hybrid type in which the DBR layer and the ODR layer are stacked.

When the light emitting device according to the embodiment is implemented as a light emitting device package after being mounted by a flip chip bonding scheme, light provided from the light emitting structure 1110 may be emitted through the substrate 1105. The light emitted from the light emitting structure 1110 may be reflected by the first reflective layer 1161 and the second reflective layer 1162 and emitted toward the substrate 1105.

In addition, the light emitted from the light emitting structure 1110 may be emitted in the lateral direction of the light emitting structure 1110. In addition, the light emitted from the light emitting structure 1110 may be emitted to the outside through a region where the third reflective layer 1163 is not provided among the surfaces on which the first bonding part 1171 and the second bonding part 1172 are disposed.

Accordingly, the light emitting device 1000 according to the embodiment may emit the light in six-surfaced directions surrounding the light emitting structure 1110, and remarkably improve the light intensity.

Meanwhile, according to the light emitting device of the embodiment, when viewed from the top of the light emitting device 1000, the sum of the areas of the first bonding part 1171 and the second bonding part 1172 is less than or equal to 60% of the total area of the upper surface of the light emitting device 1000 on which the first bonding part 1171 and the second bonding part 1172 are disposed.

For example, the total area of the upper surface of the light emitting device 1000 may correspond to the area defined by a lateral length and a longitudinal length of the lower surface of the first conductivity type semiconductor layer 1111 of the light emitting structure 1110. In addition, the total area of the upper surface of the light emitting device 1000 may correspond to the area of an upper surface or a lower surface of the substrate 1105.

Accordingly, the sum of the areas of the first bonding part 1171 and the second bonding part 1172 is equal to or less than 60% of the total area of the light emitting device 1000, so that the amount of light emitted to the surface on which the first bonding part 1171 and the second bonding part 1172 are disposed may be increased. Thus, according to the embodiment, because the amount of the light emitted in the six-surfaced directions of the light emitting device 1000 is increased, the light extraction efficiency may be improved and the light intensity Po may be increased.

In addition, when viewed from the top of the light emitting device, the sum of the areas of the first bonding part 1171 and the second bonding part 1172 is equal to or greater than 30% of the total area of the light emitting device 1000.

Accordingly, the sum of the areas of the first bonding part 1171 and the second bonding part 1172 is equal to or greater than 30% of the total area of the light emitting device 1000, so that a stable mount may be performed through the first bonding part 1171 and the second bonding part 1172, and electrical characteristics of the light emitting device 1000 may be ensured.

The sum of the areas of the first bonding part 1171 and the second bonding part 1172 may be selected as 30% to 60% with respect to the total area of the light emitting device 1000 in consideration of ensuring the light extraction efficiency and the bonding stability.

In other words, when the sum of the areas of the first bonding part 1171 and the second bonding part 1172 is 30% to 100% with respect to the total area of the light emitting device 1000, the electrical characteristics of the light emitting device 1000 may be ensured and bonding strength to be mounted on the light emitting device package may be ensured, so that stable mount may be performed.

In addition, when the sum of the areas of the first bonding part 1171 and the second bonding part 1172 is more than 0% and equal to or less than 60% of the total area of the light emitting device 1000, the amount of light emitted to the surface on which the first bonding part 1171 and the second bonding part 1172 are disposed increases, so that the light extraction efficiency of the light emitting device 1000 may be improved and the light intensity Po may be increased.

In the embodiment, the sum of the areas of the first bonding part 1171 and the second bonding part 1172 is selected as 30% to 60% of the total area of the light emitting device 1000 so as to ensure the electrical characteristics of the light emitting device 1000 and the bonding strength to be mounted on the light emitting device package and increase the light intensity.

In addition, according to the light emitting device 1000 of the embodiment, the third reflective layer 1163 may be disposed between the first bonding part 1171 and the second bonding part 1172. For example, the length W5 of the third reflective layer 1163 in major axial direction of the light emitting device 1000 may correspond to the distance between the first bonding part 1171 and the second bonding part 1172. In addition, for example, the area of the third reflective layer 1163 may be 10% to 25% of the entire upper surface of the light emitting device 1000.

When the area of the third reflective layer 1163 is 10% or more of the entire upper surface of the light emitting device 1000, the package body disposed under the light emitting device may be prevented from being discolored or cracked. When being 25% or less, it is advantageous to ensure the light extraction efficiency for emitting light to six surfaces of the light emitting device.

In addition, without limited thereto in another embodiment, the area of the third reflective layer 1163 may be arranged to more than 0% and less than 10% of the entire upper surface of the light emitting device 1000 to ensure the light extraction efficiency more, and the area of the third reflective layer 1163 may be arranged to more than 25% and less than 100% of the entire upper surface of the light emitting device 1000 to prevent the package body from being discolored or cracked.

In addition, the light generated from the light emitting structure 1110 may be transmitted and emitted through a second region provided between a side surface arranged in the major axial direction and the first bonding part 1171 or the second bonding part 1172 adjacent to the side surface.

In addition, the light generated from the light emitting structure 1110 may be transmitted and emitted through a third region provided between a side surface arranged in a minor axial direction and the first bonding part 1171 or the second bonding part 1172 adjacent to the side surface.

According to the embodiment, the size of the first reflective layer 1161 may be several micrometers larger than the size of the first bonding part 1171. For example, the area of the first reflective layer 1161 may be provided in a size to completely cover the area of the first bonding part 1171. In consideration of a process error, for example, the length of one side of the first reflective layer 1161 may be greater than the length of one side of the first bonding part 1171 by about 4 micrometers to about 10 micrometers.

In addition, the size of the second reflective layer 1162 may be several micrometers larger than the size of the second bonding part 1172. For example, the area of the second reflective layer 1162 may be provided in a size to completely cover the area of the second bonding part 1172. In consideration of a process error, for example, the length of one side of the second reflective layer 1162 may be greater than the length of one side of the second bonding part 1172 by about 4 micrometers to about 10 micrometers.

According to the embodiment, light emitted from the light emitting structure 1110 may be reflected without being incident on the first bonding part 1171 and the second bonding part 1172 by the first reflective layer 1161 and the second reflective layer 1162. Thus, according to the embodiment, a loss of the light generated and emitted from the light emitting structure 1110 and incident to the first bonding part 1171 and the second bonding part 1172 may be minimized.

In addition, according to the light emitting device 1000 of the embodiment, because the third reflective layer 1163 is disposed between the first bonding part 1171 and the second bonding part 1172, the amount of light emitted between the first bonding part 1171 and the second bonding part 1172 may be adjusted.

As described above, the light emitting device 1000 according to the embodiment may be provided as a light emitting device package after being mounted, for example, in a flip chip bonding scheme. Herein, when the package body mounted thereon with the light emitting device 1000 is provided with resin or the like, the package body is discolored or cracked in the lower region of the light emitting device 1000 due to strong short-wavelength light emitted from the light emitting device 1000.

However, according to the light emitting device 1000 of the embodiment, because the amount of light emitted between the region on which the first bonding part 1171 and the second bonding part 1172 are disposed is adjusted, the package body disposed in the lower region of the light emitting device 1000 may be prevented from being discolored or cracked.

According to the embodiment, the light generated from the light emitting structure 1000 may be transmitted and emitted through 20% or more of the area of the upper surface of the light emitting device 1000 on which the first bonding part 1171, the second bonding part 1172 and the third reflective layer 1163.

Thus, according to the embodiment, because the amount of the light emitted in the six-surfaced directions of the light emitting device 1000 is increased, the light extraction efficiency may be improved and the light intensity Po may be increased. In addition, the package body disposed adjacent to the lower surface of the light emitting device 1000 may be prevented from being discolored or cracked.

In addition, according to the light emitting device 1000 of the embodiment, a plurality of contact holes C1, C2, and C3 may be provided in the transparent electrode layer 1130. The second conductivity type semiconductor layer 1113 may be bonded to the reflective layer 1160 through the plurality of contact holes C1, C2, and C3 provided in the transparent electrode layer 1130. The reflective layer 1160 makes directly contact with the second conductivity type semiconductor layer 1113, so that the adhesive strength may be improved as compared with the case that the reflective layer 1160 makes contact with the transparent electrode layer 1130.

When the reflective layer 1160 makes direct contact with only the transparent electrode layer 1130, the bonding strength or adhesive strength between the reflective layer 1160 and the transparent electrode layer 1130 may be weakened. For example, when an insulating layer is bonded to a metal layer, the bonding strength or adhesive strength between the materials thereof may be weakened.

For example, when the bonding strength or adhesive strength between the reflective layer 1160 and the transparent electrode layer 1130 is weak, peeling may incur between the two layers. Thus, when the peeling incurs between the reflective layer 1160 and the transparent electrode layer 1130, the characteristics of the light emitting device 1000 may deteriorate and the reliability of the light emitting device 1000 may not be ensured.

However, according to the embodiment, because the reflective layer 1160 can make direct contact with the second conductivity type semiconductor layer 1113, the bonding strength and adhesive strength may be stably provided between the reflective layer 1160, the transparent electrode layer 1130, and the second conductivity type semiconductor layer 1113.

Thus, according to the embodiment, because the bonding strength between the reflective layer 1160 and the second conductivity type semiconductor layer 1113 may be stably provided, the reflective layer 1160 may be prevented from being peeled off from the transparent electrode layer 1130. In addition, because the bonding strength between the reflective layer 1160 and the second conductivity type semiconductor layer 1113 may be stably provided, the reliability of the light emitting device 1000 may be improved.

Meanwhile, as described above, the transparent electrode layer 1130 may be provided with the contact holes C1, C2, and C3. The light emitted from the active layer 1112 may be incident to and reflected by the reflective layer 1160 through the contact holes C1, C2, and C3 provided in the transparent electrode layer 1130. Accordingly, the loss of the light generated from the active layer 1112 and incident to the transparent electrode layer 1130 is reduced, so that the light extraction efficiency may be improved. Thus, according to the light emitting device 1000 of the embodiment, the light intensity may be improved.

Figure 32:
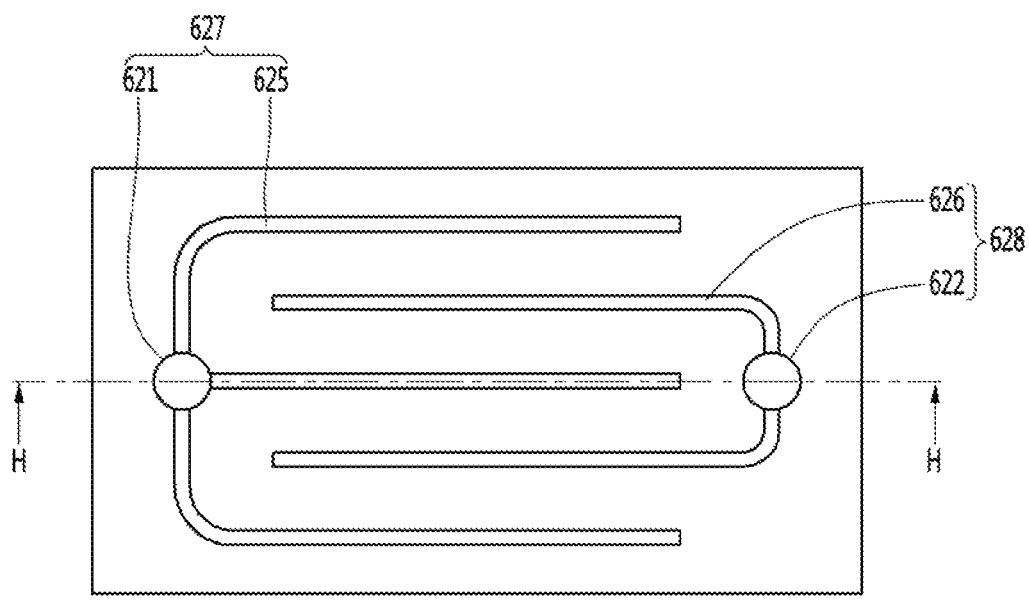
FIG. 32 is a plan view showing a second example of the light emitting device applied to the light emitting device package according to an embodiment.

An example of the flip chip light emitting device applied to the light emitting device package according to the embodiment of the present invention will be described with reference to FIG. 32 and FIG. 33. FIG. 32 is a plan view describing an electrode arrangement of the light emitting device applied to the light emitting device package according to the embodiment of the present invention, and FIG. 33 is a sectional view taken along the line H-H of the light emitting device shown in FIG. 32.

Figure 33:
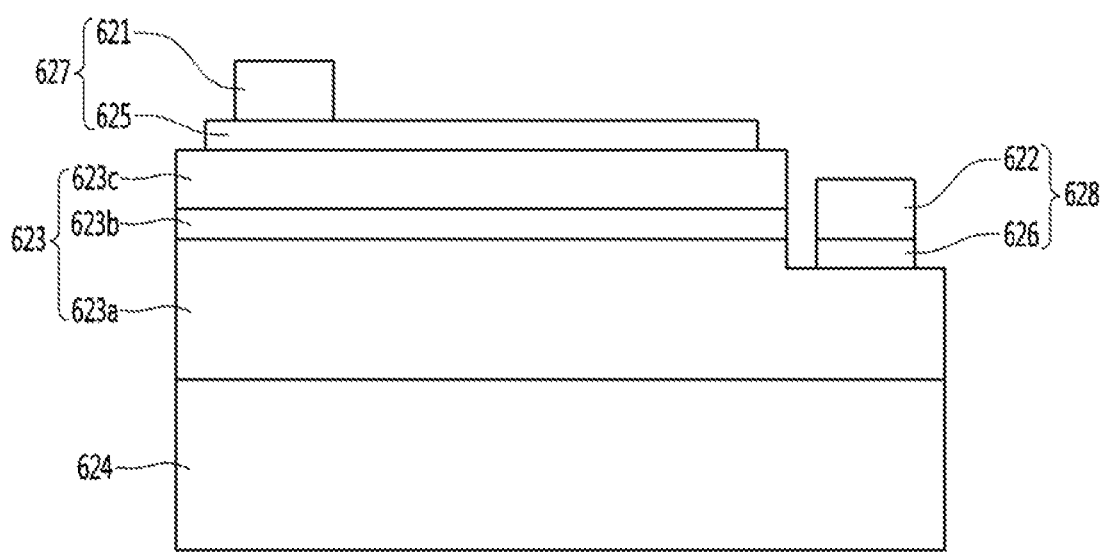
FIG. 33 is a sectional view showing the light emitting device taken along line H-H of FIG. 32.

FIGS. 32 and 33 conceptually shows only the relative arrangement of the first electrode 627 and the second electrode 628. The first electrode 627 may include the first bonding part 621 and a first branched electrode 625. The second electrode 628 may include the second bonding part 622 and a second branched electrode 626.

As shown in FIGS. 32 and 33, the light emitting device according to the embodiment may include a light emitting structure 623 disposed on the substrate 624.

The substrate 624 may be selected from the group including a sapphire substrate (Al2O3), SiC, GaAs, GaN, ZnO, Si, GaP, InP and Ge. For example, the substrate 624 may be provided as a patterned sapphire substrate (PSS) formed on an upper surface thereof with a concavo-convex pattern.

The light emitting structure 623 may include a first conductive semiconductor layer 623*a*, an active layer 623*b*, and a second conductive semiconductor layer 623*c*. The active layer 623*b* may be disposed between the first conductive semiconductor layer 623*a* and the second conductive semiconductor layer 623*c*. For example, the active layer 623*b* may be disposed on the first conductive semiconductor layer 623*a*, and the second conductive semiconductor layer 623*c* may be disposed on the active layer 623*b*.

According to the embodiment, the first conductive semiconductor layer 623*a* may be provided as an n-type semiconductor layer, and the second conductive semiconductor layer 623*c* may be provided as a p-type semiconductor layer. According to another embodiment, the first conductive semiconductor layer 623*a* may be provided as a p-type semiconductor layer, and the second conductive semiconductor layer 623*c* may be provided as an n-type semiconductor layer.

The light emitting device may include the first electrode 627 and the second electrode 628. The first electrode 627 may include the first bonding part 621 and a first branched electrode 625. The first electrode 627 may be electrically connected to the second conductive semiconductor layer 623*c*. The first branched electrode 625 may be branched from the first bonding part 621. The first branched electrode 625 may include a plurality of branched electrodes branched from the first bonding part 621. The second electrode 628 may include the second bonding part 622 and a second branched electrode 626. The second electrode 628 may be electrically connected to the first conductive semiconductor layer 623*a*. The second branched electrode 626 may be branched from the second bonding part 622. The second branched electrode 626 may include a plurality of branched electrodes branched from the second bonding part 622.

The first branched electrode 625 and the second branched electrode 626 may be alternately arranged to each other in a finger shape. The power supplied through the first bonding part 621 and the second bonding part 622 may spread to the entire light emitting structure 623 by the first branched electrode 625 and the second branched electrode 626.

The first electrode 627 and the second electrode 628 may have a single-layer or multi-layer structure. For example, the first electrode 627 and the second electrode 628 may be ohmic electrodes. For example, the first electrode 627 and the second electrode 628 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf.

Meanwhile, the light emitting structure 623 may further include a protective layer. The protective layer may be provided on an upper surface of the light emitting structure 623. In addition, the protective layer may be provided on a side surface of the light emitting structure 623. The protective layer may be provided to exposure the first bonding part 621 and the second bonding part 622. In addition, the protective layer may be selectively provided on a periphery and a lower surface of the substrate 624.

For example, the protective layer may be provided as an insulating material. For example, the protective layer may be formed of at least one material selected from the group including $SiO_y$, $SiO_xN_y$, $Si_xN_y$, and $Al_xO_y$.

In the light emitting device according to the embodiment, light generated in the active layer 623b may be emitted in six-surfaced directions of the light emitting device. The light generated in the active layer 623b may be emitted in six-surfaced directions through an upper surface, a lower surface, and four side surfaces of the light emitting device.

For reference, the vertical direction of the light emitting device described with reference to FIGS. 8 and 9 and the vertical direction of the light emitting device shown in FIGS. 32 and 33 are shown opposite to each other. According to the embodiment, the sum of the areas of the first and second bonding parts 621 and 622 may be 10% or less based on the area of the upper surface of the substrate 624. According to the light emitting device package of the embodiment, the sum of the areas of the first and second bonding parts 621 and 622 may be 10% or less based on the area of the substrate 624 to increase the light extraction efficiency by ensuring the light emitting area from the light emitting device.

In addition, according to the embodiment, the sum of the areas of the first and second bonding parts 621 and 622 may be 0.7% or more based on the area of the upper surface of the substrate 624. According to the light emitting device package of the embodiment, the sum of the areas of the first and second bonding parts 621 and 622 may be 0.7% or more based on the area of the upper surface of the substrate 624.

For example, the width of the first bonding part 621 in a long axis direction of the light emitting device may be tens of micrometers. The width of the first bonding part 621 may be in the range of 70 micrometers to 90 micrometers. In addition, the area of the first bonding part 621 may be thousands of square micrometers.

In addition, the width of the second bonding part 622 in the long axis direction of the light emitting device may be tens of micrometers. The width of the second bonding part 622 may be in the range of 70 micrometers to 90 micrometers. In addition, the area of the second bonding part 622 may be thousands of square micrometers.

The light emitting device shown in FIGS. 29 to 31 and the light emitting device shown in FIGS. 32 and 33 have been described as a structure having one light emitting cell. If the light emitting cell includes the light emitting structure, the driving voltage of the light emitting device may be a voltage applied to one light emitting cell.

Figure 48:
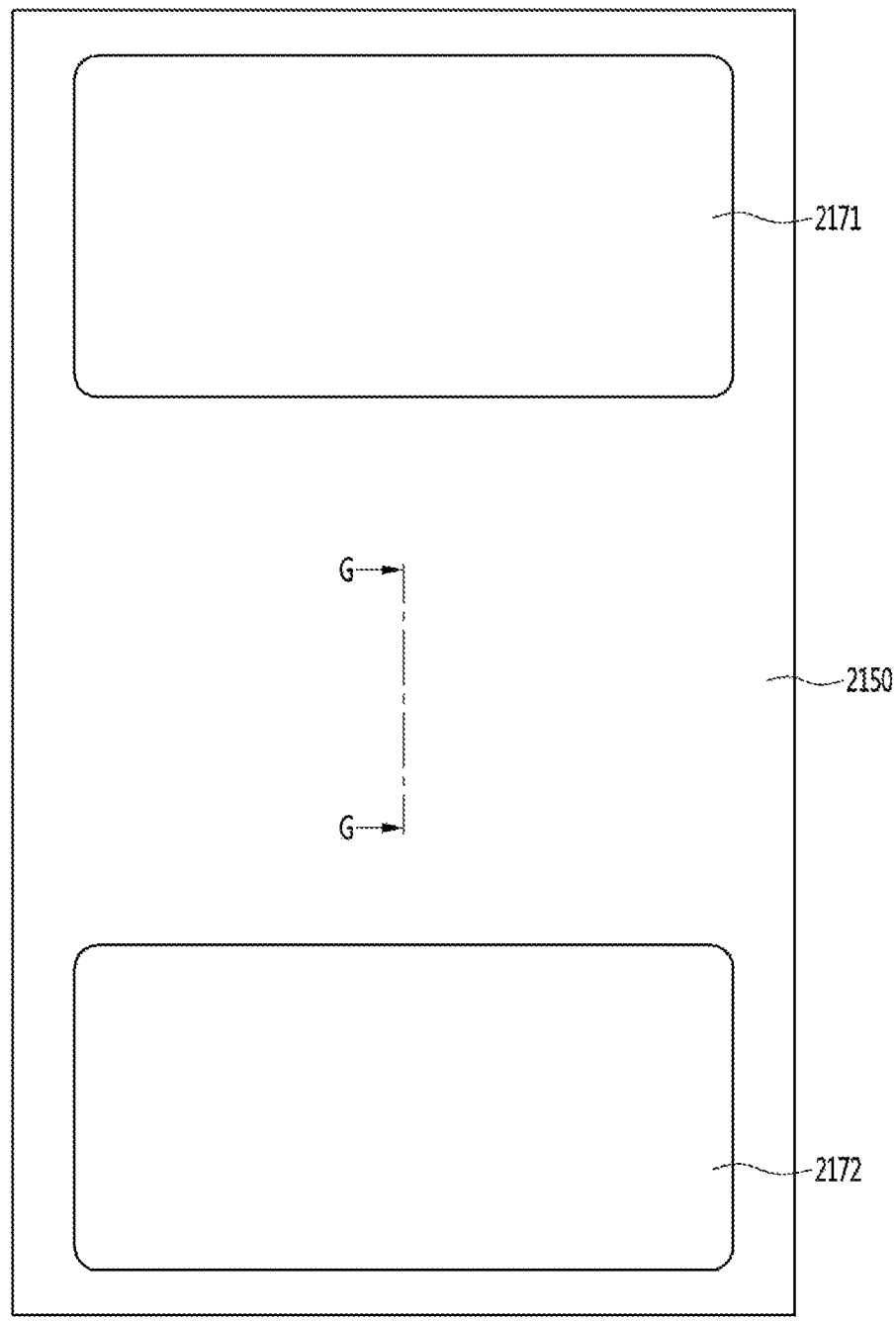
FIG. 48 is a view for describing a step in which a first bonding pad and a second bonding pad are formed by the method of manufacturing the light emitting device of FIG. 35.
Figure 49:
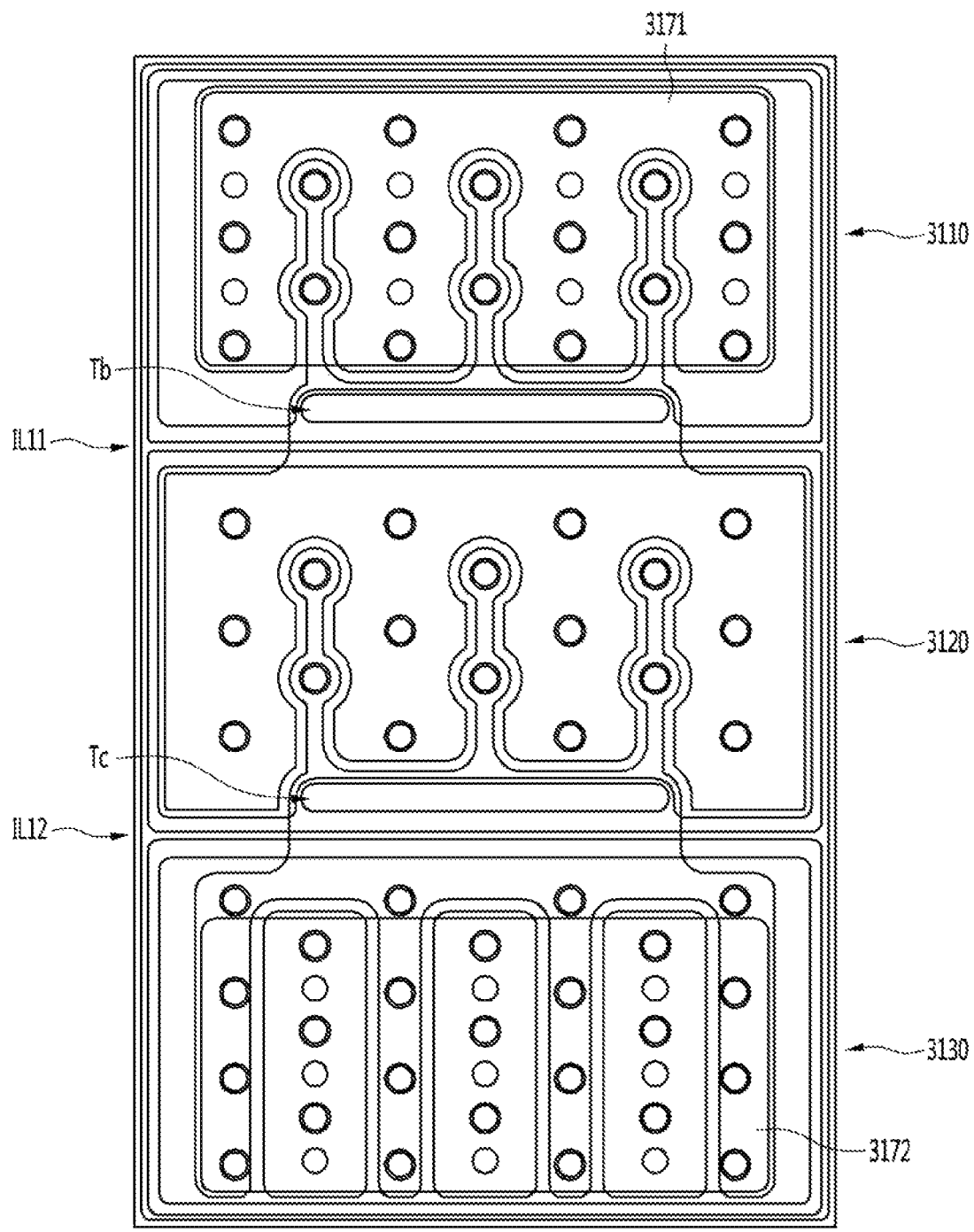
FIG. 49 is a view showing a fourth example of the light emitting device applied to the light emitting device package according to an embodiment.

FIGS. 34 to 48 show an example of a light emitting device disclosed in the embodiment, in which the light emitting device has two light emitting cells, and FIG. 49 shows an example of a light emitting device disclosed in the embodiment, in which the light emitting device has three light emitting cells. See the following description.

Figure 34:
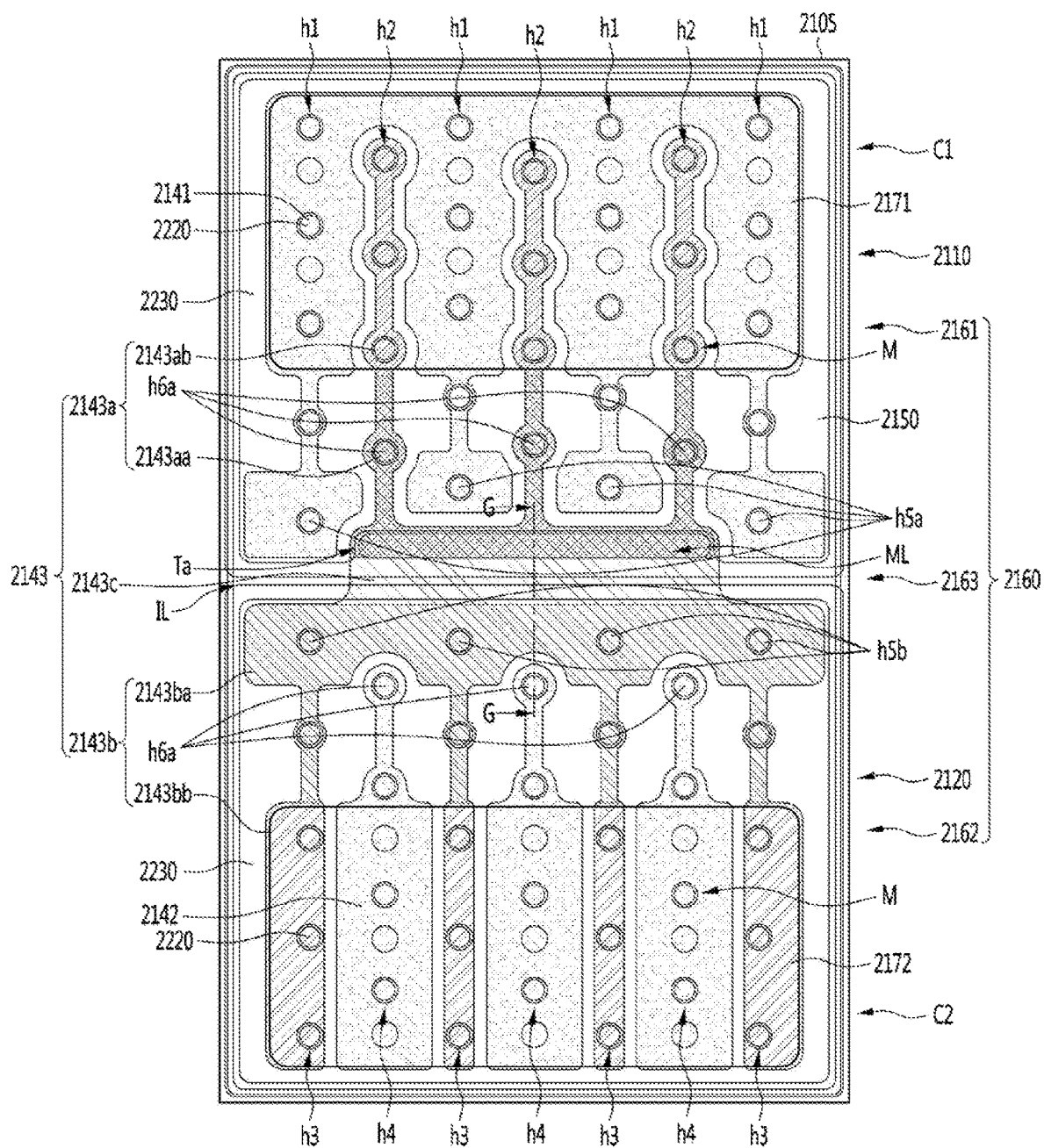
FIG. 34 is a plan view showing a third example of the light emitting device applied to the light emitting device package according to an embodiment of the present invention.

Next, another example of the light emitting device applied to the light emitting device package according to the embodiment of the present invention will be described with reference to FIGS. 34 and 35. FIG. 34 is a plan view showing a light emitting device according to an embodiment of the present invention, and FIG. 35 is a sectional view showing the light emitting device taken along line G-G of FIG. 34.

Figure 35:
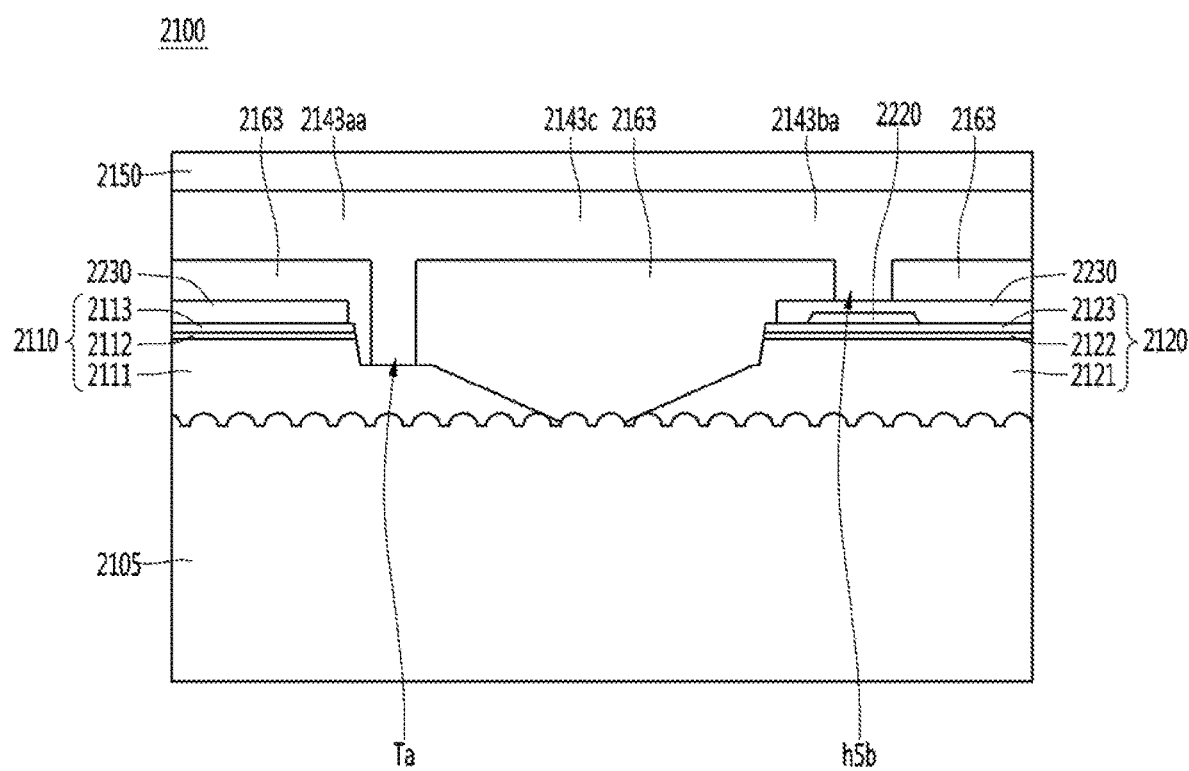
FIG. 35 is a sectional view showing the light emitting device taken along line G-G of FIG. 34.

Upon describing the light emitting device according to an embodiment with reference to FIGS. 34 and 35, the descriptions that overlap with those described above may be omitted.

In FIG. 34, although the first bonding part 2171 and the second bonding part 2172 are disposed at a lower position, a first electrode 2141 electrically connected to the first bonding part 2171 and a second electrode 2142 electrically connected to the second bonding part 2172 are shown.

As shown in FIGS. 34 and 35, the light emitting device 2100 may include a first light emitting structure 2110 and a second light emitting structure 2120, which are disposed on a substrate 2105.

The substrate 2105 may be selected from the group consisting of a sapphire substrate (Al2O3), SiC, GaAs, GaN, ZnO, Si, GaP, InP, and Ge. For example, the substrate 2105 may be provided as a patterned sapphire substrate (PSS) formed on an upper surface thereof with a concavo-convex pattern.

The first light emitting structure 2110 may include a first semiconductor layer 2111 of a first conductivity type, a first active layer 2112, and a second semiconductor layer 2113 of a second conductivity type. The first active layer 2112 may be disposed between the first semiconductor layer 2111 and the second semiconductor layer 2113. For example, the first active layer 2112 may be disposed over the first semiconductor layer 2111, and the second semiconductor layer 2113 may be disposed over the first active layer 2112.

In addition, the second light emitting structure 2120 may include a third semiconductor layer 2121 of the first conductivity type, a second active layer 2122, and a fourth semiconductor layer 2123 of the second conductivity type. The second active layer 2122 may be disposed between the third semiconductor layer 2121 and the fourth semiconductor layer 2123. For example, the second active layer 2122 may be disposed over the third semiconductor layer 2121, and the fourth semiconductor layer 2123 may be disposed over the second active layer 2122.

According to an embodiment, the first semiconductor layer 2111 and the third semiconductor layer 2121 may be n-type semiconductor layers, and the second semiconductor layer 2113 and the fourth semiconductor layer 2123 may be p-type semiconductor layers. According to another embodiment, the first semiconductor layer 2111 and the third semiconductor layer 2121 may be p-type semiconductor layers, and the second semiconductor layer 2113 and the fourth semiconductor layer 2123 may be n-type semiconductor layers.

Hereinafter, for convenience of explanation, embodiments will be described base on a case where the first semiconductor layer 2111 and the third semiconductor layer 2121 are n-type semiconductor layers, and the second semiconductor layer 2113 and the fourth semiconductor layer 2123 are p-type semiconductor layers.

In addition, in the above description, embodiments are described base on a case where the first semiconductor layer 2111 and the third semiconductor layer 2121 make contact with each other on the substrate 2105. However, a buffer layer may be further provided between the first semiconductor layer 2111 and the substrate 2105 and/or between the third semiconductor layer 2121 and the substrate 2105. For example, the buffer layer may reduce the difference in a lattice constant between the substrate 2105 and the first and second light emitting structures 2110 and 2120 and improve the crystallinity.

The first and second light emitting structures 2110 and 2120 may be provided as compound semiconductors. The first and second light emitting structures 2110 and 2120 may be provided as, for example, Group II-VI or Group III-V compound semiconductors. For example, the first and second light emitting structures 2110 and 2120 may include at least two elements selected from aluminum (Al), gallium (Ga), indium (In), phosphorus (P), arsenic (As), and nitrogen (N).

The first and third semiconductor layers 2111 and 2121 may be provided as, for example, a Group II-VI compound semiconductor or a Group III-V compound semiconductor. For example, the first and third semiconductor layers 2111 and 2121 may be formed of a semiconductor material having a composition formula of InxAlyGa1-x-yN, wherein 0≤x≤1, 0≤y≤1, and 0≤x+y≤1, or a semiconductor material having a composition formula of (AlxGa1-x)yIn1-yP, wherein 0≤x≤1, and 0≤y≤1. For example, the first and third semiconductor layers 2111 and 2121 may be selected from the group consisting of GaN, AlN, AlGaN, InGaN, InN, InAlGaN, AlInN, AlGaAs, GaP, GaAs, GaAsP, AlGaInP, AlInP, GaInP, and the like, and may be doped with an n-type dopant selected from the group consisting of Si, Ge, Sn, Se, Te, and the like.

The first and second active layers 2112 and 2122 may be provided as, for example, a Group II-VI compound semiconductor or a Group III-V compound semiconductor. For example, the first and second active layers 2112 and 2122 may be formed of a semiconductor material having a composition formula of InxAlyGa1-x-yN, wherein 0≤x≤1, 0≤y≤1, and 0≤x+y≤1, or a semiconductor material having a composition formula of (AlxGa1-x)yIn1-yP, wherein 0≤x≤1, and 0≤y≤1. For example, the first and second active layers 2112 and 2122 may be selected from the group consisting of GaN, AlN, AlGaN, InGaN, InN, InAlGaN, AlInN, AlGaAs, GaP, GaAs, GaAsP, AlGaInP, AlInP, GaInP, and the like. For example, the first and second active layers 2112 and 2122 may have a multi-well structure, and may include a plurality of barrier layers and a plurality of well layers.

The second and fourth semiconductor layers 2113 and 2123 may be provided as, for example, a Group II-VI compound semiconductor or a Group III-V compound semiconductor. For example, the second and fourth semiconductor layers 2113 and 2123 may be formed of a semiconductor material having a composition formula of InxAlyGa1-x-yN, wherein 0≤x≤1, 0≤y≤1, and 0≤x+y≤1, or a semiconductor material having a composition formula of (AlxGa1-x)yIn1-yP, wherein 0≤x≤1, and 0≤y≤1. For example, the second and fourth semiconductor layers 2113 and 2123 may be selected from the group consisting of GaN, AlN, AlGaN, InGaN, InN, InAlGaN, AlInN, AlGaAs, GaP, GaAs, GaAsP, AlGaInP, AlInP, GaInP, and the like, and may be doped with a p-type dopant selected from the group consisting of Mg, Zn, Ca, Sr, Ba, and the like.

According to an embodiment, as shown in FIG. 35, the light emitting device 2100 may include a transparent electrode layer 2230. The transparent electrode layer 2230 may improve the current injection efficiency between the second and fourth semiconductor layers 2113 and 2123 and the transparent electrode layer 2230, thereby increasing the light output of the light emitting device 2100. In addition, the transparent electrode layer 2230 may transmit light emitted from the active layer 2122. The effect of the transparent electrode layer 2230 will be described later, and the position and shape of the transparent electrode layer 2230 will described in detail when describing the method of manufacturing the light emitting device according to an embodiment.

For example, the transparent electrode layer 2230 may include at least one selected from the group consisting of a metal, a metal oxide, and a metal nitride.

The transparent electrode layer 2230 may include, for example, at least one selected from the group consisting of indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

According to an embodiment, as shown in FIGS. 34 and 35, the light emitting device 2100 may include a reflective layer 2160. The reflective layer 2160 may include a first reflective layer 2161, a second reflective layer 2162, and a third reflective layer 2163. The reflective layer 2160 may be disposed over the transparent electrode layer 2230.

The reflective layer 2160 is disposed on the transparent electrode layer 2230, so that light emitted from the active layer 2123 may be reflected by the reflective layer 2160. Accordingly, the light emitted from the active layer 2123 may be prevented from being absorbed and lost by a first electrode 2141, a second electrode 2142, and a connection electrode 2143, which will be described later, so that the light extraction efficiency of the light emitting device 2100 may be improved.

In other words, in the present embodiment, the transparent electrode layer 2230 and the reflective layer 2160 are provided to ensure electrical characteristics. However, embodiments are not limited thereto, and according to another embodiment, only the reflective layer 2160 may be provided without disposing the transparent electrode layer 2230 to ensure both electrical and optical characteristics.

The first reflective layer 2161 may be disposed over the first light emitting structure 2110. The second reflective layer 2162 may be disposed over the second light emitting structure 2120. The third reflective layer 2163 may be disposed between the first reflective layer 2161 and the second reflective layer 2162. The third reflective layer 2163 may be disposed over the first light emitting structure 2110 and the second light emitting structure 2120.

For example, the third reflective layer 2163 may be connected to the first reflective layer 2161. In addition, the third reflective layer 2163 may be connected to the second reflective layer 2162. The third reflective layer 2163 may physically make direct contact with the first reflective layer 2161 and the second reflective layer 2162. The first to third reflective layers 2161, 2162, and 2163 may be formed as one reflective layer connected to each other.

The first reflective layer 2161 may include a plurality of openings. The first reflective layer 2161 may include a plurality of first openings h1 formed in a first direction perpendicular to an upper surface of the substrate 2105. In addition, the first reflective layer 2161 may include a plurality of second openings h2 formed in the first direction.

The second reflective layer 2162 may include a plurality of openings. The second reflective layer 2162 may include a plurality of third openings h3 formed in the first direction perpendicular to the upper surface of the substrate 2105. In addition, the second reflective layer 2162 may include a plurality of fourth openings h4 formed in the first direction.

The third reflective layer 2163 may include a plurality of openings. The third reflective layer 2163 may include a plurality of fifth-a and fifth-b openings h5a and h5b formed in the first direction perpendicular to the upper surface of the substrate 2105.

In addition, the third reflective layer 2163 may include a plurality of sixth-a and sixth-b openings h6a and h6b formed in the first direction. In addition, the third reflective layer 2163 may include a line opening Ta formed in the first direction.

The line opening Ta may extend in a second direction perpendicular to the first direction. The line opening Ta may be disposed between the first light emitting structure 2110 and the second light emitting structure 2120 to allow the first and second light emitting structures 2110 and 2120 to be electrically connected to each other in series, such that a first electrode of the first light emitting structure 2110 and a second electrode of the second light emitting structure 2120 are connected to each other.

At this time, if an area of the first electrode is wider than an area of the second electrode, it may be advantageous in terms of current diffusion and current injection characteristics in a serial-connection structure. Therefore, the line opening Ta may be connected to the first electrode of the first light emitting structure 2110 while being disposed at a position adjacent to the second light emitting structure 2120, and may have an area wider than the area of the fifth-b opening h5b facing the line opening Ta.

For example, as shown in FIG. 35, the third reflective layer 2163 may include a line opening Ta and a fifth-b opening h5b. The line opening Ta may expose the upper surface of the first semiconductor layer 2111. The fifth-b opening h5b may expose the upper surface of the transparent electrode layer 2230 disposed over the fourth semiconductor layer 2123.

According to an embodiment, a current diffusion layer 2220 may be further provided under the fifth-b opening h5b. The current diffusion layer 2220 may be disposed between the fourth semiconductor layer 2123 and the transparent electrode layer 2230.

The position and shape of the reflective layer 2160, the transparent electrode layer 2230, and the current diffusion layer 2220 according to the embodiment will be described in detail when describing the method of manufacturing the light emitting device according to an embodiment.

The reflective layer 2160 may be provided as an insulating reflective layer. For example, the reflective layer 2160 may be provided as a distributed Bragg reflector (DBR) layer. In addition, the reflective layer 2160 may be provided as an omni-directional reflector (ODR) layer. In addition, the reflective layer 2160 may be formed by stacking a DBR layer and an ODR layer.

According to an embodiment, as shown in FIGS. 34 and 35, the light emitting device 2100 may include a first electrode 2141, a second electrode 2142, and a connection electrode 2143.

According to an embodiment, the first electrode 2141 and the second electrode 2142 may be spaced apart from each other. The connection electrode 2143 may be disposed between the first electrode 2141 and the second electrode 2142.

The first electrode 2141 may be disposed over the first reflective layer 2161. A portion of the first electrode 2141 may be disposed over the third reflective layer 2163.

The first electrode 2141 may be electrically connected to the second semiconductor layer 2113. The first electrode 2141 may be electrically connected to the second semiconductor layer 2113 through the first openings h1. The first electrode 2141 may make direct contact with the transparent electrode layer 2230 disposed under the first openings h1 in a region where the first light emitting structure 2110 is provided. The first electrode 2141 may make direct contact with the upper surface of the transparent electrode layer 2230 exposed through the first openings h1 in the region where the first light emitting structure 2110 is provided.

The second electrode 2142 may be disposed over the second reflective layer 2162. A portion of the second electrode 2142 may be disposed over the third reflective layer 2163.

The second electrode 2142 may be electrically connected to the third semiconductor layer 2121. The second electrode 2142 may be electrically connected to the third semiconductor layer 2121 through the fourth openings h4. The second electrode 2142 may make direct contact with the third semiconductor layer 2121 disposed under the fourth openings h4 in a region where the second light emitting structure 2120 is provided. The second electrode 2142 may make direct contact with the upper surface of the third semiconductor layer 2121 exposed through the fourth openings h4 in the region where the second light emitting structure 2120 is provided.

The connection electrode 2143 may be disposed over the third reflective layer 2163. A portion of the connection electrode 2143 may be disposed over the first reflective layer 2161. A portion of the connection electrode 2143 may be disposed over the second reflective layer 2162.

The connection electrode 2143 may be electrically connected to the first semiconductor layer 2111 and the fourth semiconductor layer 2123.

The connection electrode 2143 may include a first portion 2143a disposed on the first semiconductor layer 2111, a second portion 2143b disposed on the fourth semiconductor layer 2123, and a third portion 2143c for connecting the first portion 2143a to the second portion 2143b.

The connection electrode 2143 may include the first portion 2143a disposed over the region where the first light emitting structure 2110 is provided. The connection electrode 2143 may include the second portion 2143b disposed over the region where the second light emitting structure 2120 is provided. The connection electrode 2143 may include the third portion 2143c disposed over a boundary region between the first light emitting structure 2110 and the second light emitting structure 2120.

According to an embodiment, the first portion 2143a may include a first electrode portion 2143aa and a second electrode portion 2143ab.

The first portion 2143a may be electrically connected to the first semiconductor layer 2111 through the second openings h2, the sixth-a openings h6a, and the line opening Ta.

The second electrode portion 2143ab of the first portion 2143a may make direct contact with the upper surface of the first semiconductor layer 2111 through the second openings h2 in the region where the first light emitting structure 2110 is provided.

The first electrode portion 2143aa of the first portion 2143a may make direct contact with the upper surface of the first semiconductor layer 2111 through the sixth-a openings h6a in the region where the first light emitting structure 2110 is provided.

In addition, the first electrode portion 2143aa of the first portion 2143a may make direct contact with the upper surface of the first semiconductor layer 2111 through the line opening Ta in the region where the first light emitting structure 2110 is provided.

According to an embodiment, the second portion 2143b may include a third electrode portion 2143ba and a fourth electrode portion 2143bb.

The second portion 2143b may be electrically connected to the fourth semiconductor layer 2123 through the third openings h3 and the fifth-b openings h5b.

The fourth electrode portion 2143bb of the second portion 2143b may make contact with the upper surface of the fourth semiconductor layer 2123 through the third openings h3 in the region where the second light emitting structure 2120 is provided.

The fourth electrode portion 2143bb of the second portion 2143b may make direct contact with the transparent electrode layer 2230 disposed under the third openings h3 in the region where the second light emitting structure 2120 is provided. The fourth electrode portion 2143*bb* of the second portion 2143*b* may make direct contact with the upper surface of the transparent electrode layer 2230 exposed through the third openings h3 in the region where the second light emitting structure 2120 is provided.

The third electrode portion 2143*ba* of the second portion 2143*b* may make contact with the upper surface of the fourth semiconductor layer 2123 through the fifth-b openings h5*b* in the region where the second light emitting structure 2120 is provided.

The third electrode portion 2143*ba* of the second portion 2143*b* may make direct contact with the transparent electrode layer 2230 disposed under the fifth-b openings h5*b* in the region where the second light emitting structure 2120 is provided. The third electrode portion 2143*ba* of the second portion 2143*b* may make direct contact with the upper surface of the transparent electrode layer 2230 exposed through the fifth-b openings h5*b* in the region where the second light emitting structure 2120 is provided.

According to an embodiment, the third portion 2143*c* of the connection electrode 2143 may be disposed on a boundary region between the first light emitting structure 2110 and the second light emitting structure 2120. The third portion 2143*c* of the connection electrode 2143 may be electrically connected to the first portion 2143*a* and the second portion 2143*b*.

According to the light emitting device of an embodiment, the first electrode 2141 may be electrically connected to the second semiconductor layer 2113. The second electrode 2142 may be electrically connected to the third semiconductor layer 2121. In addition, the connection electrode 2143 may be electrically connected to the first semiconductor layer 2111 and the fourth semiconductor layer 2123.

Therefore, according to an embodiment, as the power is supplied to the first electrode 2141 and the second electrode 2142, the first electrode 2141, the second semiconductor layer 2113, the first semiconductor layer 2111, the connection electrode 2143, the fourth semiconductor layer 2123, the third semiconductor layer 2121, and the second electrode 2142 may be electrically connected to each other in series.

According to an embodiment, an area of the first electrode portion 2143*ab* making contact with the first semiconductor layer 2111 may be larger than an area of the third electrode portion 2143*ba* making contact with the fourth semiconductor layer 2123.

In the region where the first light emitting structure 2110 is provided, the area of the first electrode portion 2143*ab* making contact with the first semiconductor layer 2111 may correspond to an area obtained by summing up an area of the first electrode portion 2143*ab* making direct contact with the upper surface of the first semiconductor layer 2111 through the sixth-a openings h6*a* with an area of the first electrode portion 2143*ab* making direct contact with the upper surface of the first semiconductor layer 2111 through the line opening Ta.

In addition, the area of the third electrode portion 2143*ba* making contact with the fourth semiconductor layer 2123 may correspond to an area of the third electrode portion 2143*ba* making direct contact with the transparent electrode layer 2230 disposed under the fifth-b openings h5*b* in the region where the second light emitting structure 2120 is provided. The area of the third electrode portion 2143*ba* making contact with the fourth semiconductor layer 2123 may correspond to an area of the third electrode portion 2143*ba* making direct contact with the upper surface of the transparent electrode layer 2230 exposed through the fifth-b openings h5*b* in the region where the second light emitting structure 2120 is provided.

For example, the area of the first electrode portion 2143*ab* making contact with the first semiconductor layer 2111 may be 1.4% or more and 3.3% or less of the lower surface area of the substrate 2105. The area of the third electrode portion 2143*ba* making contact with the fourth semiconductor layer 2123 may be 0.7% or more and 3.0% or less of the lower surface area of the substrate 2105.

According to an embodiment, the area of the first electrode portion 2143*ab* making contact with the first semiconductor layer 2111 may be, for example, in a range of 1.1 times to 2 times based on the area of the third electrode portion 2143*ba* making contact with the fourth semiconductor layer 2123.

As described above, the area of the first electrode portion 2143*ab* making contact with the first semiconductor layer 2111 is set to be larger than the area of the third electrode portion 2143*ba* making contact with the fourth semiconductor layer 2123, so that the carrier may be smoothly diffused, and the operating voltage may be prevented from being increased.

The first electrode 2141, the second electrode 2142, and the connection electrode 2143 may have a single-layer structure or a multi-layer structure. For example, the first electrode 2141, the second electrode 2142, and the connection electrode 2143 may be ohmic electrodes. For example, the first electrode 2141, the second electrode 2142, and the connection electrode 2143 may be at least one of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, or an alloy of at least two materials among the above materials.

According to an embodiment, as shown in FIG. 35, the light emitting device 2100 may include a protective layer 2150. Meanwhile, for further understanding, the protective layer 2150 is not shown in FIG. 34 to clearly show the arrangement of the first electrode 2141, the second electrode 2142, the connection electrode 2143, and the reflective layer 2160, which are disposed under the protective layer 2150.

The protective layer 2150 may be disposed over the first electrode 2141, the second electrode 2142, and the connection electrode 2143.

The protective layer 2150 may be disposed over the reflective layer 2160. The protective layer 2150 may be disposed over the first reflective layer 2161, the second reflective layer 2162, and the third reflective layer 2163.

The position and shape of the protective layer 2150 will be described in detail when describing the method of manufacturing the light emitting device according to an embodiment.

For example, the protective layer 2150 may be formed of an insulating material. For example, the protective layer 2150 may be formed of at least one material selected from the group consisting of SixOy, SiOxNy, SixNy, and AlxOy.

According to an embodiment, as shown in FIG. 34, the light emitting device 2100 may include a first bonding part 2171 and a second bonding part 2172, which are disposed over the protective layer 2150.

The first bonding part 2171 may be disposed over the first reflective layer 2161. The second bonding part 2172 may be disposed over the second reflective layer 2162. The second bonding part 2172 may be spaced apart from the first bonding part 2171.

The first bonding part 2171 may be disposed over the first electrode 2141. The first bonding part 2171 may be electrically connected to the first electrode 2141.

The first bonding part 2171 may be disposed over the first light emitting structure 2110. The first bonding part 2171 may be disposed over the second semiconductor layer 2113.

The first bonding part 2171 may be disposed over the connection electrode 2143. The first bonding part 2171 may be disposed over the first portion 2143a of the connection electrode 2143. The first bonding part 2171 may be disposed over the second electrode portion 2143ab of the connection electrode 2143.

The second bonding part 2172 may be disposed over the second electrode 2142. The second bonding part 2172 may be electrically connected to the second electrode 2142.

The second bonding part 2172 may be disposed over the second light emitting structure 2120. The second bonding part 2172 may be disposed over the fourth semiconductor layer 2123.

The second bonding part 2172 may be disposed over the connection electrode 2143. The second bonding part 2172 may be disposed over the second portion 2143b of the connection electrode 2143. The second bonding part 2172 may be disposed over the fourth electrode portion 2143bb of the connection electrode 2143.

According to an embodiment, as shown in FIG. 34, the connection electrode 2143 may include a first portion 2143a disposed on the first semiconductor layer 2111, a second portion 2143b disposed on the fourth semiconductor layer 2123, and a third portion 2143c for connecting the first portion 2143a to the second portion 2143b.

The first portion 2143a of the connection electrode 2143 may include a first electrode portion 2143aa that does not overlap with the first bonding part 2171 in the first direction perpendicular to the upper surface of the substrate 2105, and a second electrode portion 2143ab that overlaps with the first bonding part 2171.

The second portion 2143b of the connection electrode 2143 may include a third electrode portion 2143ba that does not overlap with the second bonding part 2172 in the first direction, and a fourth electrode portion 2143bb that overlaps with the second bonding part 2172.

According to an embodiment, an area of the first electrode portion 2143ab making contact with the first semiconductor layer 2111 may be larger than an area of the third electrode portion 2143ba making contact with the fourth semiconductor layer 2123.

For example, the area of the first electrode portion 2143ab making contact with the first semiconductor layer 2111 may be 1.4% or more and 3.3% or less of the lower surface area of the substrate 2105. The area of the third electrode portion 2143ba making contact with the fourth semiconductor layer 2123 may be 0.7% or more and 3.0% or less of the lower surface area of the substrate 2105.

According to an embodiment, the area of the first electrode portion 2143ab making contact with the first semiconductor layer 2111 may be, for example, in a range of 1.1 times to 2 times based on the area of the third electrode portion 2143ba making contact with the fourth semiconductor layer 2123.

If an area where the first electrode portion 2143ab and the first semiconductor layer 2111 make contact with each other is wider than an area where the third electrode portion 2143ba and the fourth semiconductor layer 2123 make contact with each other, it may be advantageous in terms of current diffusion and current injection characteristics in a structure where the first semiconductor layer 2111 and the fourth semiconductor layer 2123 are connected to each other in series.

In addition, the area of the first electrode portion 2143ab making contact with the first semiconductor layer 2111 may be 1.4% or more of the lower surface area of the substrate 2105, so that the current diffusion in the first semiconductor layer 2111 may be efficiently performed. The area of the first electrode portion 2143ab making contact with the first semiconductor layer 2111 may be 3.3% or less of the lower surface area of the substrate 2105, so that an area of the first active layer 2112 to be etched by the first electrode portion 2143ab may be adjusted, and the light extraction efficiency of the first light emitting structure 2110 may be improved.

The area of the third electrode portion 2143ba making contact with the fourth semiconductor layer 2123 may be 0.7% or more of the lower surface area of the substrate 2105, so that the current diffusion in the fourth semiconductor layer 213 may be efficiently performed. The area of the third electrode portion 2143ba making contact with the fourth semiconductor layer 2123 may be 3.0% or less of the lower surface area of the substrate 2105, so that an amount of light absorbed and lost in the third electrode portion 2143ba may be reduced, and the light extraction efficiency of the second light emitting structure 2120 may be improved.

According to an embodiment, as the power is applied to the first bonding part 2171 and the second bonding part 2172, the first and second light emitting structures 2110 and 2120 may emit light.

As the power is supplied to the first bonding part 2171 and the second bonding part 2172, the first bonding part 2171, the first electrode 2141, the second semiconductor layer 2113, the first semiconductor layer 2111, the connection electrode 2143, the fourth semiconductor layer 2123, the third semiconductor layer 2121, the second electrode 2142, and the second bonding part 2172 may be electrically connected to each other in series.

According to an embodiment, a high voltage may be applied between the first bonding part 2171 and the second bonding part 2172. The applied high voltage may be distributed and supplied to the first and second light emitting structures 2110 and 2120 through the first electrode 2141, the connection electrode 2143, and the second electrode 2142.

As described above, according to the light emitting device 2100 of an embodiment, the first bonding part 2171 and the first electrode 2141 may make contact with each other at a plurality of regions. In addition, the second bonding part 2172 and the second electrode 2142 may make contact with each other in a plurality of regions. Therefore, according to an embodiment, since the power may be supplied through a plurality of regions, a contact area is increased and the contact regions are distributed, so that the current distribution effect may be generated and the operating voltage may be reduced.

In addition, when the power is applied to the first bonding part 2171 and the second bonding part 2172, the area of the first electrode portion 2143ab making contact with the first semiconductor layer 2111 is set to be larger than the area of the third electrode portion 2143ba making contact with the fourth semiconductor layer 2123, so that the carrier may be smoothly diffused, and the operating voltage may be prevented from being increased.

According to an embodiment, the light emitting device may be connected to an external power source by a flip chip bonding scheme. For example, when manufacturing the light emitting device package, the upper surface of the first bonding part 2171 and the upper surface of the second bonding part 2172 may be attached to a sub-mount, a lead frame, a circuit board, or the like.

When the light emitting device according to the embodiment is mounted by the flip chip bonding scheme and implemented as a light emitting device package, light emitted from the first and second light emitting structures 2110 and 2120 may be radiated through the substrate 2105. The light emitted from the first and second light emitting structures 2110 and 2120 may be reflected by the first to third reflective layers 2161, 2162, and 2163, and may be radiated toward the substrate 2105.

In addition, according to the light emitting device and the light emitting device package of an embodiment, since the first bonding part 2171 and the second bonding part 2172, which have a large area, may be directly bonded to the circuit board for providing the power, the flip chip bonding process may be easily and stably performed.

According to an embodiment, the size of the first reflective layer 2161 may be several micrometers larger than the size of the first bonding part 2171. For example, the area of the first reflective layer 2161 may be large enough to completely cover the area of the first bonding part 2171. Considering process errors, the length of one side of the first reflective layer 2161 may be larger than the length of one side of the first bonding part 2171, for example, by about 4 micrometers to 10 micrometers.

In addition, the size of the second reflective layer 2162 may be several micrometers larger than the size of the second bonding part 2172. For example, the area of the second reflective layer 2162 may be large enough to completely cover the area of the second bonding part 2172. Considering process errors, the length of one side of the second reflective layer 2162 may be larger than the length of one side of the second bonding part 2172, for example, by about 4 micrometers to 10 micrometers.

According to an embodiment, due to the first reflective layer 2161 and the second reflective layer 2162, the light emitted from the first and second light emitting structures 2110 and 2120 may be reflected without being incident on the first bonding part 2171 and the second bonding part 2172. Therefore, according to an embodiment, it is possible to minimize the light generated and emitted from the first and second light emitting structures 2110 and 2120 being incident and lost on the first bonding part 2171 and the second bonding part 2172.

In addition, according to the light emitting device 2100 of an embodiment, since the third reflective layer 2163 is disposed between the first bonding part 2171 and the second bonding part 2172, the light emission between the first bonding part 2171 and the second bonding part 2172 may be reduced.

In addition, the minimum interval between the first bonding part 2171 and the second bonding part 2172 may be equal to or larger than 125 micrometers. The minimum interval between the first bonding part 2171 and the second bonding part 2172 may be determined in consideration of an interval between the first electrode pad and the second electrode pad of the package body on which the light emitting device 2100 is mounted.

For example, the minimum interval between the first electrode pad and the second electrode pad of the package body may have a minimum of 125 micrometers, and a maximum of 200 micrometers. In this case, considering the process error, the interval between the first bonding part 2171 and the second bonding part 2172 may be, for example, 125 micrometers or more, and 300 micrometers or less.

In addition, if the interval between the first bonding part 2171 and the second bonding part 2172 is larger than 125 micrometers, a minimum space may be ensured, so that a short circuit may not occur between the first bonding part 2171 and the second bonding part 2172 of the light emitting device, and a light emitting area for improving the light extraction efficiency may be ensured, so that the brightness Po of the light emitting device 2100 may be increased.

In addition, if the interval between the first bonding part 2171 and the second bonding part 2172 is 300 micrometers or less, the first electrode pad and the second electrode pad of the light emitting device package and the first bonding part 2171 and the second bonding part 2172 of the light emitting device may be bonded to each other with sufficient bonding strength, and the electrical characteristics of the light emitting device 2100 may be ensured.

The minimum interval between the first bonding part 2171 and the second bonding part 2172 may be set to be larger than 125 micrometers to ensure optical characteristics, and may be set to be smaller than 300 micrometers to ensure the reliability due to the electrical characteristics and bonding strength.

In an embodiment, the interval between the first bonding part 2171 and the second bonding part 2172 is illustrated to be 125 micrometers or more and 300 micrometers or less. However, embodiments are not limited thereto, and the interval between the first bonding part 2171 and the second bonding part 2172 may be smaller than 125 micrometers to improve the electrical characteristics or reliability of the light emitting device package, or may be larger than 300 micrometers to improve the optical characteristics.

In addition, according to the light emitting device 2100 of an embodiment, the first reflective layer 2161 is disposed under the first electrode 2141, and the second reflective layer 2162 is disposed under the second electrode 2142. Accordingly, the first reflective layer 2161 and the second reflective layer 2162 may reflect the light emitted from the first and second active layers 2112 and 2122 of the first and second light emitting structures 2110 and 2120 to minimize light absorption occurring at the first electrode 2141 and the second electrode 2142, thereby improving the brightness Po.

For example, the first reflective layer 2161 and the second reflective layer 2162 may be formed of an insulating material, and may be formed of a material having a high reflectance, for example, a DBR structure to reflect the light emitted from the active layer.

The first reflective layer 2161 and the second reflective layer 2162 may have a DBR structure in which materials having mutually different refractive indexes are alternately arranged. For example, the first reflective layer 2161 and the second reflective layer 2162 may be arranged in a single-layer structure or a lamination structure including at least one of $TiO_2$, $SiO_2$, $Ta_2O_5$, and $HfO_2$.

In addition, according to another embodiment, but embodiments are not limited thereto, the first reflective layer 2161 and the second reflective layer 2162 may be freely selected to control a reflectance with respect to the light emitted from the first and second active layers 2112 and 2122 according to the wavelength of the light emitted from the first and second active layers 2112 and 2122.

In addition, according to another embodiment, the first reflective layer 2161 and the second reflective layer 2162 may be provided as an ODR layer. According to still another embodiment, the first reflective layer 2161 and the second reflective layer 2162 may be provided in a hybrid form in which a DBR layer and an ODR layer are stacked.

For example, the first bonding part 2171 and the second bonding part 2172 may be formed of Au, AuTi, or the like, thereby stably performing the mounting process. In addition, the first bonding part 2171 and the second bonding part 2172 may be formed in a single layer or a multi-layer by using at least one material among Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/Au/ITO, and the like, or an alloy thereof.

As described above, the light emitting device 2100 according to the embodiment may be, for example, mounted by a flip chip bonding scheme, and provided in the form of a light emitting device package. In this case, if the package body on which the light emitting device 2100 is mounted is formed of a resin or the like, in the lower region of the light emitting device 2100, the package body may be discolored or cracked due to strong light having a short wavelength and emitted from the light emitting device 2100.

However, according to the light emitting device 2100 of an embodiment, it is possible to reduce the light emission between the regions where the first bonding part 2171 and the second bonding part 2172 are disposed, thereby preventing the package body disposed in the lower region of the light emitting device 2100 from being discolored or cracked.

Hereinafter, a method of manufacturing a light emitting device according to an embodiment will be described with reference to the accompanying drawings. Upon describing the method of manufacturing the light emitting device according to an embodiment, the descriptions that overlap with those described above with reference to FIGS. 34 and 35 may be omitted.

Figure 36:
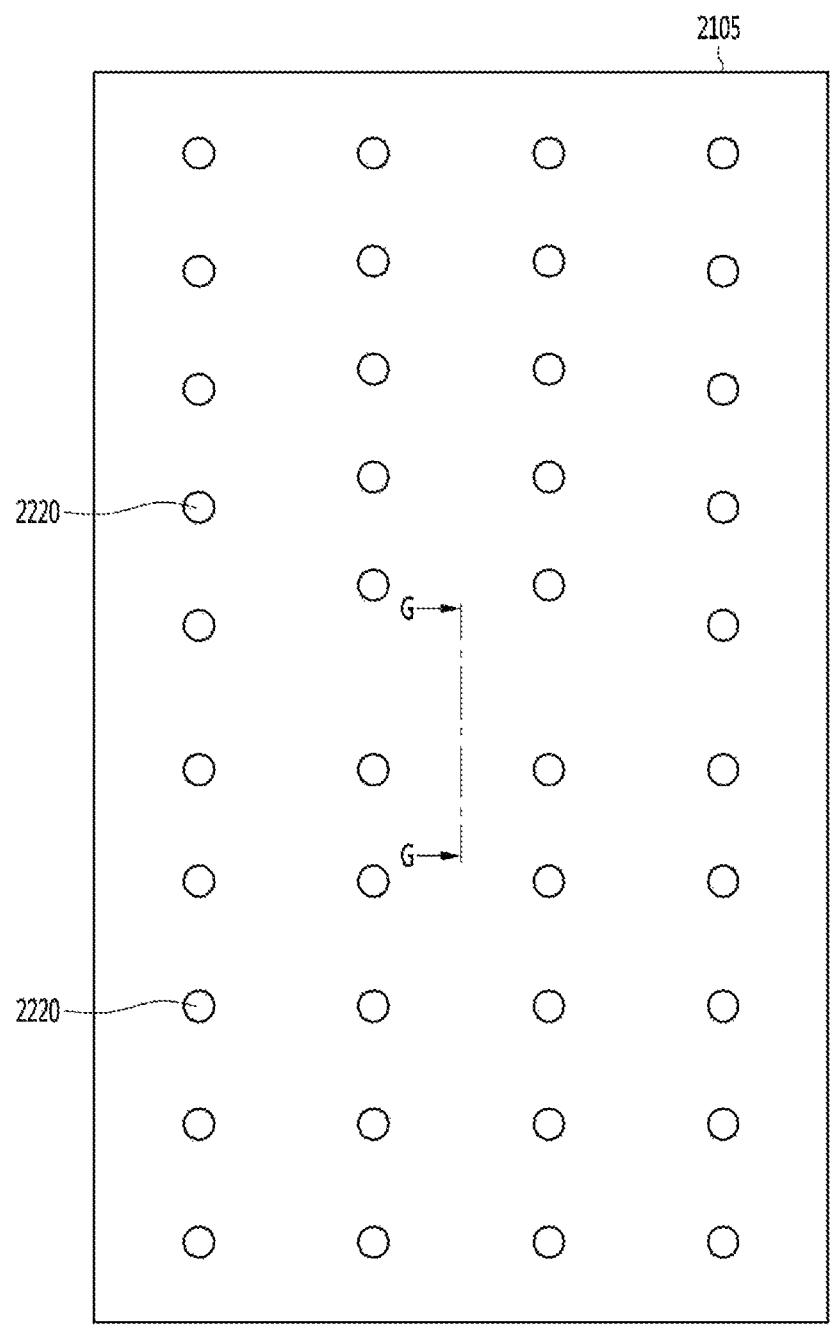
FIGS. 36 and 37 are views for describing a step in which a semiconductor layer is formed by a method of manufacturing the light emitting device of FIG. 35.
Figure 37:
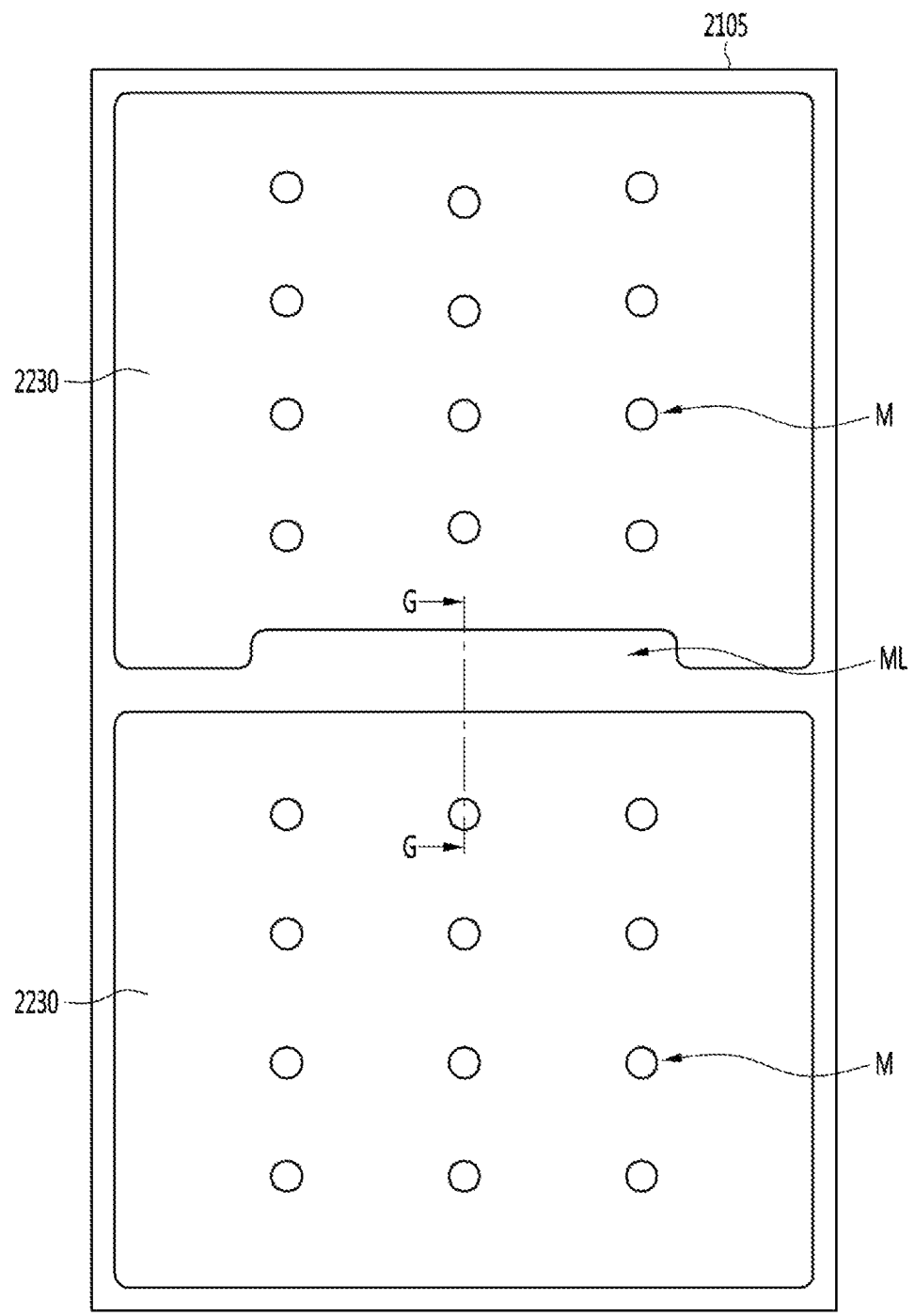

First, according to the method of manufacturing the light emitting device of an embodiment, as shown in FIGS. 36 and 37, a light emitting structure may be formed on a substrate 2105. FIG. 36 is a plan view showing the shape of the light emitting structure formed by the method of manufacturing the light emitting device according to an embodiment, and FIG. 37 is a plan view showing a result of performing a unit process shown in FIG. 36.

Referring to FIGS. 35 to 37, a light emitting structure may be formed on the substrate 2105. For example, a first conductive semiconductor layer, an active layer, and a second conductive semiconductor layer may be formed on the substrate 2105.

A current diffusion layer 2220 may be formed on the light emitting structure. The current diffusion layer 2220 may be formed on the second conductive semiconductor layer. The current diffusion layer 2220 may be provided in plural layers and may be spaced apart from each other.

For example, the current diffusion layer 2220 may be formed of an oxide, a nitride or the like.

Figure 38:
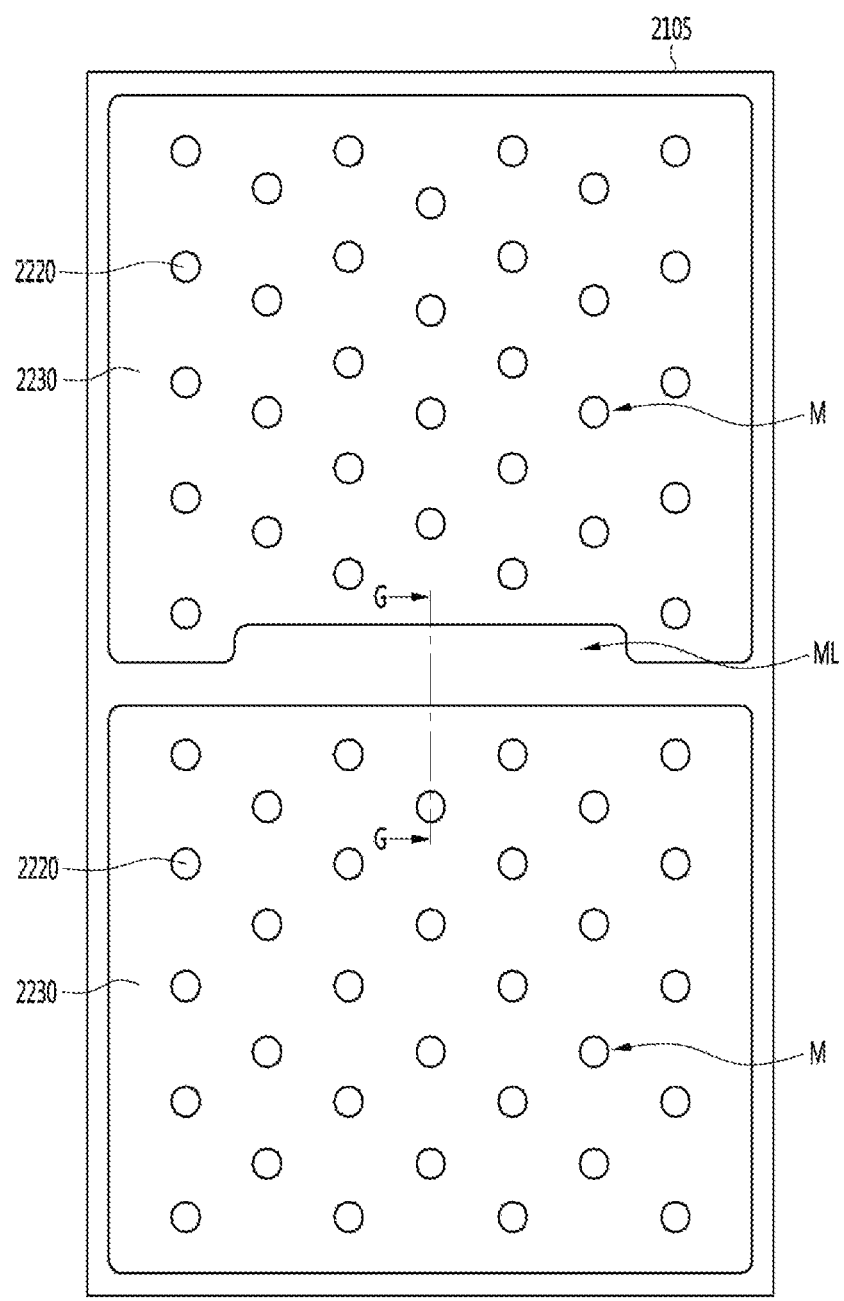
FIGS. 38 and 39 are views for describing a step in which a transparent electrode layer is formed by the method of manufacturing the light emitting device of FIG. 35.
Figure 39:
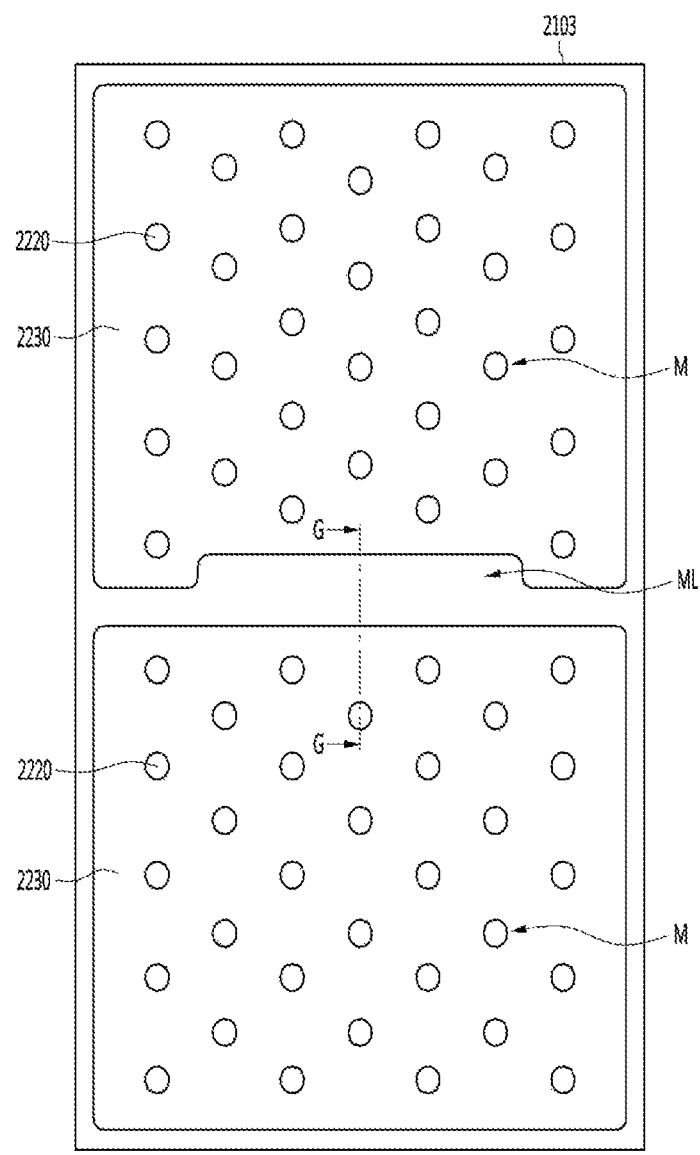

Next, as shown in FIGS. 38 and 39, a transparent electrode layer 2230 may be formed. FIG. 38 is a plan view showing the shape of the transparent electrode layer formed by the method of manufacturing the light emitting device according to an embodiment, and FIG. 39 is a plan view showing a result of performing the unit process shown in FIG. 38.

Referring to FIGS. 35, 38, and 39, the transparent electrode layer 2230 may be formed on the light emitting structure, and a mesa etching may be performed. The transparent electrode layer 2230 may be formed on the second conductive semiconductor layer 103, and a mesa etching process for exposing the first conductive semiconductor layer may be performed.

According to an embodiment, a partial region of the first conductive semiconductor layer may be exposed through the mesa etching process. A plurality of mesa recesses M exposing a partial region of the first conductive semiconductor layer may be formed by the mesa etching process. In addition, a mesa recess line ML in which the light emitting structure is divided into a first light emitting structure 2110 and a second light emitting structure 2120 may be formed by the mesa etching process.

The first light emitting structure 2110 may include a first semiconductor layer 2111 of a first conductivity type, a first active layer 2112, and a second semiconductor layer 2113 of a second conductivity type. In addition, the second light emitting structure 2120 may include a third semiconductor layer 2121 of the first conductivity type, a second active layer 2122, and a fourth semiconductor layer 2123 of the second conductivity type.

According to an embodiment, the upper surface of the first semiconductor layer 2111 or the upper surface of the third semiconductor layer 2121 may be exposed at a region of the mesa recesses M. In addition, the boundary region between the first semiconductor layer 2111 and the third semiconductor layer 2121 may be exposed at a region of the mesa recess line ML.

For example, the mesa recess M may be provided in a plurality of circular shapes. The mesa recess M may be provided in various shapes such as an elliptical shape or a polygonal shape, as well as the circular shape.

In addition, the mesa recess line ML may be formed in a line shape having a predetermined width. For example, the mesa recess line ML may have mutually different widths according to regions.

According to an embodiment, the transparent electrode layer 2230 may be formed on the second conductive semiconductor layer. The transparent electrode layer 2230 may include a plurality of openings formed in a region corresponding to the mesa recesses M.

The transparent electrode layer 2230 may include a line-shaped opening formed in a region corresponding to the mesa recess line ML.

Figure 40:
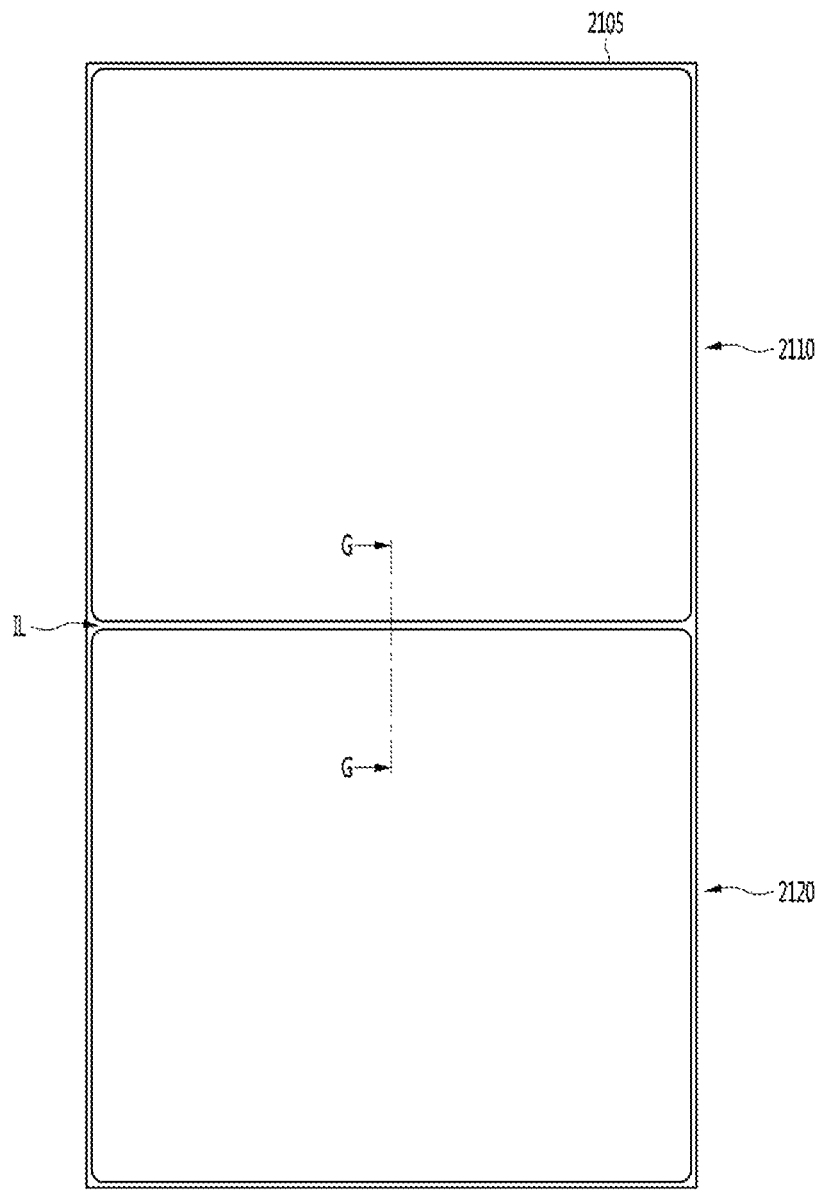
FIGS. 40 and 41 are views for describing a step in which an isolation process is performed by the method of manufacturing the light emitting device of FIG. 35.
Figure 41:
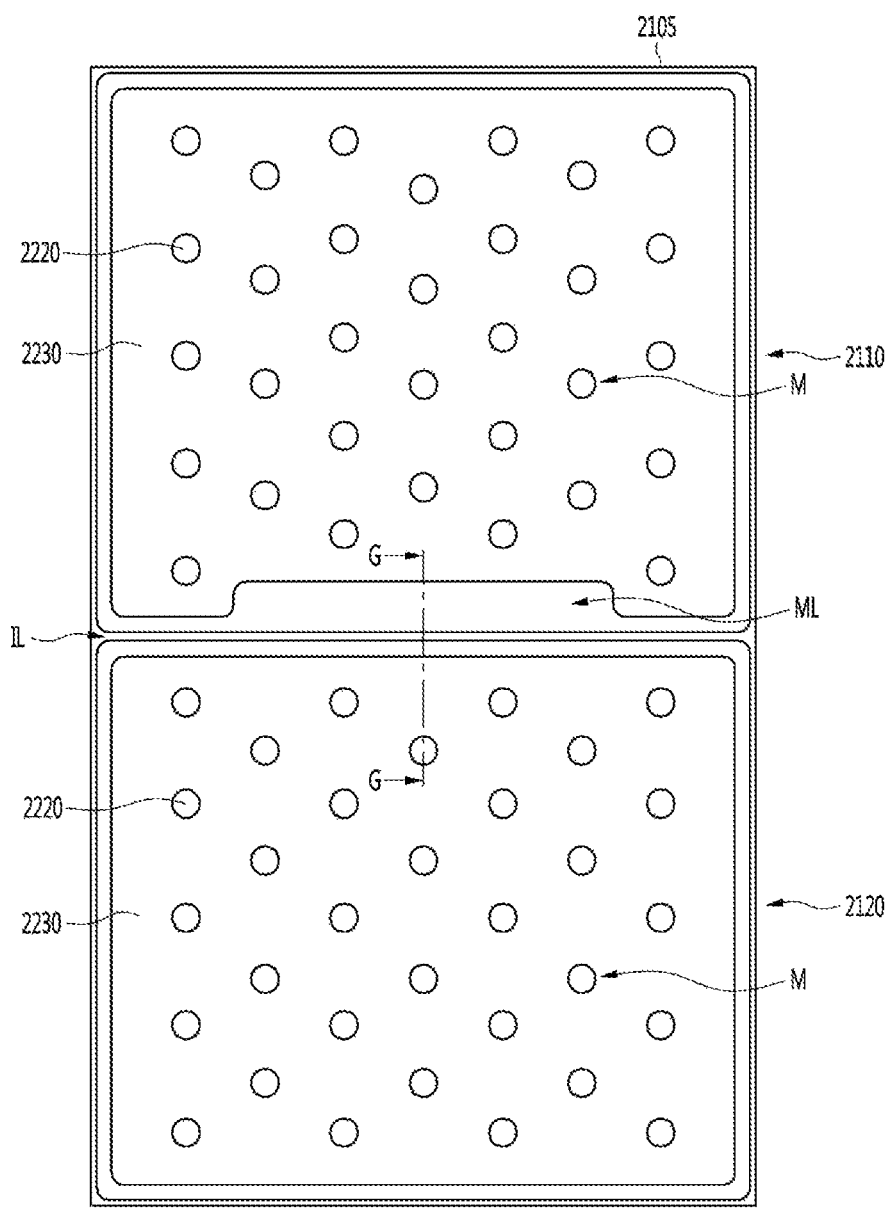

Next, as shown in FIGS. 40 and 41, an isolation process may be performed. FIG. 40 is a plan view showing a shape of a mask in which an isolation process is performed by the method of manufacturing the light emitting device according to an embodiment, and FIG. 41 is a plan view showing a result of performing the unit process shown in FIG. 40.

Referring to FIGS. 35, 40 and 41, an isolation process for separating the first light emitting structure 2110 from the second light emitting structure 2120 may be performed.

An isolation line IL for separating the first light emitting structure 2110 from the second light emitting structure 2120 may be formed by the isolation process. The upper surface of the substrate 2105 may be exposed at a region where the isolation line IL is formed.

The first light emitting structure 2110 and the second light emitting structure 2120 may be electrically separated from each other. The first semiconductor layer 2111 and the third semiconductor layer 2121 may be provided separately from each other. The first semiconductor layer 2111 and the third semiconductor layer 2121 may be electrically separated from each other.

Figure 42:
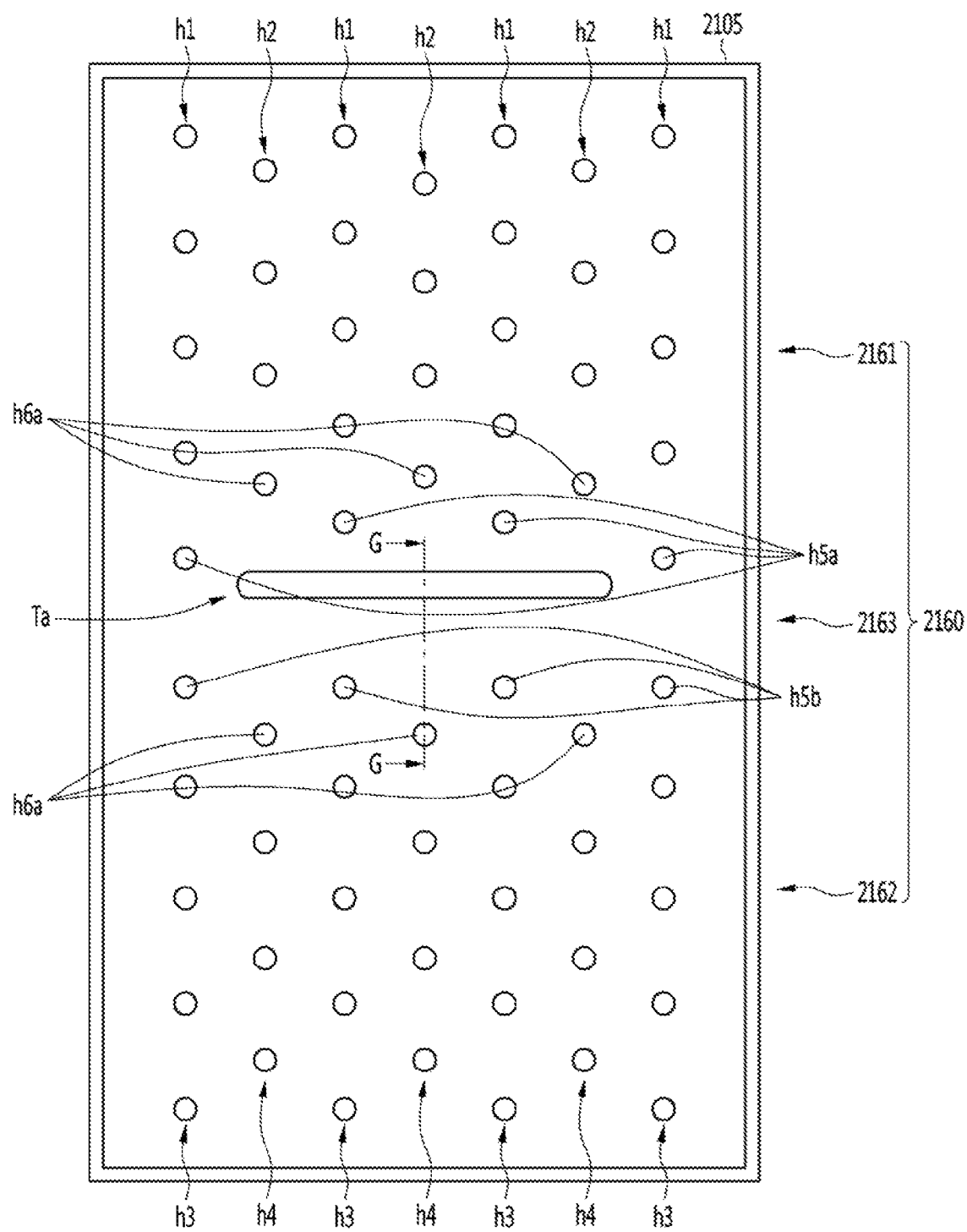
FIGS. 42 and 43 are views for describing a step in which a reflective layer is formed by the method of manufacturing the light emitting device of FIG. 35.
Figure 43:
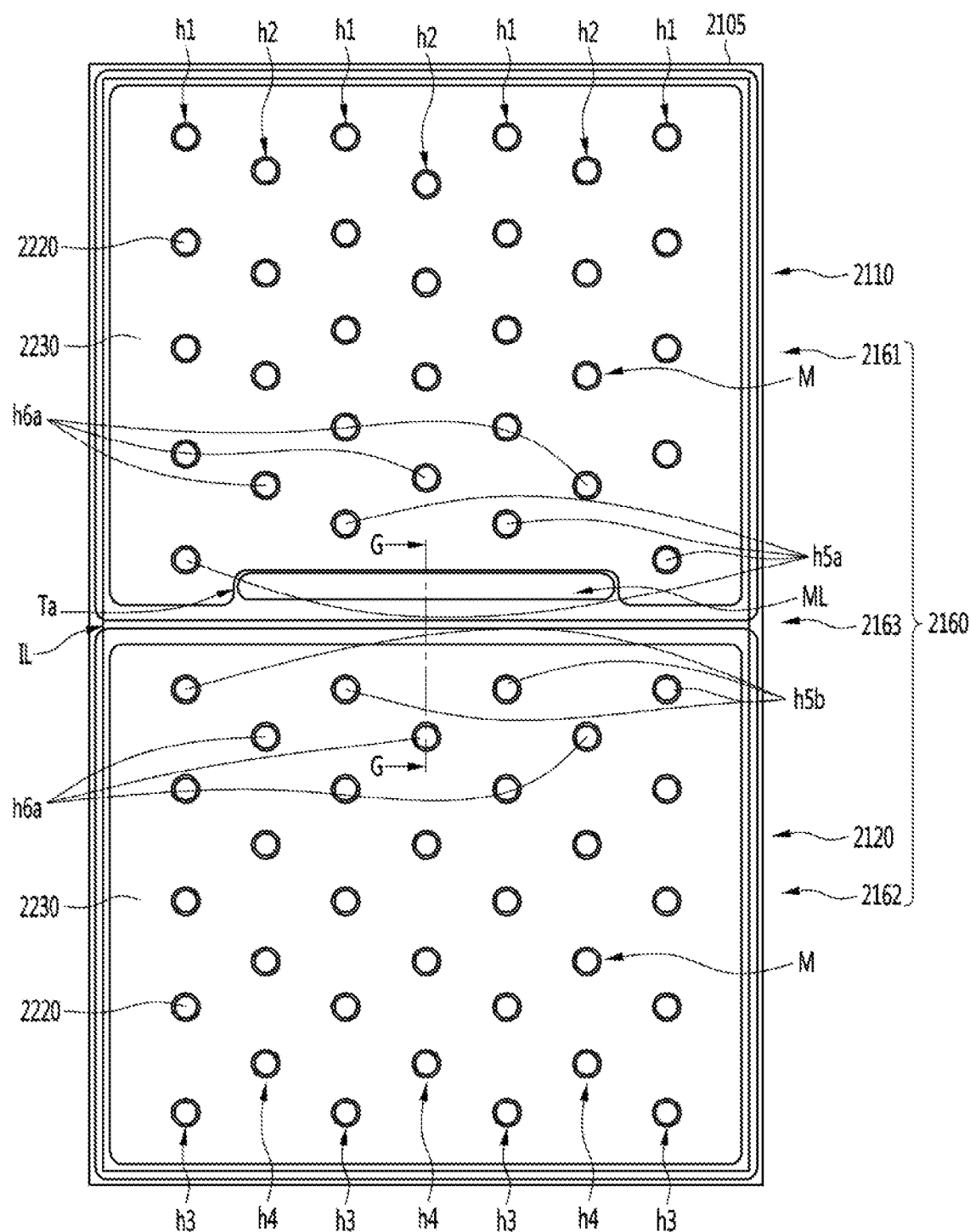

Next, as shown in FIGS. 42 and 43, a reflective layer 2160 may be formed.

FIG. 42 is a plan view showing the shape of a reflective layer formed by the method of manufacturing the light emitting device according to an embodiment, and FIG. 43 is a plan view showing a result of performing the unit process shown in FIG. 42.

Referring to FIGS. 35, 42, and 43, the reflective layer 2160 may include a first reflective layer 2161, a second reflective layer 2162, and a third reflective layer 2163. The reflective layer 2160 may be disposed over the transparent electrode layer 2230. The reflective layer 2160 may be disposed over the first light emitting structure 2110 and the second light emitting structure 2120.

The first reflective layer 2161 and the second reflective layer 2162 may be spaced apart from each other. The third reflective layer 2163 may be disposed between the first reflective layer 2161 and the second reflective layer 2162. The first to third reflective layers 2161, 2162, and 2163 may be formed as one layer connected to each other.

The first reflective layer 2161 may include a plurality of openings. The first reflective layer 2161 may include a plurality of first openings h1 overlapping with the current diffusion layer 2220 in the first direction perpendicular to the upper surface of the substrate 2105. In addition, the first reflective layer 2161 may include a plurality of second openings h2 overlapping with the mesa recesses M in the first direction.

The transparent electrode layer 2230 disposed on the current diffusion layer 2220 may be exposed through the first openings h1. The upper surface of the first semiconductor layer 2111 of the first light emitting structure 2110 may be exposed through the second openings h2.

For example, the first openings h1 may be arranged in the form of a plurality of lines along a long axis direction of the substrate 2105. In addition, the second openings h2 may be arranged in the form of a plurality of lines along the long axis direction of the substrate 2105. The first openings h1 and the second openings h2 may be sequentially arranged in a short axis direction of the substrate 2105.

The second reflective layer 2162 may include a plurality of openings. The second reflective layer 2162 may include a plurality of third openings h3 overlapping with the current diffusion layer 2220 in the first direction perpendicular to the upper surface of the substrate 2105. In addition, the second reflective layer 2162 may include a plurality of fourth openings h4 overlapping with the mesa recesses M in the first direction.

The transparent electrode layer 2230 disposed on the current diffusion layer 2220 may be exposed through the third openings h3. The upper surface of the third semiconductor layer 2121 of the second light emitting structure 2120 may be exposed through the fourth openings h4.

For example, the third openings h3 may be arranged in the form of a plurality of lines along the long axis direction of the substrate 2105. In addition, the fourth openings h4 may be arranged in the form of a plurality of lines along the long axis direction of the substrate 2105. The third openings h3 and the fourth openings h4 may be sequentially arranged in the short axis direction of the substrate 2105.

The third reflective layer 2163 may include a plurality of openings. The third reflective layer 2163 may include a plurality of fifth openings h5 overlapping with the current diffusion layer 2220 in the first direction perpendicular to the upper surface of the substrate 2105.

The fifth openings h5 may include a plurality of fifth-a openings h5a exposing the transparent electrode layer 2230 disposed on the current diffusion layer 2220 in the region where the first light emitting structure 2110 is provided. In addition, the fifth openings h5 may include a plurality of fifth-b openings h5b exposing the transparent electrode layer 2230 disposed on the current diffusion layer 2220 in the region where the second light emitting structure 2120 is provided.

In addition, the third reflective layer 2163 may include a plurality of sixth openings h6 overlapping with the mesas recesses M in the first direction. In addition, the third reflective layer 2163 may include a line opening Ta overlapping with the mesa recess line ML in the first direction.

The sixth openings h6 may include a plurality of sixth-a openings h6a exposing the upper surface of the first semiconductor layer 2111 of the first light emitting structure 2110. In addition, the sixth openings h6 may include a plurality of sixth-b openings h6b exposing the upper surface of the third semiconductor layer 2121 of the second light emitting structure 2120. The line opening Ta may expose the upper surface of the first semiconductor layer 2111 of the first light emitting structure 2110.

For example, the fifth openings h5 may be arranged in the form of a plurality of lines along the short axis direction of the substrate 2105. In addition, the sixth openings h6 may be arranged in the form of a plurality of lines along the short axis direction of the substrate 2105. The fifth openings h5 and the sixth openings h6 may be sequentially arranged in the long axis direction of the substrate 2105.

In addition, the line opening Ta may be arranged in a line shape along the short axis direction of the substrate 2105. The area of the line opening Ta may be larger than the area of one opening constituting the fifth openings h5.

For example, the area of the line opening Ta may be at least 5 times larger than the area of one opening constituting the fifth openings h5. The area of the line opening Ta may be at least 9 times larger than the area of one opening constituting the fifth openings h5.

The effect according to an area size of the line opening Ta will be described in detail below.

Figure 44:
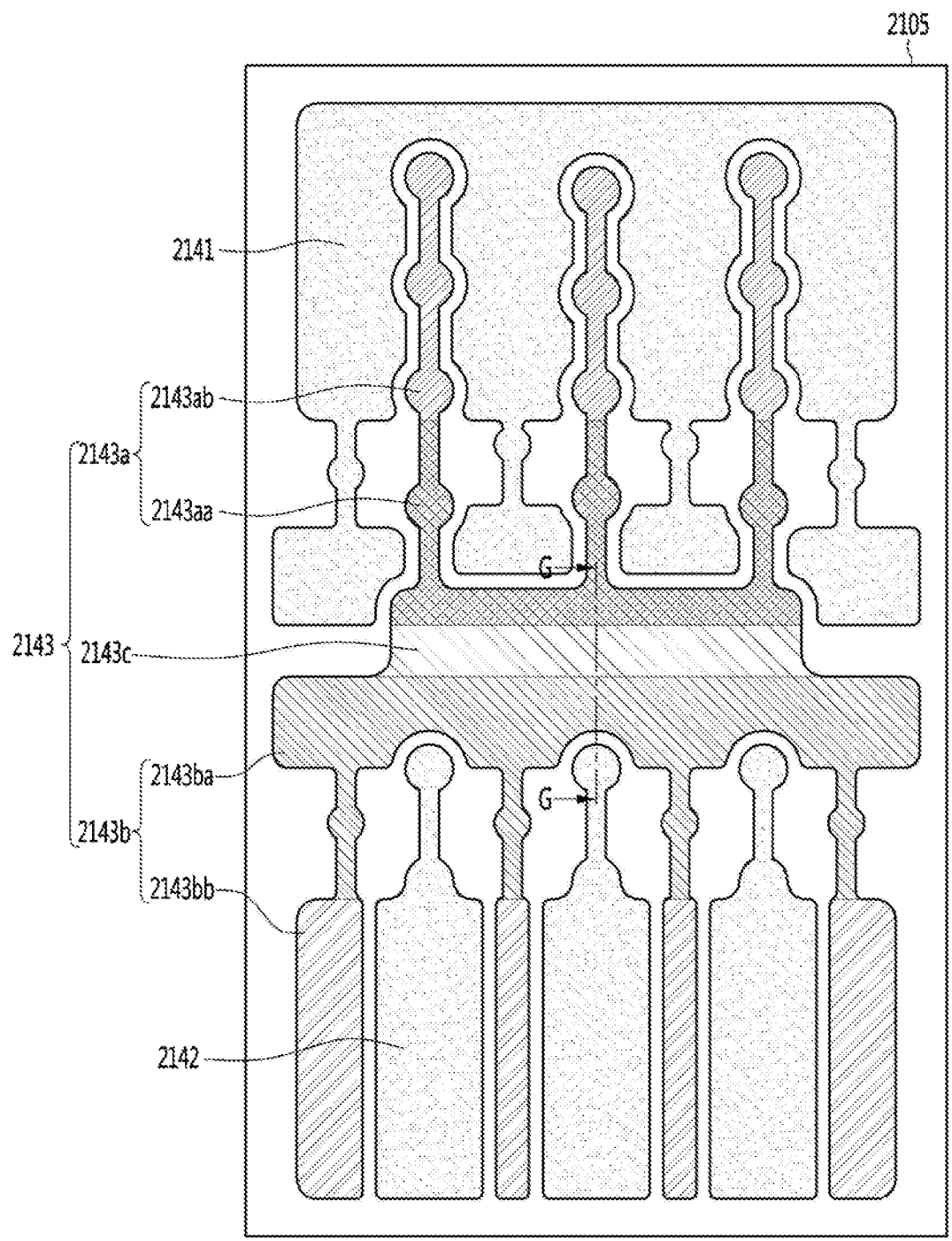
FIGS. 44 and 45 are views for describing a step in which a first electrode, a second electrode, and a connection electrode are formed by the method of manufacturing the light emitting device of FIG. 35.
Figure 45:
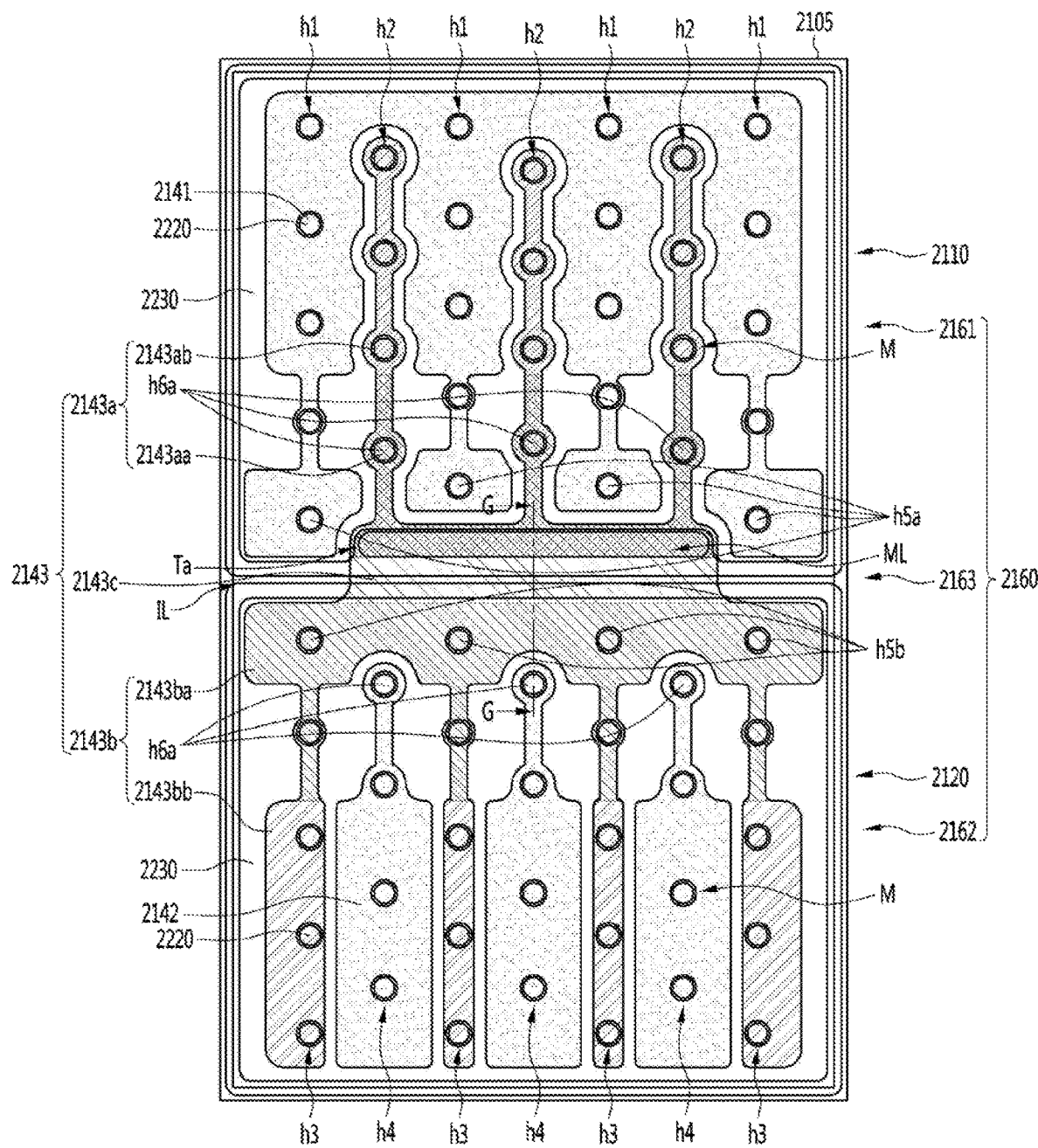

Next, as shown in FIGS. 44 and 45, a first electrode 2141, a second electrode 2142, and a connection electrode 2143 may be formed.

FIG. 44 is a plan view showing shapes of a first electrode, a second electrode, and a connection electrode formed by the method of manufacturing the light emitting device according to an embodiment, and FIG. 45 is a plan view showing a result of performing the unit process shown in FIG. 44.

Referring to FIGS. 35, 44, and 45, the first electrode 2141 and the second electrode 2142 may be spaced apart from each other. The connection electrode 2143 may be disposed between the first electrode 2141 and the second electrode 2142.

The first electrode 2141 may be disposed over the first reflective layer 2161. A portion of the first electrode 2141 may be disposed over the third reflective layer 2163.

The first electrode 2141 may be electrically connected to the second semiconductor layer 2113. The first electrode 2141 may be electrically connected to the second semiconductor layer 2113 through the first openings h1. The first electrode 2141 may make direct contact with the transparent electrode layer 2230 disposed under the first openings h1 in a region where the first light emitting structure 2110 is provided. The first electrode 2141 may make direct contact with the upper surface of the transparent electrode layer 2230 exposed through the first openings h1 in the region where the first light emitting structure 2110 is provided.

The second electrode 2142 may be disposed over the second reflective layer 2162. A portion of the second electrode 2142 may be disposed over the third reflective layer 2163.

The second electrode 2142 may be electrically connected to the third semiconductor layer 2121. The second electrode 2142 may be electrically connected to the third semiconductor layer 2121 through the fourth openings h4. The second electrode 2142 may make direct contact with the third semiconductor layer 2121 disposed under the fourth openings h4 in a region where the second light emitting structure 2120 is provided. The second electrode 2142 may make direct contact with the upper surface of the third semiconductor layer 2121 exposed through the fourth openings h4 in the region where the second light emitting structure 2120 is provided.

The connection electrode 2143 may be disposed over the third reflective layer 2163. A portion of the connection electrode 2143 may be disposed over the first reflective layer 2161. A portion of the connection electrode 2143 may be disposed over the second reflective layer 2162.

The connection electrode 2143 may be electrically connected to the first semiconductor layer 2111 and the fourth semiconductor layer 2123.

The connection electrode 2143 may include a first portion 2143a disposed on the first semiconductor layer 2111, a second portion 2143b disposed on the fourth semiconductor layer 2123, and a third portion 2143c for connecting the first portion 2143a to the second portion 2143b.

The connection electrode 2143 may include the first portion 2143a disposed over the region where the first light emitting structure 2110 is provided. The connection electrode 2143 may include the second portion 2143b disposed over the region where the second light emitting structure 2120 is provided. The connection electrode 2143 may include the third portion 2143c partially disposed on the region where the first light emitting structure 2110 is provided and partially disposed on the region where the second light emitting structure 2120 is provided. In addition, a partial region of the third portion 2143c may be disposed over a boundary region between the first light emitting structure 2110 and the second light emitting structure 2120.

According to an embodiment, the first portion 2143a may include a first electrode portion 2143aa and a second electrode portion 2143ab.

The first portion 2143a may be electrically connected to the first semiconductor layer 2111 through the second openings h2, the sixth-a openings h6a, and the line opening Ta.

The second electrode portion 2143ab of the first portion 2143a may make direct contact with the upper surface of the first semiconductor layer 2111 through the second openings h2 in the region where the first light emitting structure 2110 is provided.

The first electrode portion 2143aa of the first portion 2143a may make direct contact with the upper surface of the first semiconductor layer 2111 through the sixth-a openings h6a in the region where the first light emitting structure 2110 is provided.

In addition, the first electrode portion 2143aa of the first portion 2143a may make direct contact with the upper surface of the first semiconductor layer 2111 through the line opening Ta in the region where the first light emitting structure 2110 is provided.

According to an embodiment, the second portion 2143b may include a third electrode portion 2143ba and a fourth electrode portion 2143bb.

The second portion 2143b may be electrically connected to the fourth semiconductor layer 2123 through the third openings h3 and the fifth-b openings h5b.

The fourth electrode portion 2143bb of the second portion 2143b may make contact with the upper surface of the fourth semiconductor layer 2123 through the third openings h3 in the region where the second light emitting structure 2120 is provided.

The fourth electrode portion 2143bb of the second portion 2143b may make direct contact with the transparent electrode layer 2230 disposed under the third openings h3 in the region where the second light emitting structure 2120 is provided. The fourth electrode portion 2143bb of the second portion 2143b may make direct contact with the upper surface of the transparent electrode layer 2230 exposed through the third openings h3 in the region where the second light emitting structure 2120 is provided.

The third electrode portion 2143ba of the second portion 2143b may make contact with the upper surface of the fourth semiconductor layer 2123 through the fifth-b openings h5b in the region where the second light emitting structure 2120 is provided.

The third electrode portion 2143ba of the second portion 2143b may make direct contact with the transparent electrode layer 2230 disposed under the fifth-b openings h5b in the region where the second light emitting structure 2120 is provided. The third electrode portion 2143ba of the second portion 2143b may make direct contact with the upper surface of the transparent electrode layer 2230 exposed through the fifth-b openings h5b in the region where the second light emitting structure 2120 is provided.

According to an embodiment, the third portion 2143c of the connection electrode 2143 may be disposed on a boundary region between the first light emitting structure 2110 and the second light emitting structure 2120. The third portion 2143c of the connection electrode 2143 may be electrically connected to the first portion 2143a and the second portion 2143b.

According to the light emitting device of an embodiment, the first electrode 2141 may be electrically connected to the second semiconductor layer 2113. The second electrode 2142 may be electrically connected to the third semiconductor layer 2121. In addition, the connection electrode 2143 may be electrically connected to the first semiconductor layer 2111 and the fourth semiconductor layer 2123.

Therefore, according to an embodiment, as the power is supplied to the first electrode 2141 and the second electrode 2142, the first electrode 2141, the second semiconductor layer 2113, the first semiconductor layer 2111, the connection electrode 2143, the fourth semiconductor layer 2123, the third semiconductor layer 2121, and the second electrode 2142 may be electrically connected to each other in series.

Figure 46:
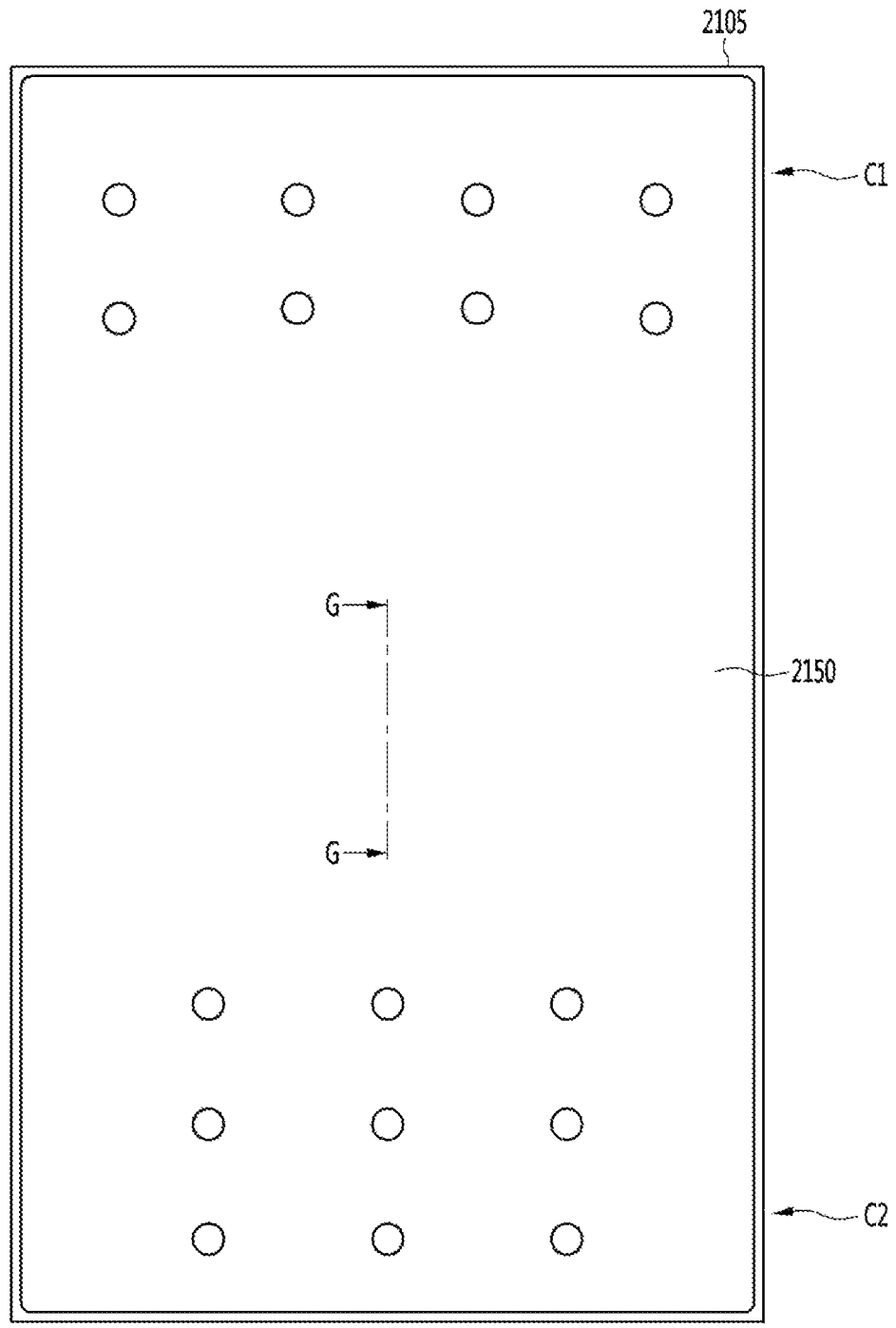
FIGS. 46 and 47 are views for describing a step in which a protective layer is formed by the method of manufacturing the light emitting device of FIG. 35.
Figure 47:
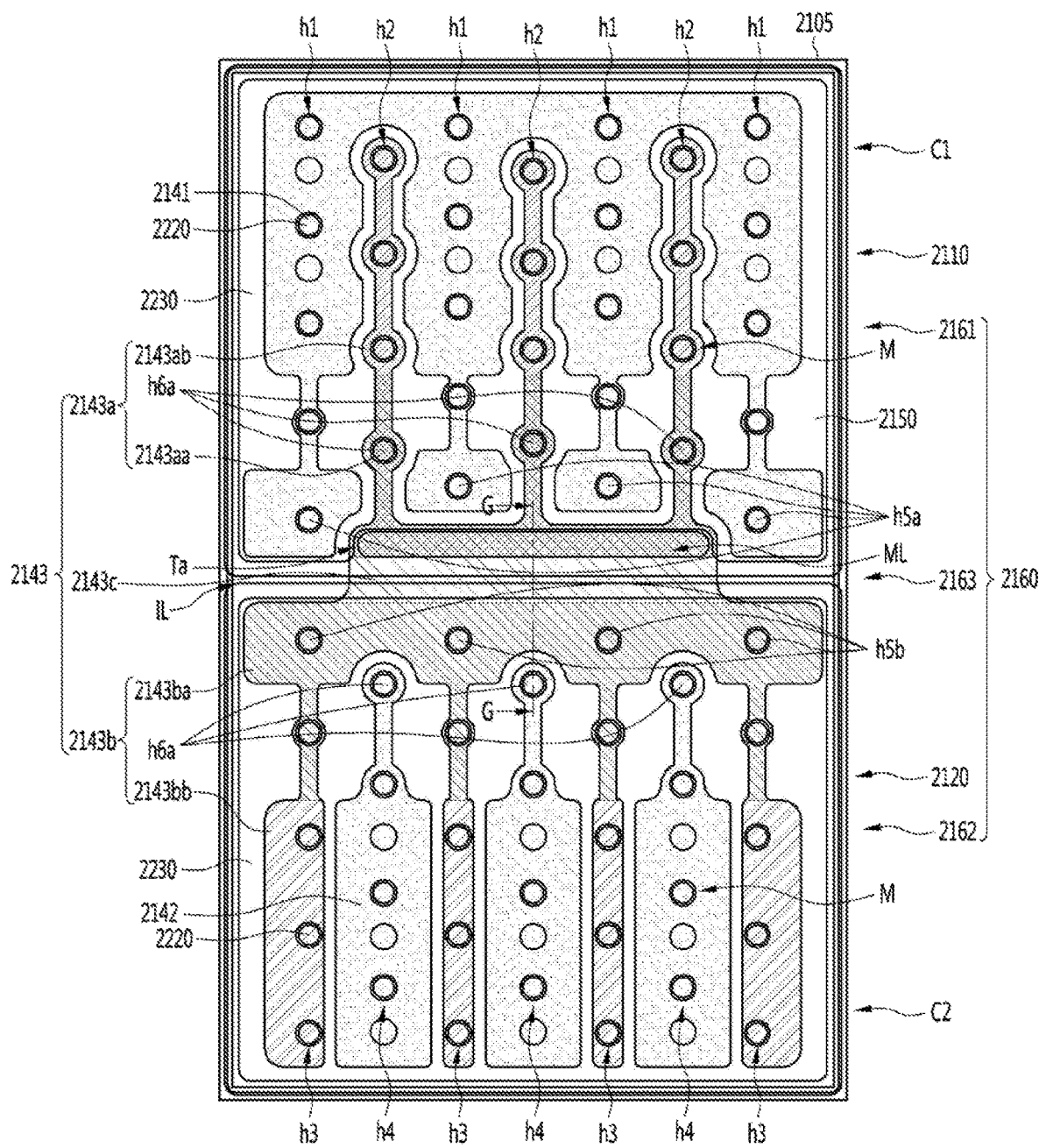

Next, as shown in FIGS. 46 and 47, a protective layer 2150 may be formed.

FIG. 46 is a plan view showing the shape of a protective layer formed by the method of manufacturing the light emitting device according to an embodiment, and FIG. 47 is a plan view showing a result of performing the unit process shown in FIG. 46.

Referring to FIGS. 34, 35, 46, and 47, the protective layer 2150 may be disposed over the first electrode 2141 and the second electrode 2142. The protective layer 2150 may be disposed over the connection electrode 2143. The protective layer 2150 may be disposed over the reflective layer 2160.

The protective layer 2150 may include a first contact portion c1 exposing the upper surface of the first electrode 2141. The protective layer 2150 may include a plurality of first contact portions c1 exposing the upper surface of the first electrode 2141. The first contact portions c1 may be provided on a region where the first reflective layer 2161 is disposed.

The protective layer 2150 may include a second contact portion c2 exposing the upper surface of the second electrode 2142. The protective layer 2150 may include a plurality of second contact portions c2 exposing a plurality of upper surfaces of the second electrode 2142. The second contact portion c2 may be provided on a region where the second reflective layer 2162 is disposed.

Next, as shown in FIG. 48, a first bonding part 2171 and a second bonding part 2172 may be formed. FIG. 48 is a plan view showing the shapes of the first and second bonding parts formed by the method of manufacturing the light emitting device according to an embodiment.

Referring to FIGS. 34 and 48, the first bonding part 2171 and the second bonding part 2172 may be formed. The first bonding part 2171 and the second bonding part 2172 may be disposed over the protective layer 2150.

The first bonding part 2171 may be disposed over the first reflective layer 2161. The second bonding part 2172 may be disposed over the second reflective layer 2162. The second bonding part 2172 may be spaced apart from the first bonding part 2171.

The first bonding part 2171 may be disposed over the first electrode 2141. The first bonding part 2171 may be electrically connected to the first electrode 2141.

The first bonding part 2171 may be electrically connected to the first electrode 2141 through the first contact portion c1 provided in the protective layer 2150. The first bonding part 2171 may make direct contact with the upper surface of the first electrode 2141 through the first contact portion c1 provided in the protective layer 2150.

The first bonding part 2171 may be disposed over the first light emitting structure 2110. The first bonding part 2171 may be disposed over the second semiconductor layer 2113.

The first bonding part 2171 may be disposed over the connection electrode 2143. The first bonding part 2171 may be disposed over the first portion 2143a of the connection electrode 2143. The first bonding part 2171 may be disposed over the second electrode portion 2143ab of the connection electrode 2143.

The second bonding part 2172 may be disposed over the second electrode 2142. The second bonding part 2172 may be electrically connected to the second electrode 2142.

The second bonding part 2172 may be disposed over the second light emitting structure 2120. The second bonding part 2172 may be disposed over the fourth semiconductor layer 2123.

The second bonding part 2172 may be electrically connected to the second electrode 2142 through the second contact portion c2 provided in the protective layer 2150. The second bonding part 2172 may make direct contact with the upper surface of the second electrode 2142 through the second contact portion c2 provided in the protective layer 2150.

The second bonding part 2172 may be disposed over the connection electrode 2143. The second bonding part 2172 may be disposed over the second portion 2143b of the connection electrode 2143. The second bonding part 2172 may be disposed over the fourth electrode portion 2143bb of the connection electrode 2143.

According to an embodiment, the connection electrode 2143 may include a first portion 2143a disposed on the first semiconductor layer 2111, a second portion 2143b disposed on the fourth semiconductor layer 2123, and a third portion 2143c for connecting the first portion 2143a to the second portion 2143b.

The first portion 2143a of the connection electrode 2143 may include a first electrode portion 2143aa that does not overlap with the first bonding part 2171 in the first direction perpendicular to the upper surface of the substrate 2105, and a second electrode portion 2143ab that overlaps with the first bonding part 2171.

The second portion 2143b of the connection electrode 2143 may include a third electrode portion 2143ba that does not overlap with the second bonding part 2172 in the first direction, and a fourth electrode portion 2143bb that overlaps with the second bonding part 2172.

According to an embodiment, an area of the first electrode portion 2143ab making contact with the first semiconductor layer 2111 may be larger than an area of the third electrode portion 2143ba making contact with the fourth semiconductor layer 2123.

For example, the area of the first electrode portion 2143ab making contact with the first semiconductor layer 2111 may be 1.4% or more and 3.3% or less of the lower surface area of the substrate 2105. The area of the third electrode portion 2143ba making contact with the fourth semiconductor layer 2123 may be 0.7% or more and 3.0% or less of the lower surface area of the substrate 2105.

According to an embodiment, the area of the first electrode portion 2143ab making contact with the first semiconductor layer 2111 may be, for example, in a range of 1.1 times to 2 times based on the area of the third electrode portion 2143ba making contact with the fourth semiconductor layer 2123.

As described above, the area of the first electrode portion 2143ab making contact with the first semiconductor layer 2111 is set to be larger than the area of the third electrode portion 2143ba making contact with the fourth semiconductor layer 2123, so that the carrier may be smoothly diffused, and the operating voltage may be prevented from being increased.

According to an embodiment, as the power is applied to the first bonding part 2171 and the second bonding part 2172, the first and second light emitting structures 2110 and 2120 may emit light.

As the power is supplied to the first bonding part 2171 and the second bonding part 2172, the first bonding part 2171, the first electrode 2141, the second semiconductor layer 2113, the first semiconductor layer 2111, the connection electrode 2143, the fourth semiconductor layer 2123, the third semiconductor layer 2121, the second electrode 2142, and the second bonding part 2172 may be electrically connected to each other in series.

According to an embodiment, a high voltage may be applied between the first bonding part 2171 and the second bonding part 2172. The applied high voltage may be distributed and supplied to the first and second light emitting structures 2110 and 2120 through the first electrode 2141, the connection electrode 2143, and the second electrode 2142.

As described above, according to the light emitting device 2100 of an embodiment, the first bonding part 2171 and the first electrode 2141 may make contact with each other at a plurality of regions. In addition, the second bonding part 2172 and the second electrode 2142 may make contact with each other in a plurality of regions. Therefore, according to an embodiment, since the power may be supplied through a plurality of regions, a contact area is increased and the contact regions are distributed, so that the current distribution effect may be generated and the operating voltage may be reduced.

In addition, when the power is applied to the first bonding part 2171 and the second bonding part 2172, the area of the first electrode portion 2143ab making contact with the first semiconductor layer 2111 is set to be larger than the area of the third electrode portion 2143ba making contact with the fourth semiconductor layer 2123, so that the carrier may be smoothly diffused, and the operating voltage may be prevented from being increased.

According to an embodiment, the light emitting device may be connected to an external power source by a flip chip bonding scheme. For example, when manufacturing the light emitting device package, the upper surface of the first bonding part 2171 and the upper surface of the second bonding part 2172 may be attached to a sub-mount, a lead frame, a circuit board, or the like.

When the light emitting device according to the embodiment is mounted by the flip chip bonding scheme and implemented as a light emitting device package, light emitted from the first and second light emitting structures 2110 and 2120 may be radiated through the substrate 2105. The light emitted from the first and second light emitting structures 2110 and 2120 may be reflected by the first to third reflective layers 2161, 2162, and 2163, and may be radiated toward the substrate 2105.

In addition, the light emitted from the first and second light emitting structures 2110 and 2120 may be emitted in the lateral direction of the first and second light emitting structures 2110 and 2120.

In addition, according to the light emitting device and the light emitting device package of an embodiment, since the first bonding part 2171 and the second bonding part 2172, which have a large area, may be directly bonded to the circuit board for providing the power, the flip chip bonding process may be easily and stably performed.

According to an embodiment, the size of the first reflective layer 2161 may be several micrometers larger than the size of the first bonding part 2171. For example, the area of the first reflective layer 2161 may be large enough to completely cover the area of the first bonding part 2171. Considering process errors, the length of one side of the first reflective layer 2161 may be larger than the length of one side of the first bonding part 2171, for example, by about 4 micrometers to 10 micrometers.

In addition, the size of the second reflective layer 2162 may be several micrometers larger than the size of the second bonding part 2172. For example, the area of the second reflective layer 2162 may be large enough to completely cover the area of the second bonding part 2172. Considering process errors, the length of one side of the second reflective layer 2162 may be larger than the length of one side of the second bonding part 2172, for example, by about 4 micrometers to 10 micrometers.

According to an embodiment, due to the first reflective layer 2161 and the second reflective layer 2162, the light emitted from the first and second light emitting structures 2110 and 2120 may be reflected without being incident on the first bonding part 2171 and the second bonding part 2172. Therefore, according to an embodiment, it is possible to minimize the light generated and emitted from the first and second light emitting structures 2110 and 2120 being incident and lost on the first bonding part 2171 and the second bonding part 2172.

In addition, according to the light emitting device 2100 of an embodiment, since the third reflective layer 2163 is disposed between the first bonding part 2171 and the second bonding part 2172, the light emission between the first bonding part 2171 and the second bonding part 2172 may be reduced.

In addition, the minimum interval between the first bonding part 2171 and the second bonding part 2172 may be equal to or larger than 125 micrometers. The minimum interval between the first bonding part 2171 and the second bonding part 2172 may be determined in consideration of an interval between the first electrode pad and the second electrode pad of the package body on which the light emitting device 2100 is mounted.

For example, the minimum interval between the first electrode pad and the second electrode pad of the package body may have a minimum of 125 micrometers, and a maximum of 200 micrometers. In this case, considering the process error, the interval between the first bonding part 2171 and the second bonding part 2172 may be, for example, 125 micrometers or more, and 300 micrometers or less.

In addition, if the interval between the first bonding part 2171 and the second bonding part 2172 is larger than 125 micrometers, a minimum space may be ensured, so that a short circuit may not occur between the first bonding part 2171 and the second bonding part 2172 of the light emitting device, and a light emitting area for improving the light extraction efficiency may be ensured, so that the brightness Po of the light emitting device 2100 may be increased.

In addition, if the interval between the first bonding part 2171 and the second bonding part 2172 is 300 micrometers or less, the first electrode pad and the second electrode pad of the light emitting device package and the first bonding part 2171 and the second bonding part 2172 of the light emitting device may be bonded to each other with sufficient bonding strength, and the electrical characteristics of the light emitting device 2100 may be ensured.

The minimum interval between the first bonding part 2171 and the second bonding part 2172 may be set to be larger than 125 micrometers to ensure optical characteristics, and may be set to be smaller than 300 micrometers to ensure the reliability due to the electrical characteristics and bonding strength.

In an embodiment, in order to ensure the optical characteristics, electrical characteristics, and the reliability due to the bonding strength, the interval between the first bonding part 2171 and the second bonding part 2172 is illustrated to be 125 micrometers or more and 300 micrometers or less. However, embodiments are not limited thereto, and the interval between the first bonding part 2171 and the second bonding part 2172 may be smaller than 125 micrometers to improve the electrical characteristics or reliability of the light emitting device package more than the present embodiment, or may be larger than 300 micrometers to improve the optical characteristics more than the present embodiment.

According to an embodiment, due to the first reflective layer 2161 and the second reflective layer 2162, the light emitted from the first and second light emitting structures 2110 and 2120 may be reflected without being incident on the first electrode 2141 and the second electrode 2142. Therefore, according to an embodiment, it is possible to minimize the light generated and emitted from the first and second light emitting structures 2110 and 2120 being incident and lost on the first electrode 2141 and the second electrode 2142.

Meanwhile, the light emitting device according to the embodiment described above has been described based on the configuration in which two light emitting structures are connected to each other in series on one substrate. However, according to another embodiment, the light emitting device may have a configuration in which at least three light emitting structures or light emitting cells are connected to each other in series on one substrate.

For example, the light emitting device shown in FIG. 49 is an example in which three light emitting structures or light emitting cells are connected to each other in series on one substrate. FIG. 49 is a view showing still another example of the light emitting device applied to the light emitting device package according to an embodiment of the present invention.

Upon describing the light emitting device according to an embodiment with reference to FIG. 49, the descriptions that overlap with those described above may be omitted.

According to an embodiment, as shown in FIG. 49, the light emitting device may include a first light emitting structure 3110, a second light emitting structure 3120, and a third light emitting structure 3130.

The first light emitting structure 3110 and the second light emitting structure 3120 may be spaced apart from each other by a first isolation line IL11. The second light emitting structure 3120 and the third light emitting structure 3130 may be spaced apart from each other by a second isolation line IL12.

A first line opening Tb may be formed between the first light emitting structure 3110 and the second light emitting structure 3120. The lower semiconductor layer of the first light emitting structure 3110 may be exposed through the first line opening Tb.

The lower semiconductor layer of the first light emitting structure 3110 and the upper semiconductor layer of the second light emitting structure 3120 may be electrically connected to each other through the first connection electrode provided in the first line opening THb.

A second line opening Tc may be formed between the second light emitting structure 3120 and the third light emitting structure 3130. The lower semiconductor layer of the second light emitting structure 3120 may be exposed through the second line opening Tc.

The lower semiconductor layer of the second light emitting structure 3120 and the upper semiconductor layer of the third light emitting structure 3130 may be electrically connected to each other through a second connection electrode provided in the second line opening Tc.

According to an embodiment, the first bonding part 3171 may be disposed over the first light emitting structure 3110, and the second bonding part 3172 may be disposed over the third light emitting structure 3130. The first bonding part 3171 may be electrically connected to the upper semiconductor layer of the first light emitting structure 3110. The second bonding part 3172 may be electrically connected to the lower semiconductor layer of the third light emitting structure 3130.

According to an embodiment, as the power is supplied to the first bonding part 3171 and the second bonding part 3172 of the light emitting device, the first bonding part 3171, the upper semiconductor layer of the first light emitting structure 3110, the lower semiconductor layer of the first light emitting structure 3110, the first connection electrode, the upper semiconductor layer of the second light emitting structure 3120, the lower semiconductor layer of the second light emitting structure 3120, the second connection electrode, the upper semiconductor layer of the third light emitting structure 3130, the lower semiconductor layer of the third light emitting structure 3130, and the second bonding part 3172 may be electrically connected to each other in series.

Therefore, according to the light emitting device of an embodiment, a high voltage is supplied, thereby improving the light output and reducing the operating voltage. In addition, the dimming control may be performed in the high-voltage light emitting device package.

As described above, according to the semiconductor device package and the method of manufacturing a semiconductor device package of an embodiment, the bonding parts of the light emitting device of the embodiment may be receive by driving power supplied through the conductive layer which is disposed at the through hole. In addition, the melting point of the conductive layer disposed in the through-hole may be selected to have a higher value than the melting point of a conventional bonding material. Therefore, even when the light emitting device package according to an embodiment is bonded to a main substrate through a reflow process, since re-melting phenomenon does not occur, the electrical connection and physical bonding force are not deteriorated.

In addition, according to the light emitting device package 100 of an embodiment, the package body 110 does not need to be exposed to a high temperature in the process of manufacturing a light emitting device package. Therefore, according to the embodiment, the package body may be prevented from being exposed to high temperatures to be damaged or discolored. Accordingly, the selection range for the material constituting the body may be widened. According to an embodiment, the body may be provided by using a relatively inexpensive resin material as well as an expensive material such as ceramic.

Meanwhile, the light emitting device package according to an embodiment may be applied to a light source unit.

In addition, the light source unit may include a display device, a lighting device, a head lamp, and the like according to an industrial field.

As an example of the light source unit, a display device may include a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may have a structure in which light emitting devices that emit red, green and blue light are disposed, respectively.

As still another example of the light source unit, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source unit, the lighting device may include a cover, a light source module, a heat radiator, a power supply, an inner case, and a socket. In addition, the light source unit according to an embodiment may further include at least one of a member and a holder. The light source module may include a light emitting device package according to an embodiment.

Any reference in this specification to unit, the lighting device may include a cle embodiment,source module,that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device package comprising:
a first frame having a first through hole;
a second frame having a second through hole;
a third frame having a third through hole;
a fourth frame having a fourth through hole;
a body disposed between the first to fourth frames;
a connecting frame diagonally extending in the light emitting device package from the second frame to the third frame;
a first light emitting device including a first electrode pad and a second electrode pad, the first electrode pad being disposed on the first through hole of the first frame and the second electrode pad being disposed on the second through hole of the second frame;
a second light emitting device including a third electrode pad and a fourth electrode pad, the third electrode pad being disposed on the third through hole of the third frame and the fourth electrode pad being disposed on the fourth through hole of the fourth frame; and
a plurality of recesses on an upper surface of the body, and disposed between the first frame and the second frame, the plurality of recesses being spaced apart from each other.

2. The light emitting device package of claim 1, wherein the plurality of recesses include a first recess and a second recess separated by a distance, and
wherein the distance is smaller than a width of the first through hole.

3. The light emitting device package of claim 2, wherein the distance is in a range of 50% to 100% of the width of the first through hole.

4. The light emitting device package of claim 1, wherein the second frame and the third frame are diagonally spaced apart from each other in the light emitting package, and
wherein the first frame and the fourth frame are diagonally spaced apart from each other in the light emitting device package.

5. The light emitting device package of claim 1, wherein a resin is disposed in the plurality of recesses.

6. The light emitting device package of claim 1, wherein a shape of the plurality of recesses includes at least one of a polygonal shape and a curved shape.

7. The light emitting device package of claim 1, wherein the plurality of recesses have inclined sidewalls.

8. The light emitting device package of claim 1, wherein at least a portion of one recess among the plurality of recesses overlaps with the first light emitting device.

9. The light emitting device package of claim 8, wherein at least another portion of the one recess among the plurality of recesses does not overlap with the first light emitting device.

10. The light emitting device package of claim 1, wherein the plurality of recesses are disposed between a lower surface of the body and the first light emitting device and are arranged in one direction.

11. The light emitting device package of claim 1, further comprising a conductive material disposed in the first to fourth through holes, and the conductive material contacts the first to fourth electrode pads, respectively.

12. The light emitting device package of claim 11, wherein the conductive material includes Sn.

13. A light emitting device package comprising:
a first connecting frame diagonally extending in the light emitting device package and connecting a first set of adjacent frames;
a second connecting frame diagonally extending in the light emitting device package and connecting a second set of adjacent frames;
a first light emitting device and a second light emitting device connected in series by the first connecting frame;
a body disposed between the first connecting frame and the second connecting frame; and
a plurality of recesses on an upper surface of the body and being spaced apart from each other,
wherein each of the first and second light emitting devices is disposed on at least a part of each of the plurality of recesses, and
wherein the first connecting frame and the second connecting frames do not intersect.

14. The light emitting device package of claim 13, wherein the first connecting frame and the second connecting frames are parallel.

15. The light emitting device package of claim 13, further comprising a first frame having a first through hole, a sixth frame having a sixth through hole, and a third light emitting device,
wherein the first set of adjacent frames includes a second frame having a second through hole and a third frame having a third through hole,
wherein the second set of adjacent frames includes a fourth frame having a fourth through hole and a fifth frame having a fifth through hole,
wherein the first light emitting device connects the first and second frames, the second light emitting device connects the third and fourth frames, and the third light emitting device connects the fifth and sixth frames,
wherein the first connecting frame diagonally extends in the light emitting device package from the second frame to the third frame, and
wherein the second connecting frame diagonally extends in the light emitting device package from the fourth frame to the fifth frame.

16. The light emitting device package of claim 13, wherein the plurality of recesses are disposed between the first frame and the second frame and are arranged in one direction.

17. The light emitting device package of claim 16, wherein a resin is disposed in the plurality of recesses.

18. The light emitting device package of claim 16, wherein at least a portion of one recess among the plurality of recesses overlaps with the first light emitting device.

19. The light emitting device package of claim 18, wherein at least another portion of the one recess among the plurality of recesses does not overlap with the first light emitting device.

20. The light emitting device package of claim 16, wherein the plurality of recesses are disposed between a lower surface of the body and the first light emitting device.

* * * * *